(12) United States Patent
Kim et al.

(10) Patent No.: US 11,787,829 B2
(45) Date of Patent: Oct. 17, 2023

(54) ORGANOMETALLIC COMPOUND, ORGANIC LIGHT-EMITTING DEVICE INCLUDING THE SAME, AND DIAGNOSTIC COMPOSITION INCLUDING THE ORGANOMETALLIC COMPOUND

(71) Applicants: Samsung Electronics Co., Ltd., Suwon-si (KR); Korea Advanced Institute of Science and Technology, Daejeon (KR)

(72) Inventors: Sangdong Kim, Seongnam-si (KR); Seoungtae Kim, Daejeon (KR); Wooyoun Kim, Daejeon (KR); Jinwoo Kim, Daejeon (KR); Muhyun Baik, Daejeon (KR); Seungyeol Baek, Daejeon (KR); Seungyeon Kwak, Suwon-si (KR); Won-joon Son, Yongin-si (KR); Yongsuk Cho, Hwaseong-si (KR); Jongwon Choi, Yongin-si (KR); Hyeonho Choi, Seoul (KR); Byoungki Choi, Hwaseong-si (KR)

(73) Assignees: SAMSUNG ELECTRONICS CO., LTD., Gyeonggi-do (KR); KOREA ADVANCED INSTITUTE OF SCIENCE AND TECHNOLOGY, Daejeon (KR)

(*) Notice: Subject to any disclaimer, the term of this patent is extended or adjusted under 35 U.S.C. 154(b) by 615 days.

(21) Appl. No.: 16/739,199

(22) Filed: Jan. 10, 2020

(65) Prior Publication Data
US 2020/0308207 A1    Oct. 1, 2020

(30) Foreign Application Priority Data
Mar. 25, 2019 (KR) .................. 10-2019-0033724

(51) Int. Cl.
*C07F 15/00* (2006.01)
*H01L 51/00* (2006.01)
(Continued)

(52) U.S. Cl.
CPC .......... *C07F 15/0086* (2013.01); *C09K 11/06* (2013.01); *H10K 85/346* (2023.02);
(Continued)

(58) Field of Classification Search
None
See application file for complete search history.

(56) References Cited

U.S. PATENT DOCUMENTS 7,332,232 B2    2/2008   Ma et al.
2018/0114928 A1*  4/2018  Lee .................. H01L 51/0087
(Continued)

FOREIGN PATENT DOCUMENTS

EP      2891659 A2    7/2015
KR   1020190037927 A    4/2019

*Primary Examiner* — Jay Yang
(74) *Attorney, Agent, or Firm* — CANTOR COLBURN LLP

(57) ABSTRACT

An organometallic compound represented by Formula I, an organic light-emitting device including the same, and a diagnostic composition including the organometallic compound.

(Continued)

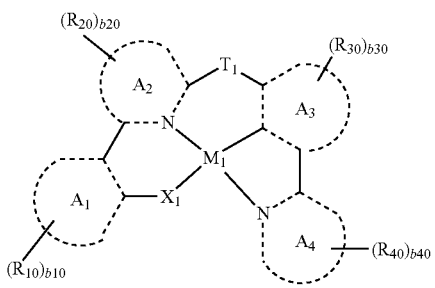

20 Claims, 2 Drawing Sheets

(51) Int. Cl.
*C09K 11/06* (2006.01)
*H10K 85/30* (2023.01)
*H10K 30/30* (2023.01)
*H10K 50/15* (2023.01)
*H10K 50/16* (2023.01)
*H10K 50/17* (2023.01)

(52) U.S. Cl.
CPC .. *C09K 2211/185* (2013.01); *C09K 2211/186* (2013.01); *C09K 2211/188* (2013.01); *H10K 30/353* (2023.02); *H10K 50/15* (2023.02); *H10K 50/16* (2023.02); *H10K 50/171* (2023.02)

(56) References Cited

U.S. PATENT DOCUMENTS

2018/0233679 A1* 8/2018 Baik .................. H01L 51/0087
2019/0074457 A1 3/2019 Choi et al.
2019/0100546 A1 4/2019 Baik et al.

* cited by examiner

ORGANOMETALLIC COMPOUND, ORGANIC LIGHT-EMITTING DEVICE INCLUDING THE SAME, AND DIAGNOSTIC COMPOSITION INCLUDING THE ORGANOMETALLIC COMPOUND

CROSS-REFERENCE TO RELATED APPLICATION

This application claims the priority to and benefit of Korean Patent Application No. 10-2019-0033724, filed on Mar. 25, 2019, in the Korean Intellectual Property Office, and all the benefits accruing therefrom under 35 U.S.C. § 119, the content of which in its entirety is herein incorporated by reference.

BACKGROUND

1. Field

One or more embodiments relates to an organometallic compound, an organic light-emitting device including the same, and a diagnostic composition including the organometallic compound.

2. Description

Organic light-emitting devices are self-emission devices that have wide viewing angles, short response times, and excellent characteristics in terms of brightness, driving voltage, and response speed, and also produce full-color images.

In an example, an organic light-emitting device includes an anode, a cathode, and an organic layer between the anode and the cathode, wherein the organic layer includes an emission layer. Such an organic light-emitting device may include a hole transport region between the anode and the emission layer, and an electron transport region between the emission layer and the cathode. Holes provided from the anode may move toward the emission layer through the hole transport region, and electrons provided from the cathode may move toward the emission layer through the electron transport region. The holes and the electrons recombine in the emission layer to produce excitons, and the excitons transit from an excited state to a ground state, thereby generating light.

Also, a light-emitting compound, such as a phosphorescent compound, may be used for monitoring, sensing, or detecting biological substances including various cells and proteins.

SUMMARY

One or more embodiments include a novel organometallic compound, an organic light-emitting device including the same, and a diagnostic composition including the novel organometallic compound.

Additional aspects will be set forth in part in the description which follows and, in part, will be apparent from the description, or may be learned by practice of the presented embodiments.

An aspect of the present disclosure provides an organometallic compound represented by Formula 1:

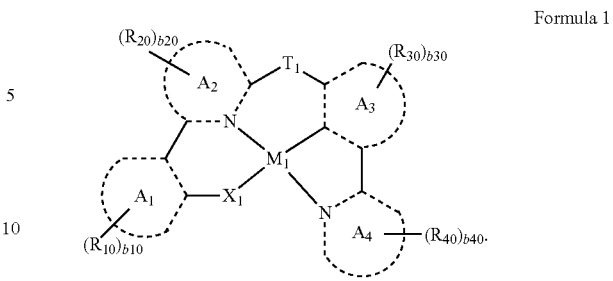

Formula 1

In Formula 1, $M_1$ may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), rhutenium (Ru), rhodium (Rh), palladium (Pd), silver (Ag), rhenium (Re), platinum (Pt), or gold (Au), $X_1$ may be N, O, or S, ring $A_1$ and ring $A_3$ may each independently be a $C_5$-$C_{30}$ carbocyclic group, a $C_2$-$C_{30}$ heterocyclic group, or a combination thereof, ring $A_2$ and ring $A_4$ may each independently be a $C_1$-$C_{30}$ heterocyclic group including N, $T_1$ may be *—N[$(L_1)_{a1}$-$(R_1)_{b1}$]—*', *—B($R_1$)—*', *—P($R_1$)—*', *—C($R_1$)($R_2$)—*', *—Si($R_1$)($R_2$)—*', *—Ge($R_1$)($R_2$)—*', *—S—*', *—Se—*', *—O—*', *—C(=O)—*', *—S(=O)—*', *—S(=O)$_2$—*', *—C($R_1$)=C($R_2$)—*', *—C(=S)—*', or *—C≡C—*', $L_1$ may be a single bond, a substituted or unsubstituted $C_5$-$C_{30}$ carbocyclic group, or a substituted or unsubstituted $C_2$-$C_{30}$ heterocyclic group, a1 may be an integer from 1 to 3, wherein, when a1 is 2 or more, two or more $L_1$(s) may be identical to or different from each other, $R_1$, $R_2$, $R_{10}$, $R_{20}$, $R_{30}$, and $R_{40}$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), or —P(=O)($Q_8$)($Q_9$), two or more neighboring groups among $R_1$, $R_2$, $R_{10}$, $R_{20}$, $R_{30}$, and $R_{40}$ may optionally be linked to form a substituted or unsubstituted $C_5$-$C_{30}$ carbocyclic group or a substituted or unsubstituted $C_2$-$C_{30}$ heterocyclic group, b1 may be an integer from 1 to 5, wherein, when b1 is 2 or more, two or more $R_1$(s) may be identical to or different from each other, b10 and b40 may each independently be an integer from 1 to 4, b20 and b30 may each independently be an integer from 1 to 3, when b10 is 2 or more, two or more $R_{10}$(s) may be identical to or different from each other, when b20 is 2 or more, two or more $R_{20}$(s) may be identical to or different from each other, when b30 is 2 or more, two or more of $R_{30}$(s) may be identical to or different from each other, and when b40 is 2 or more, two or more $R_{40}$(s) may be identical to or different from each other, a substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), —P(=O)($Q_{18}$)($Q_{19}$), or a combination thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), —P(=O)($Q_{28}$)($Q_{29}$), or a combination thereof; or —N($Q_{31}$)($Q_{32}$), —Si($Q_{33}$)($Q_{34}$)($Q_{35}$), —B($Q_{36}$)($Q_{37}$), or —P(=O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, or a $C_6$-$C_{60}$ aryl group substituted with a $C_1$-$C_{60}$ alkyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or a combination thereof.

Another aspect of the present disclosure provides an organic light-emitting device including: a first electrode; a second electrode; and an organic layer between the first electrode and the second electrode and including an emission layer, wherein the organic layer includes an organometallic compound represented by Formula 1.

Another aspect of the present disclosure provides a diagnostic composition including an organometallic compound represented by Formula 1.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
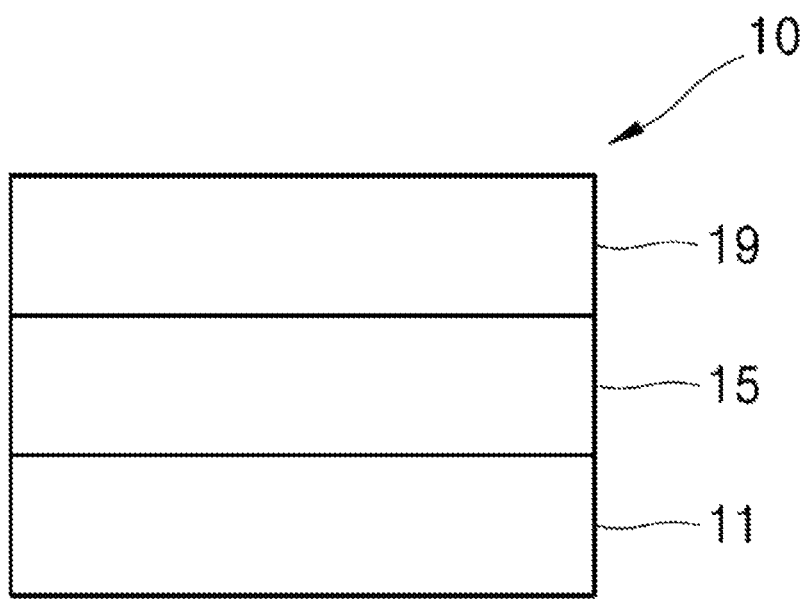
FIG. 1 is a schematic cross-sectional view of an organic light-emitting device according to an embodiment.

The present disclosure will now be described more fully with reference to exemplary embodiments. The disclosure may, however, be embodied in many different forms and should not be construed as being limited to the embodiments set forth herein; rather, these embodiments are provided so that this disclosure will be thorough and complete, and will fully convey the concept of the disclosure to those skilled in the art. Advantages, features, and how to achieve them of the present invention will become apparent by reference to the embodiment that will be described later in detail, together with the accompanying drawings. This invention may, however, be embodied in many different forms and should not be limited to the exemplary embodiments.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

An aspect of the present disclosure provides an organometallic compound represented by Formula 1:

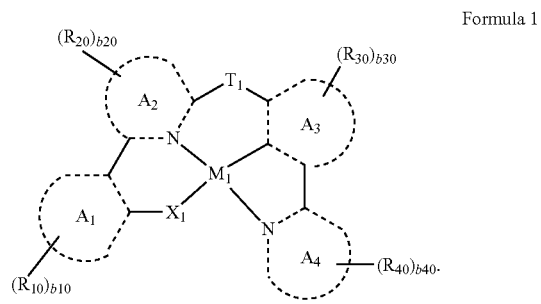

Formula 1

In Formula 1, $M_1$ may be beryllium (Be), magnesium (Mg), aluminum (Al), calcium (Ca), titanium ($T_1$), manganese (Mn), cobalt (Co), copper (Cu), zinc (Zn), gallium (Ga), germanium (Ge), zirconium (Zr), rhutenium (Ru), rhodium (Rh), palladium (Pd), silver (Ag), rhenium (Re), platinum (Pt), or gold (Au).

In one embodiment, $M_1$ may be Pd, Pt, or Au, but embodiments of the present disclosure are not limited thereto.

In Formula 1, $X_1$ may be N, O, or S.

In one embodiment, $X_1$ may be O or S. In one or more embodiments, $X_1$ may be O. In one or more embodiments, $X_1$ may be S. Here, a bond between $X_1$ and $M_1$ may be a covalent bond.

In Formula 1, ring $A_1$ and ring $A_3$ may each independently be a $C_5$-$C_{30}$ carbocyclic group or a $C_2$-$C_{30}$ heterocyclic group, and ring $A_2$ and ring $A_4$ may each independently be a $C_2$-$C_{30}$ heterocyclic group including N.

In one embodiment, ring $A_1$ and ring $A_3$ may each independently be
  i) a 6-membered ring,
  ii) a condensed ring in which two or more 6-membered rings are condensed with each other, and
  iii) a condensed ring in which a 6-membered ring and a 5-membered ring are condensed with each other,
  wherein each 6-membered ring in i), ii), and iii) may be a benzene group, a pyridine group, a pyrimidine group, a pyrazine group, a pyridazine group, or a triazine group, and
  each 5-membered ring in iii) may be a cyclopentadiene group, a furan group, a thiophene group, a pyrrole group, a silole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group.

In one embodiment, ring $A_1$ and ring $A_3$ may each independently be
a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, a tetrazole group, an oxazole group, an isoxazole group, a thiazole group, an isothiazole group, an oxadiazole group, a thiadiazole group, a benzopyrazole group, a benzimidazole group, an indazole group, a benzoxazole group, a benzothiazole group, a benzoxadiazole group, a benzothiadiazole group, a benzotriazole group, a diazaindene group, a triazaindene group, a 5,6,7,8-tetrahydroisoquinoline group, or a 5,6,7,8-tetrahydroquinoline group.

In one or more embodiments, ring $A_1$ and ring $A_3$ may each independently be a benzene group, a naphthalene group, a 1,2,3,4-tetrahydronaphthalene group, a fluorene group, a carbazole group, a dibenzofuran group, a dibenzothiophene group, or a dibenzosilole group.

In one or more embodiments, ring $A_2$ and ring $A_4$ may each independently be a pyridine group, a pyrimidine group, a pyrazine group, a pyridazine group, a triazine group, a quinoline group, an isoquinoline group, a quinoxaline group, a quinazoline group, a phenanthroline group, a furopyridine group, a thienopyridine group, an azafluorene group, an azacarbazole group, an azadibenzofuran group, an azadibenzothiophene group, an azadibenzosilole group, a pyrrole group, a pyrazole group, an imidazole group, a triazole group, a tetrazole group, an oxazole group, an isoxazole group, a thiazole group, an isothiazole group, an oxadiazole group, a thiadiazole group, a benzopyrazole group, a benzimidazole group, an indazole group, a benzoxazole group, a benzothiazole group, a benzoxadiazole group, a benzothiadiazole group, a benzotriazole group, a diazaindene group, or a triazaindene group.

In one or more embodiments, ring $A_1$ and ring $A_3$ may each independently be a benzene group,
ring $A_2$ may be a pyridine group or an isoquinoline group, and
ring $A_4$ may be a pyridine group, a pyridazine group, a furopyridine group, a thienopyridine group, a benzimidazole group, or a diazaindene group.

In one or more embodiments, a bond between ring $A_2$ and $M_1$ in Formula 1 may be a coordinate bond.

In Formula 1, a bond between ring $A_3$ and $M_1$ or a bond between ring $A_4$ and $M_1$ may be a covalent bond, and the other may be a coordinate bond. In this regard, the organometallic compound represented by Formula 1 may be electrically neutral.

In one or more embodiments, a bond between ring $A_3$ and $M_1$ may be a covalent bond, and a bond between ring $A_4$ and $M_1$ may be a coordinate bond, but embodiments of the present disclosure are not limited thereto.

In Formula 1, $T_1$ may be a single bond, *—N[$(L_1)_{a1}$-$(R_1)_{b1}$]—*', *—B($R_1$)—*', *—P($R_1$)—*', *—C($R_1$)($R_2$)—*', *—Si($R_1$)($R_2$)—*', *—Ge($R_1$)($R_2$)—*', *—S—*', *—Se—*', *—O—*', *—C(=O)—*', *—S(=O)—*', *—S(=O)$_2$—*', *—C($R_1$)=*', *=C($R_1$)—*', *—C($R_1$)=C($R_2$)—*', *—C(=S)—*', or *—C≡C—*', wherein $R_1$ and $R_2$ may each independently be understood by referring to the description provided below.

In one embodiment, $T_1$ may be *—N[$(L_1)_{a1}$-$(R_1)_{b1}$]—*', *—C($R_1$)($R_2$)—*', *—Si($R_1$)($R_2$)—*', *—O—*', or *—S—*'. For example, $T_1$ may be *—N[$(L_1)_{a1}$-$(R_1)_{b1}$]—*'.

In Formula 1, $L_1$ may be a single bond, a substituted or unsubstituted $C_5$-$C_{30}$ carbocyclic group, or a substituted or unsubstituted $C_2$-$C_{30}$ heterocyclic group.

a1 may be an integer from 1 to 3, wherein, when a1 is 2 or more, two or more $L_1$(s) may be identical to or different from each other. For example, a1 may be 1 or 2.

b1 may be an integer from 1 to 5, wherein, when b1 is 2 or more, two or more $R_1$(s) may be identical to or different from each other. For example, b1 may be 1, 2, or 3.

In one embodiment, $L_1$ may be a single bond, a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_2$-$C_{10}$ heterocycloalkyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or a combination thereof.

In one or more embodiments, $L_1$ may be a single bond or a group represented by Formulae 3-1 to 3-3:

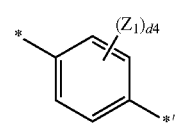

3-1

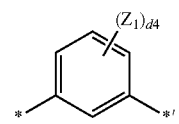

3-2

-continued

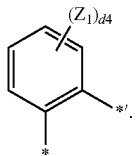
3-3

In Formulae 3-1 to 3-3, $Z_1$ may be hydrogen, deuterium, a $C_1$-$C_{10}$ alkyl group, a phenyl group, a biphenyl group, or a terphenyl group, d4 may be an integer from 0 to 4, and

* and *' each indicate a binding site to a neighboring atom.

In one embodiment, $L_1$ may be a group represented by Formula 3-1. In one or more embodiments, $L_1$ may be a group represented by Formula 3-2. In one or more embodiments, $L_1$ may be a group represented by Formula 3-3.

In one or more embodiments, $L_1$ may be a single bond.

$R_1$ and $R_2$ may optionally be linked, via a single bond, a double bond, or a first linking group, to form a $C_5$-$C_{30}$ carbocyclic group that is unsubstituted or substituted with $R_{10a}$, a $C_2$-$C_{30}$ heterocyclic group that is unsubstituted or substituted with $R_{10a}$ (for example, a fluorene group, a xanthene group, and an acridine group, each unsubstituted or substituted with $R_{10a}$), or a combination thereof. $R_{10a}$ is the same as defined in connection with $R_1$.

The first linking group may be *—N($R_3$)—*', *—B($R_3$)—*', *—P($R_3$)—*', *—C($R_3$)($R_4$)—*', *—Si($R_3$)($R_4$)—*', *—Ge($R_3$)($R_4$)—*', *—S—*', *—Se—*', *—Se—*, *—O—*, *—C(=O)—*', *—S(=O)—*', *—S(=O)$_2$—*', —C($R_3$)=*', *=C($R_3$)—*', *—C($R_3$)=C($R_4$)—*', *—C(=S)—*', or *—C≡C—*', wherein $R_3$ and $R_4$ are each the same as defined in connection with $R_1$, and * and *' each indicate a binding site to a neighboring atom.

In Formula 1, $R_1$, $R_2$, $R_{10}$, $R_{20}$, $R_{30}$, and $R_{40}$ may each independently be hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), or —P(=O)($Q_8$)($Q_9$).

In Formula 1, b10, b20, b30, and b40 may each independently be an integer from 1 to 10, wherein, when b20 is 2 or more, two or more $R_{20}$(s) may optionally be linked to form a $C_5$-$C_{30}$ carbocyclic group that is unsubstituted or substituted with an $R_{10a}$, a $C_2$-$C_{30}$ heterocyclic group that is unsubstituted or substituted with an $R_{10a}$, or a combination thereof. Here, $R_{10a}$ is the same as defined in connection with $R_{10}$.

In one embodiment, $R_1$, $R_2$, $R_{10}$, $R_{20}$, $R_{30}$, and $R_{40}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, $C_1$-$C_{20}$ alkyl group, or a $C_1$-$C_{20}$ alkoxy group;

a $C_1$-$C_{20}$ alkyl group, a $C_1$-$C_{20}$ alkoxy group, or a combination thereof, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a pyridinyl group, a pyrimidinyl group, or a combination thereof;

a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group;

a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{20}$ alkyl group, a C$_1$-C$_{20}$ alkoxy group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or a combination thereof; or —N(Q$_1$)(Q$_2$), —Si(Q$_3$)(Q$_4$)(Q$_5$), —B(Q$_6$)(Q$_7$), or —P(=O)(Q$_8$)(Q$_9$), and Q$_1$ to Q$_9$ may each independently be —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, or —CD$_2$CDH$_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group, each substituted with deuterium, a C$_1$-C$_{10}$ alkyl group, a phenyl group, or a combination thereof.

For example, R$_1$ and R$_2$ may each independently be a C$_1$-C$_{30}$ alkyl group;

a C$_1$-C$_{30}$ alkyl group substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{10}$ alkyl group, a C$_1$-C$_{10}$ alkoxy group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a pyridinyl group, a pyrimidinyl group, or a combination thereof; or a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group; or a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{10}$ alkyl group, a C$_1$-C$_{10}$ alkoxy group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a pyridinyl group, a pyrimidinyl group, or a combination thereof.

In one or more embodiments, R$_1$, R$_2$, R$_{10}$, R$_{20}$, R$_{30}$, and R$_{40}$ may each independently be hydrogen, deuterium, —F, a cyano group, a nitro group, —SF$_5$, a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a pyridinyl group, a pyrimidinyl group, a carbazolyl group, a dibenzofuranyl group, or a dibenzothiophenyl group;

a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a pyridinyl group, a pyrimidinyl group, a carbazolyl group, a dibenzofuranyl group, or a dibenzothiophenyl group, each substituted with deuterium, —F, —CD$_3$, —CD$_2$H, —CDH$_2$, —CF$_3$, —CF$_2$H, —CFH$_2$, a cyano group, a nitro group, a C$_1$-C$_{00}$ alkyl group, a C$_1$-C$_{10}$ alkoxy group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a pyridinyl group, a pyrimidinyl group, a carbazolyl group, a dibenzofuranyl group, a dibenzothiophenyl group, or a combination thereof; or —N(Q$_1$)(Q$_2$), —Si(Q$_3$)(Q$_4$)(Q$_5$), —B(Q$_6$)(Q$_7$), or —P(=O)(Q$_8$)(Q$_9$), and Q$_1$ to Q$_9$ may each independently be
—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, or —CD$_2$CDH$_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group, each substituted with deuterium, a C$_1$-C$_{10}$ alkyl group, a phenyl group, or a combination thereof.

For example, R$_1$, R$_2$, R$_{10}$, R$_{20}$, R$_{30}$, and R$_{40}$ may each independently be hydrogen, deuterium, —F, a cyano group, a nitro group, —SF$_5$, —CH$_3$, —CD$_3$, —CD$_2$H, —CDH$_2$, —CF$_3$, —CF$_2$H, —CFH$_2$, a group represented by Formulae 9-1 to 9-19, or a group represented by Formulae 10-1 to 10-194:

9-1
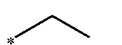

9-2
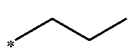

9-3

9-4

9-5
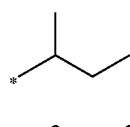

9-6
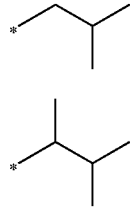

9-7
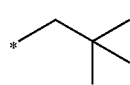

9-8
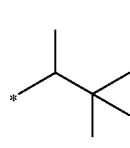

9-9
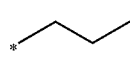

9-10
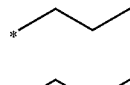

9-11
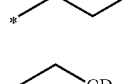

9-12
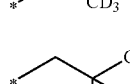

9-13

9-14
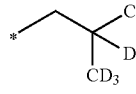

9-15
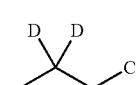

9-16

9-17
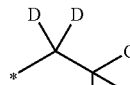

9-18
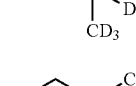

9-19
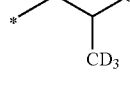

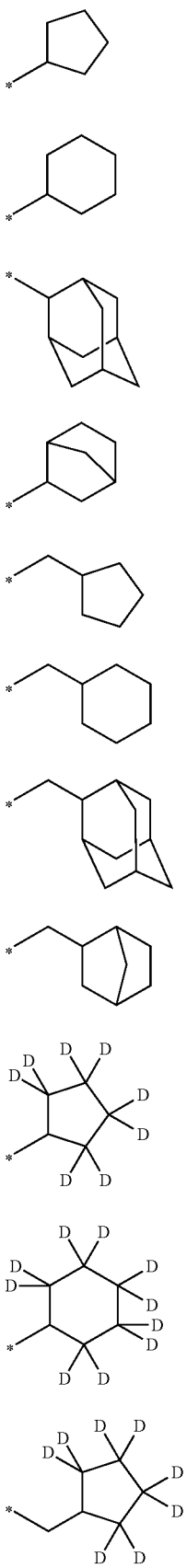
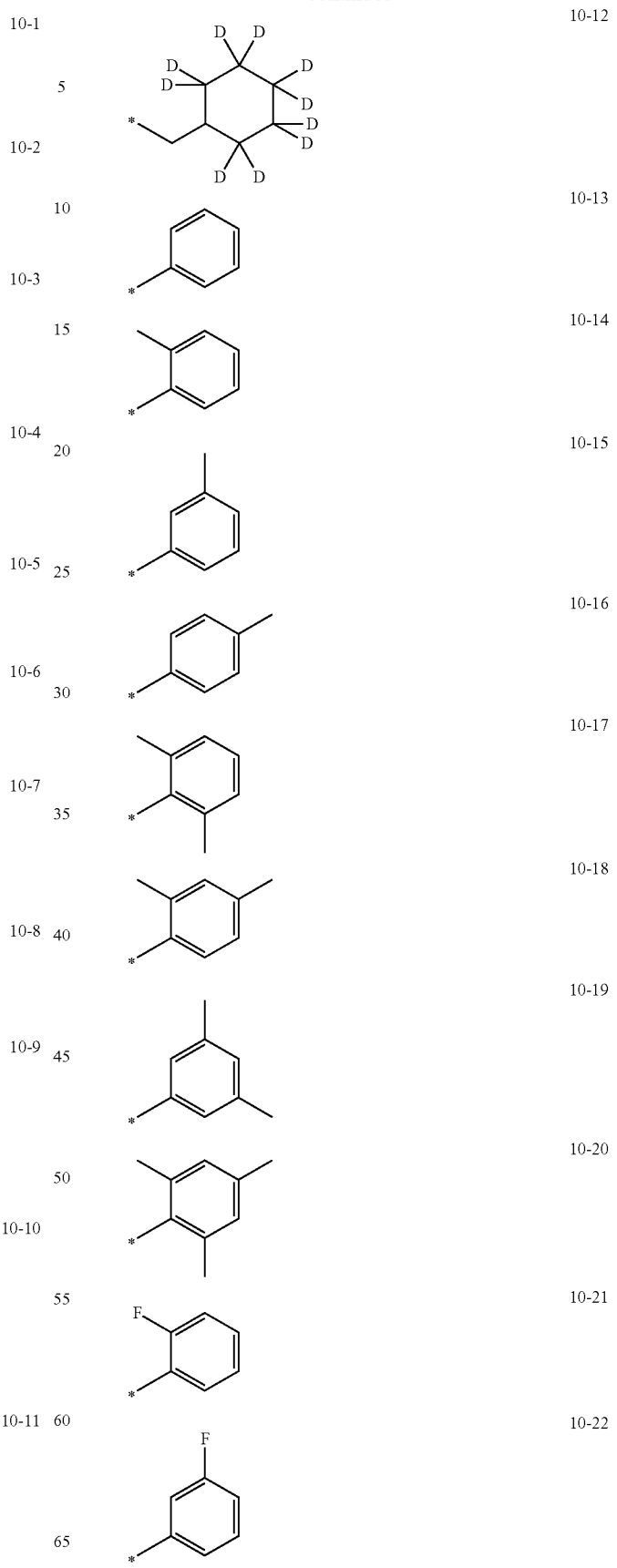

-continued
| | | |
|---|---|---|
| 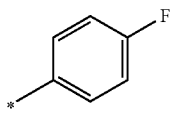 | 10-23 | 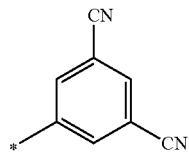 10-33 |
| 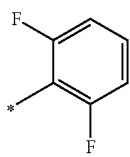 | 10-24 | 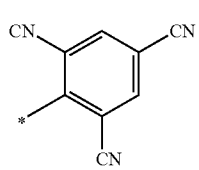 10-34 |
| 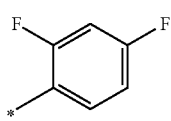 | 10-25 | 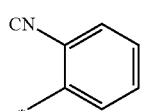 10-35 |
| 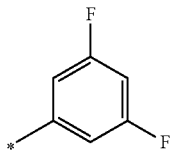 | 10-26 | 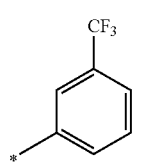 10-36 |
| 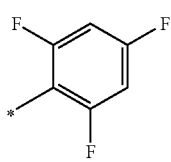 | 10-27 | 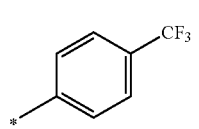 10-37 |
| 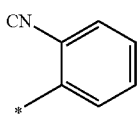 | 10-28 | 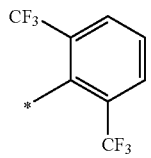 10-38 |
| 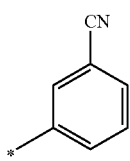 | 10-29 | 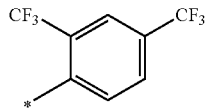 10-39 |
| 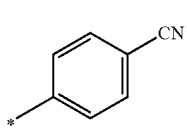 | 10-30 | 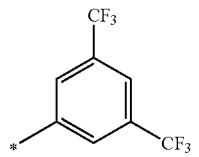 10-40 |
| 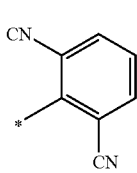 | 10-31 | 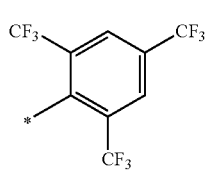 10-41 |
| 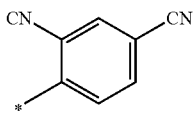 | 10-32 | 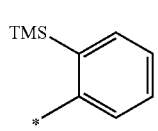 10-42 |

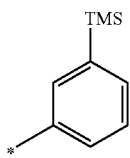
10-43
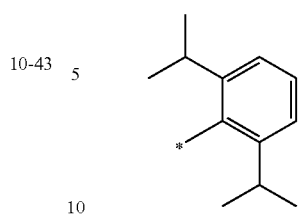
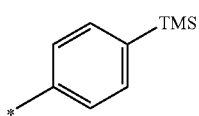
10-44
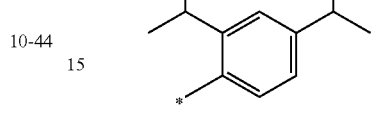
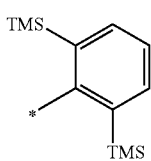
10-45
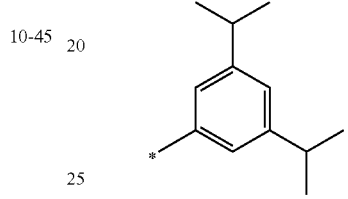
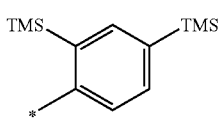
10-46
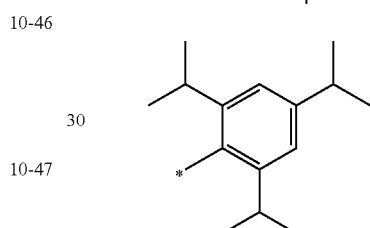
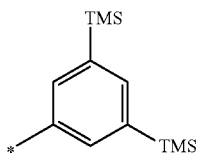
10-47
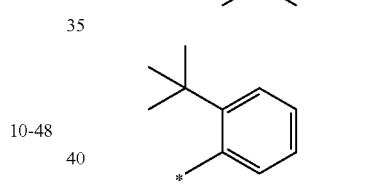
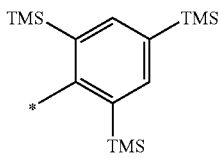
10-48
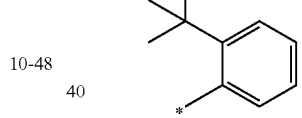
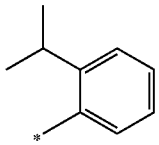
10-49
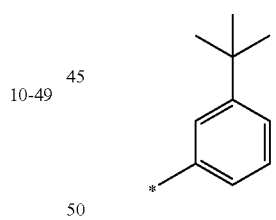
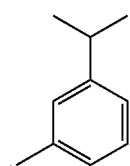
10-50
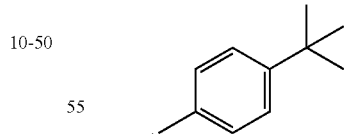
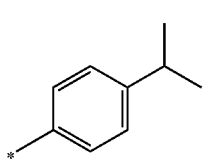
10-51
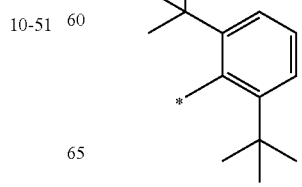
10-52
10-53
10-54
10-55
10-56
10-57
10-58
10-59

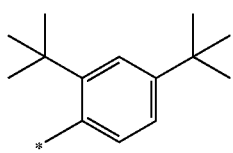
10-60
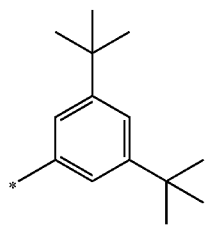
10-61
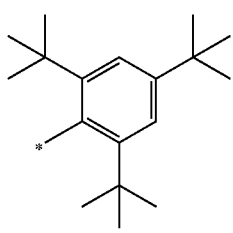
10-62
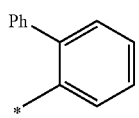
10-63
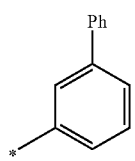
10-64
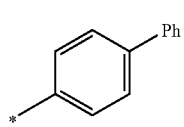
10-65
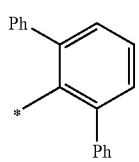
10-66
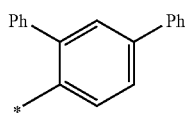
10-67
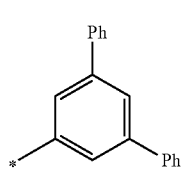
10-68
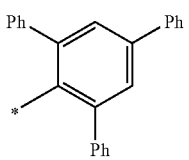
10-69
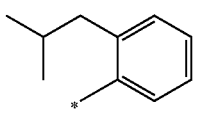
10-70
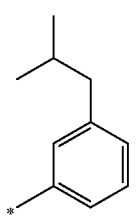
10-71
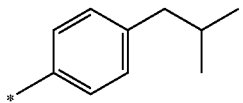
10-72
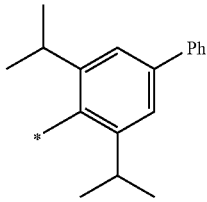
10-73
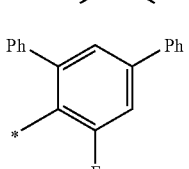
10-74
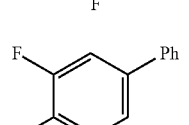
10-75
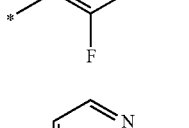
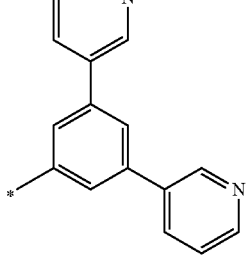
10-76

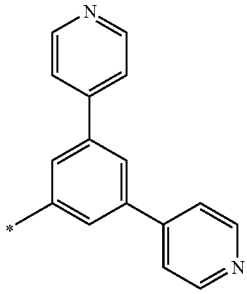
10-77
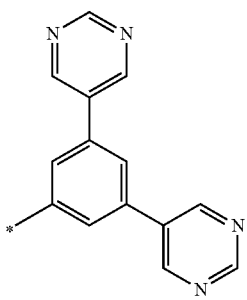
10-78
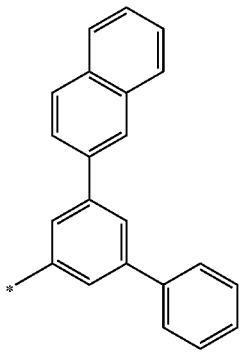
10-79
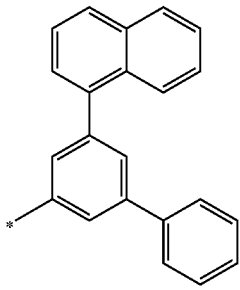
10-80
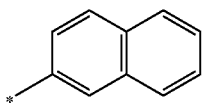
10-81
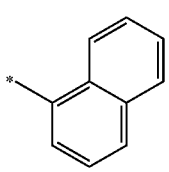
10-82
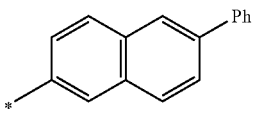
10-83
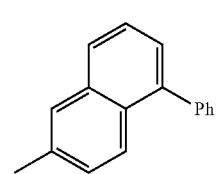
10-84
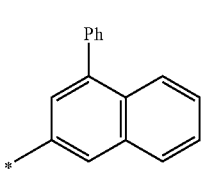
10-85
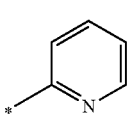
10-86
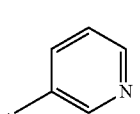
10-87
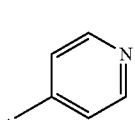
10-88
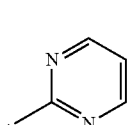
10-89
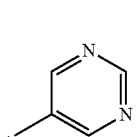
10-90
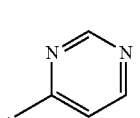
10-91
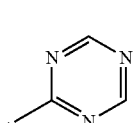
10-92
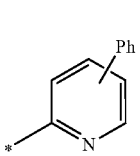
10-93

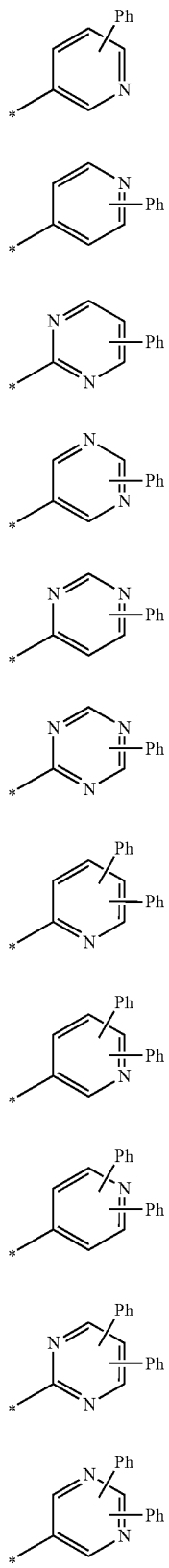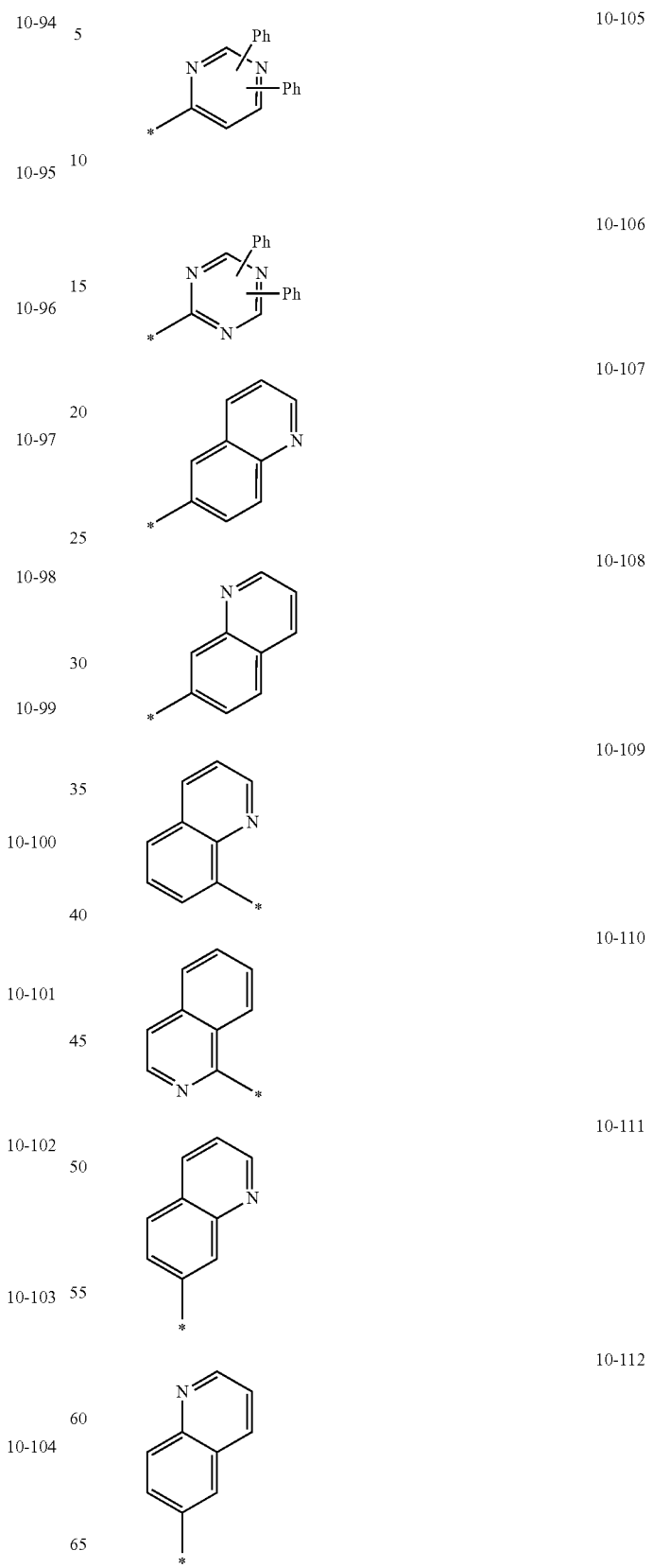

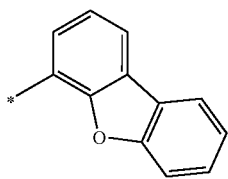 10-113
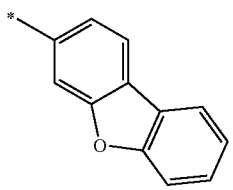 10-114
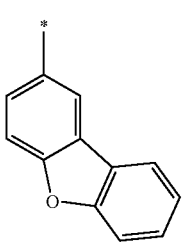 10-115
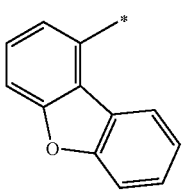 10-116
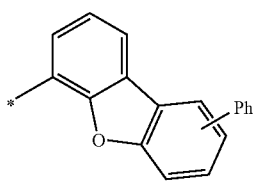 10-117
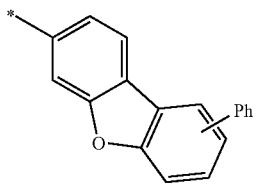 10-118
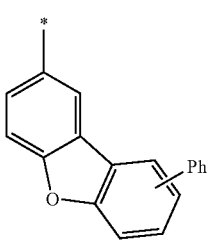 10-119
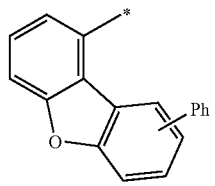 10-120
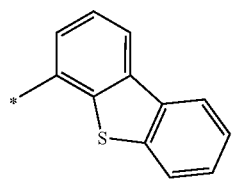 10-121
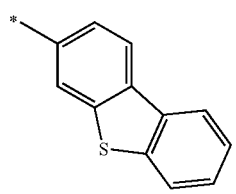 10-122
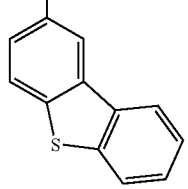 10-123
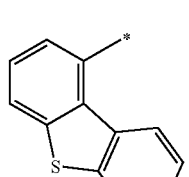 10-124
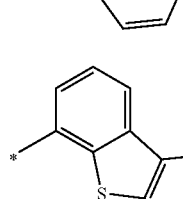 10-125
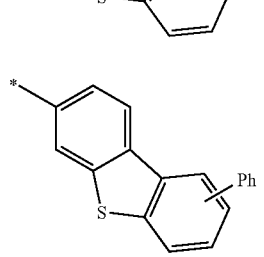 10-126

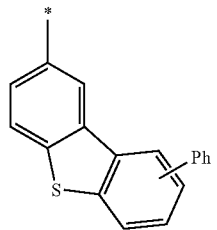 10-127
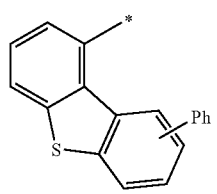 10-128
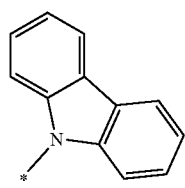 10-129
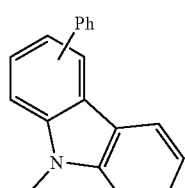 10-130
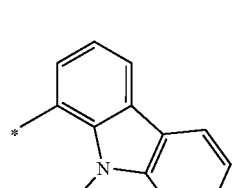 10-131
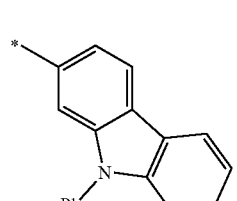 10-132
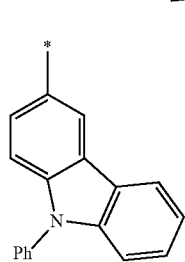 10-133
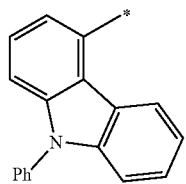 10-134
10-135
10-136
10-137
10-138
10-139
10-140
10-141

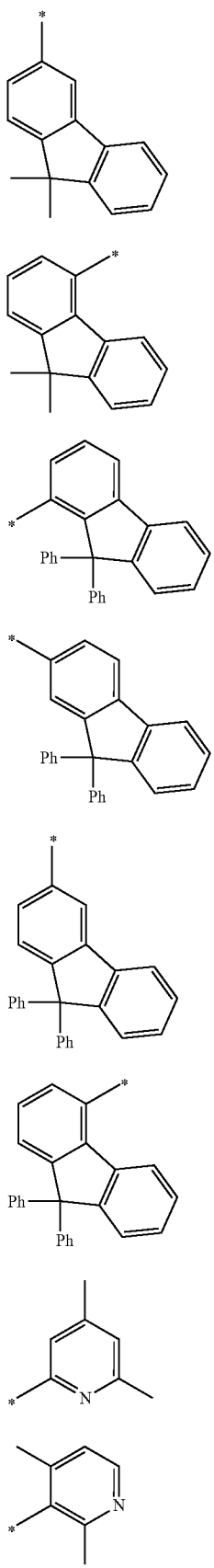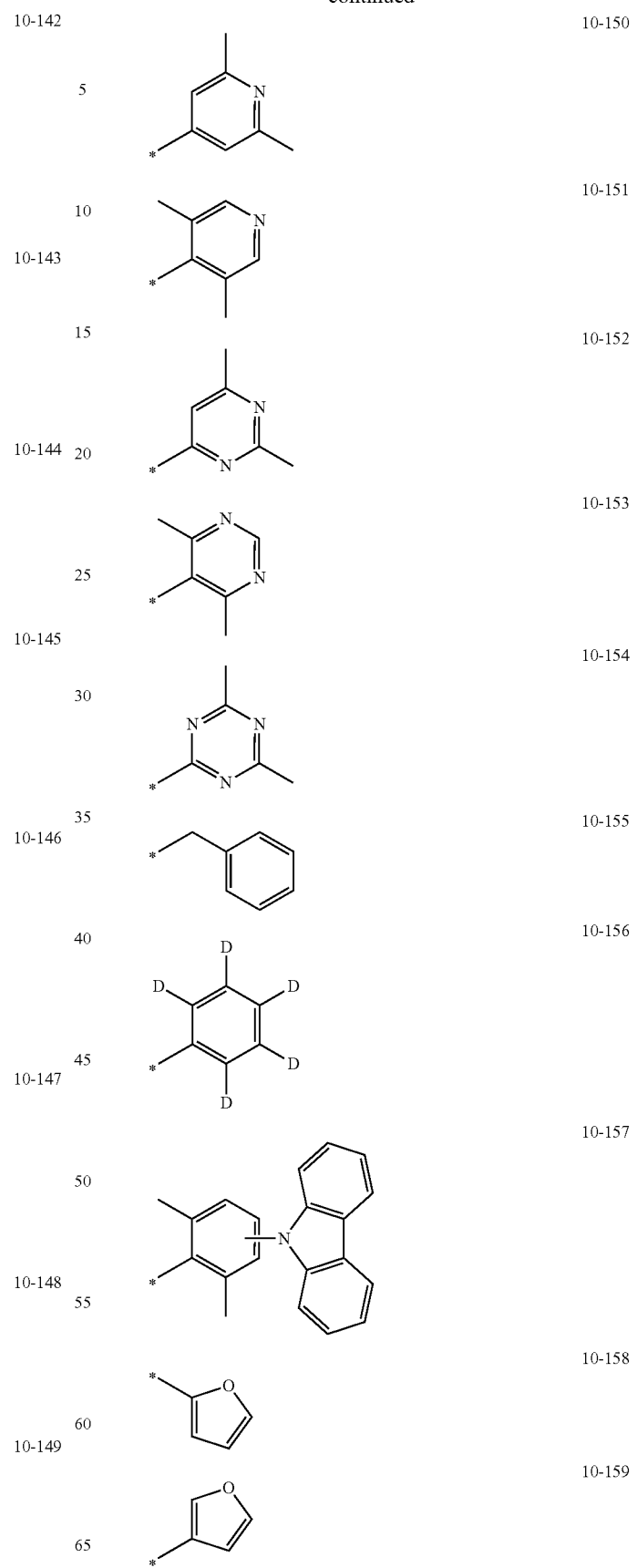

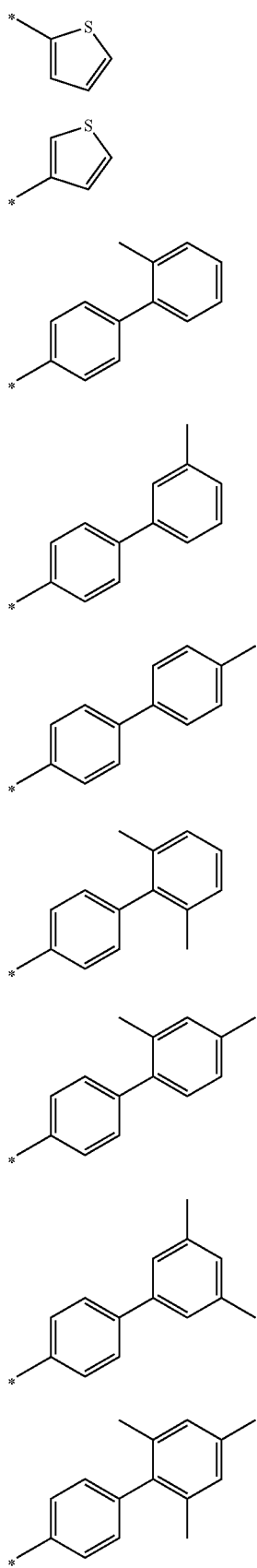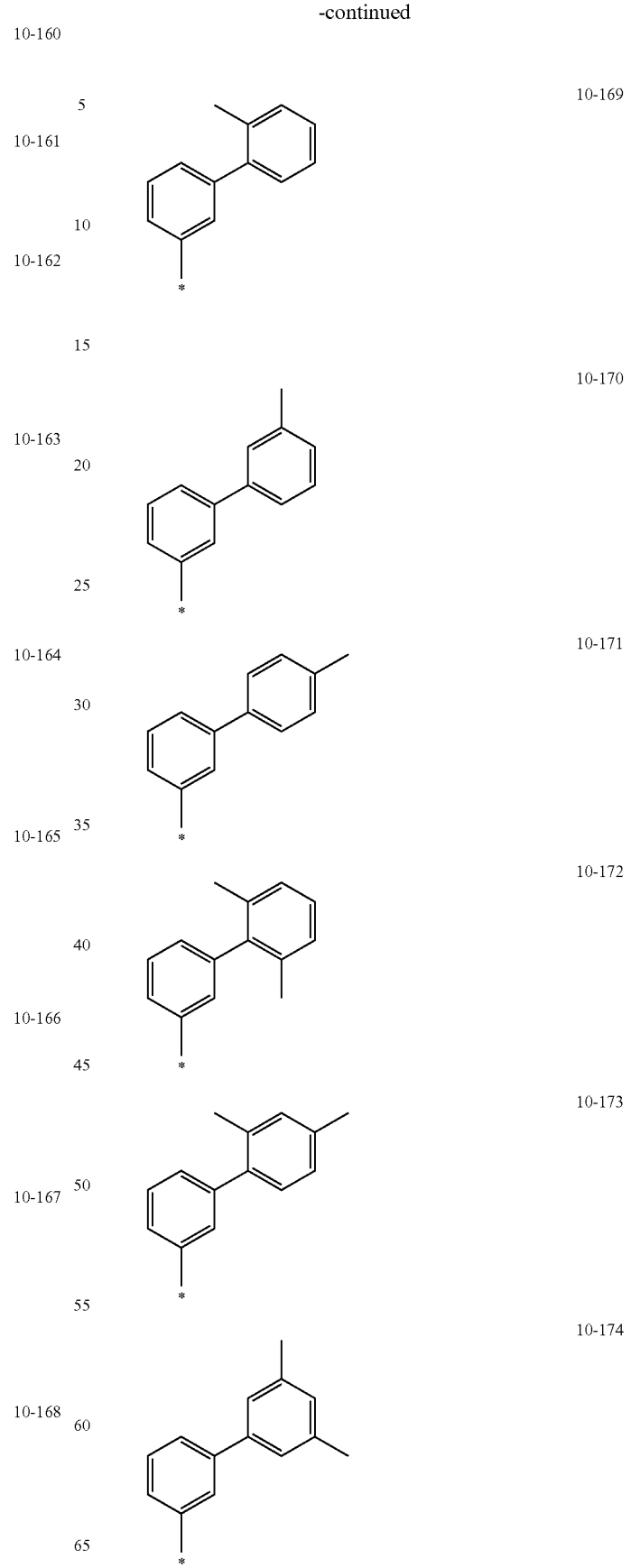

10-175 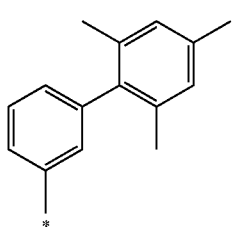
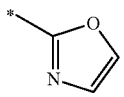 10-183
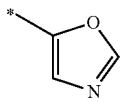 10-184
10-176 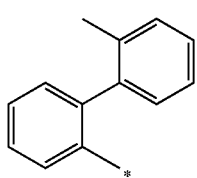
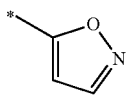 10-185
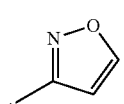 10-186
10-177 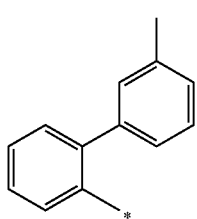
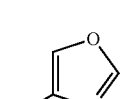 10-187
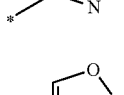 10-188
10-178 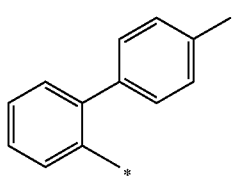
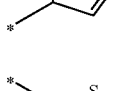 10-189
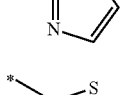 10-190
10-179 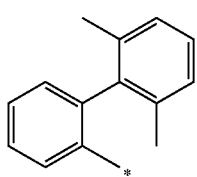
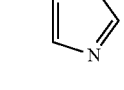 10-191
10-180 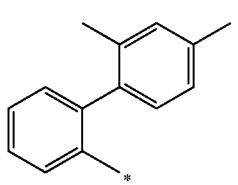
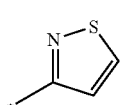 10-192
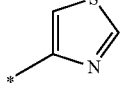 10-193
10-181 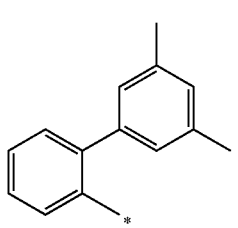
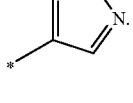 10-194
10-182 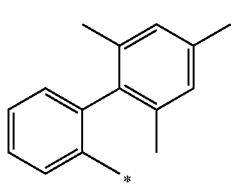
In Formulae 9-1 to 9-19 and 10-1 to 10-194, * indicates a binding site to a neighboring atom, Ph indicates a phenyl group, and TMS indicates a trimethylsilyl group.
In one embodiment, $R_{10}$ may be a group represented by Formulae 9-1 to 9-19.
In one embodiment, $R_{20}$ may be a group represented by Formulae 10-1 to 10-194.

In one embodiment, $R_1$ and $R_2$ may each independently be a group represented by Formulae 9-1 to 9-19 and 10-1 to 10-194.

In one embodiment, $R_1$, $R_2$, $R_{10}$, $R_{20}$, $R_{30}$, and $R_{40}$ may be a $C_1$-$C_{30}$ alkyl group; or a $C_1$-$C_{30}$ alkyl group substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a pyridinyl group, a pyrimidinyl group, or a combination thereof;

a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group; or a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or a combination thereof.

In Formula 1, b1, b10, b20, b30, and b40 each indicate the number of $R_1$, the number of $R_{10}$, the number of $R_{20}$, the number of $R_{30}$, and the number of $R_{40}$, respectively. For example, b1 may be an integer from 1 to 5, b10 and b40 may each independently be an integer from 1 to 4, and b20 and b30 may each independently be an integer from 1 to 3.

When b1 is 2 or more, two or more $R_1(s)$ may be identical to or different from each other, when b10 is 2 or more, two or more $R_{10}(s)$ may be identical to or different from each other, when b20 is 2 or more, two or more $R_{20}(s)$ may be identical to or different from each other, when b30 is 2 or more, two or more $R_{30}(s)$ may be identical to or different from each other, and when b40 is 2 or more, two or more $R_{40}(s)$ may be identical to or different from each other.

In one embodiment, two neighboring groups among $R_1$, $R_2$, $R_{10}$, $R_{20}$, $R_{30}$, and $R_{40}$ may optionally be linked to form a substituted or unsubstituted $C_5$-$C_{30}$ carbocyclic group or a substituted or unsubstituted $C_2$-$C_{30}$ heterocyclic group.

For example, when b10 in Formula 1 is 2 or more, two or more $R_{10}(s)$ may optionally be linked to form a cyclopentane group, a cyclopentadiene group, a furan group, a thiophene group, a pyrrole group, a silole group, an adamantane group, a norbornane group, a norbornene group, a cyclohexane group, a cyclohexene group, a benzene group, a naphthalene group, an indene group, an indole group, a benzofuran group, a benzothiophene group, a benzosilole group, a fluorene group, a carbazole group, a dibenzofuran group, a dibenzothiophene group, or a dibenzosilole group, each unsubstituted or substituted with an $R_{10a}$.

In one or more embodiments, when b20 in Formula 1 is 2 or more, two or more $R_{20}(s)$ may optionally be linked to form a cyclopentane group, a cyclopentadiene group, a furan group, a thiophene group, a pyrrole group, a silole group, an adamantane group, a norbornane group, a norbornene group, a cyclohexane group, a cyclohexene group, a benzene group, a naphthalene group, an indene group, an indole group, a benzofuran group, a benzothiophene group, a benzosilole group, a fluorene group, a carbazole group, a dibenzofuran group, a dibenzothiophene group, or a dibenzosilole group, each unsubstituted or substituted with an $R_{10a}$.

In one or more embodiments, when b30 in Formula 1 is 2 or more, two or more R$_{30}$(s) may optionally be linked to form a cyclopentane group, a cyclopentadiene group, a furan group, a thiophene group, a pyrrole group, a silole group, an adamantane group, a norbornane group, a norbornene group, a cyclohexane group, a cyclohexene group, a benzene group, a naphthalene group, an indene group, an indole group, a benzofuran group, a benzothiophene group, a benzosilole group, a fluorene group, a carbazole group, a dibenzofuran group, a dibenzothiophene group, or a dibenzosilole group, each unsubstituted or substituted with R$_{10a}$.

In one or more embodiments, when b40 in Formula 1 is 2 or more, two or more R$_{40}$(s) may optionally be linked to form a cyclopentane group, a cyclopentadiene group, a furan group, a thiophene group, a pyrrole group, a silole group, an adamantane group, a norbornane group, a norbornene group, a cyclohexane group, a cyclohexene group, a benzene group, a naphthalene group, an indene group, an indole group, a benzofuran group, a benzothiophene group, a benzosilole group, a fluorene group, a carbazole group, a dibenzofuran group, a dibenzothiophene group, or a dibenzosilole group, each unsubstituted or substituted with R$_{10a}$.

R$_{10a}$ is the same as defined in connection with R$_{10}$.

In one embodiment, a moiety represented by

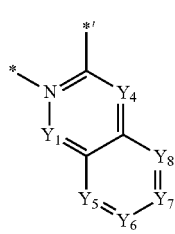

in Formula 1 may be represented by Formulae A4-1 to A4-10:

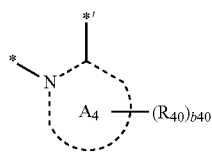

A4-1

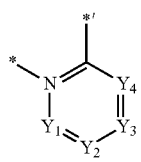

A4-2

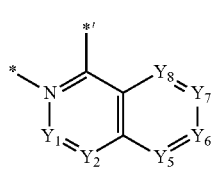

A4-3

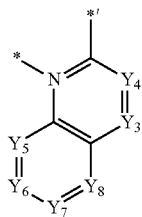

A4-4

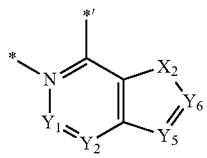

A4-5

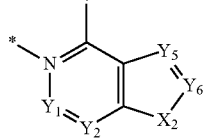

A4-6

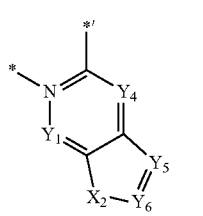

A4-7

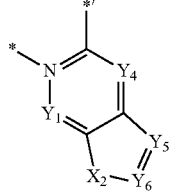

A4-8

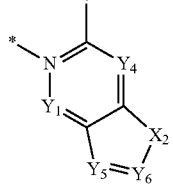

A4-9

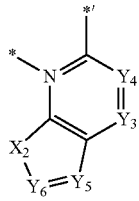

A4-10

In Formulae A4-1 to A4-10,

X$_2$ may be O, S, or N(R$_5$),

Y$_1$ may be N or C(R$_{41}$), Y$_2$ may be N or C(R$_{42}$), Y$_3$ may be N or C(R$_{43}$), and Y$_4$ may be N or C(R$_{44}$), Y$_5$ may be N or C(R$_{55}$), Y$_6$ may be N or C(R$_{56}$), Y$_7$ may be N or C(R$_{57}$), and Y$_8$ may be N or C(R$_{58}$), R$_5$, R$_{41}$ to R$_{44}$, R$_{55}$, and R$_{56}$ are each independently the same as defined in connection with R$_{40}$, and

* and *' each indicate a binding site to a neighboring atom.

In one embodiment, the organometallic compound represented by Formula 1 may be represented by Formulae 1-1 or 1-2:

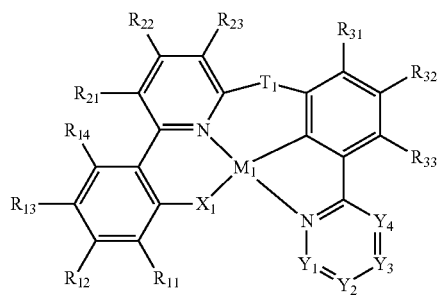

Formula 1-1

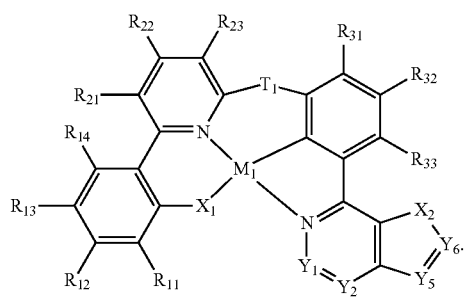

Formula 1-2

In Formulae 1-1 and 1-2, $M_1$, $X_1$, and $T_1$ are each the same as described above, $X_2$ may be O, S, or $N(R_5)$, $Y$ may be N or $C(R_{41})$, $Y_2$ may be N or $C(R_{42})$, $Y_3$ may be N or $C(R_{43})$, and $Y_4$ may be N or $C(R_{44})$, $Y_5$ may be N or $C(R_{55})$, and $Y_6$ may be N or $C(R_{56})$, $R_1$ to $R_{14}$ may each independently be the same as defined in connection with $R_{10}$, $R_{21}$ to $R_{23}$ may each independently be the same as defined in connection with $R_{20}$, $R_{31}$ to $R_{33}$ may each independently be the same as defined in connection with $R_{30}$, $R_5$, $R_{41}$ to $R_{44}$, $R_{55}$, and $R_{56}$ may each independently be the same as defined in connection with $R_{40}$, and two or more groups among $R_{11}$ to $R_{14}$, $R_{21}$ to $R_{23}$, $R_{31}$ to $R_{33}$, $R_{41}$ to $R_{44}$, $R_{55}$, and $R_{56}$ may optionally be linked to form a benzene ring or a naphthalene ring.

In one or more embodiments, the organometallic compound may be of Compounds 1 to 9, but embodiments of the present disclosure are not limited thereto:

1

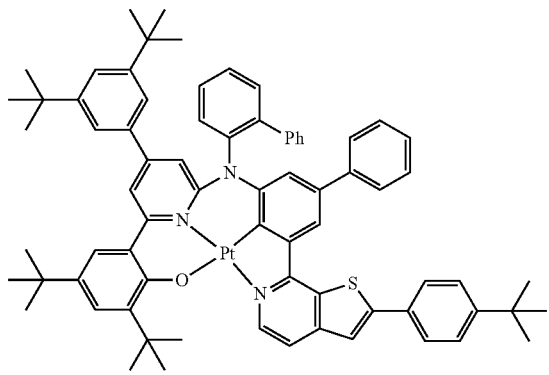

2

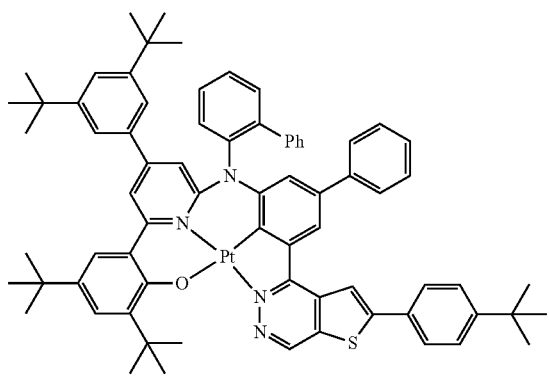

3

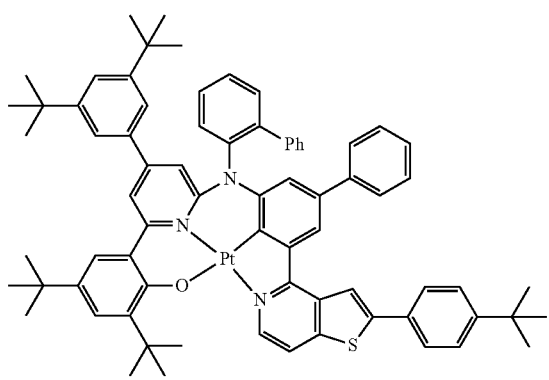

4

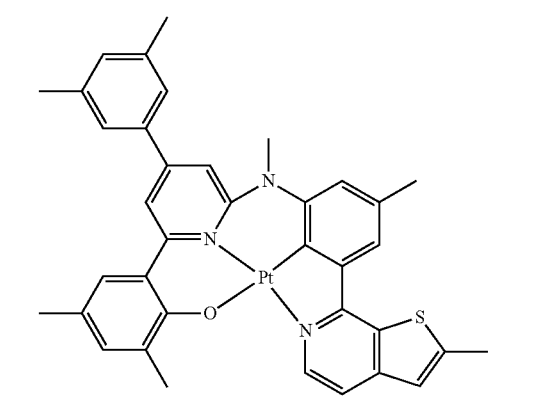

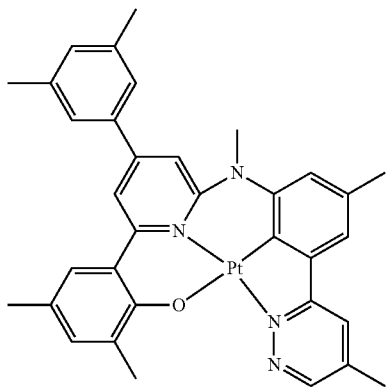

5

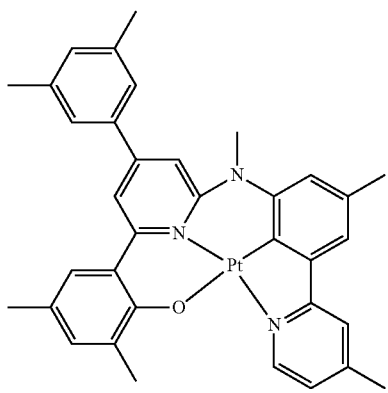

6

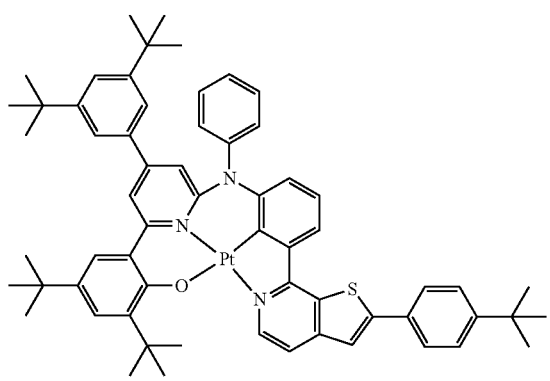

7

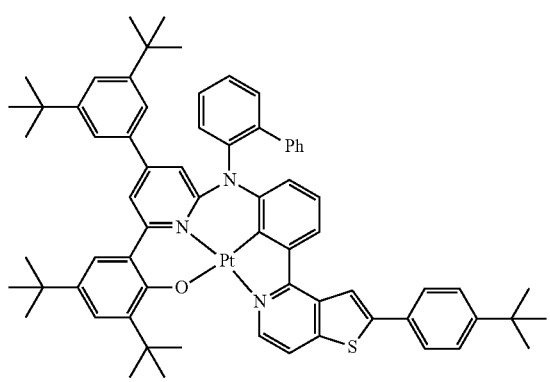

8

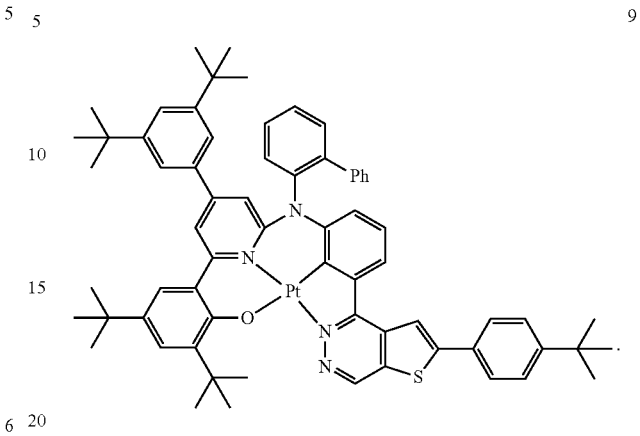

9

The organometallic compound represented by Formula 1 may have a reduced non-radiative decay rate due to a high anti-bonding orbital energy level relative to a highest occupied molecular orbital (HOMO) energy level. In this regard, an electronic device, for example, an organic light-emitting device, including the organometallic compound represented by Formula 1 may have excellent dopant quantum efficiency and high luminescence efficiency.

For example, a difference (i.e., "energy gap") between a HOMO energy level of Compound 1 at a singlet ground state and a $d(x^2-y^2)$ antibonding orbital energy level of the same compound, a photoluminescence quantum yield (PLQY), and a non-radiative decay rate (knr) are evaluated using the Jaguar 9.1 suite software according to the following method, and the results are shown in Table 1:

Method

XC Functional=M06

Basis set (geometry optimization)=LACVP**

Basis set (Single point calculation)=cc-PVTZ(-f) (main group element), LACV3P** (for Pt)

TABLE 1

| Compound No. | Energy gap (eV) | PLQY | knr |
| --- | --- | --- | --- |
| Compound 1 | 5.396 eV | 0.984 | 7.06E+03 |
| Compound 3 | 5.412 eV | 0.963 | 6.27E+03 |
| Compound A | 5.869 eV | 0.109 | 2.22E+06 |
| Compound B | 6.642 eV | 0.293 | 7.45E+03 |
| Compound C | 6.963 eV | 0.406 | 6.81E+05 |

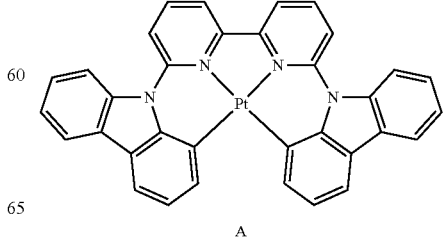

A

TABLE 1-continued

| Compound No. | Energy gap (eV) | PLQY | knr |
| --- | --- | --- | --- |

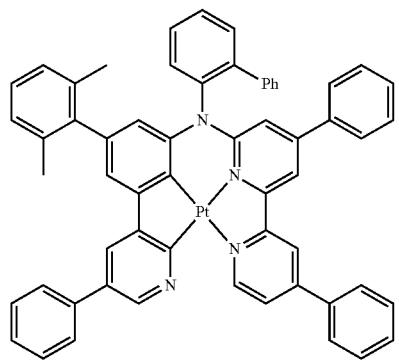

B

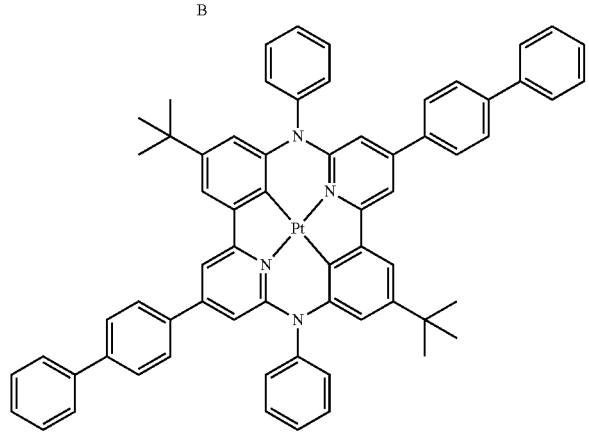

C

Referring to Table 1, the organometallic compound represented by Formula 1 is a molecule that is designed to increase the energy gap and that also has a small knr value, and thus may have high luminescence efficiency of 0.9 or more. Therefore, when the organometallic compound represented by Formula 1 is used as a material for forming an emission layer in an electronic device, for example, an organic light-emitting device, the organometallic compound represented by Formula 1 is confirmed to have appropriate electrical characteristics for improving luminescence efficiency of the organic light-emitting device.

Alternatively, in the case of Compounds A to C corresponding to Comparative Examples, the compounds each have a large energy gap, but due to photon quenching caused by vibrations in a ligand, a non-radiative decay rate was fast. Accordingly, Compounds A to C each show a remarkably low luminescence quantum yield as compared with the organometallic compound represented by Formula 1. In this regard, it is confirmed that the structure of each of Compounds A to C has a limitation in achieving high luminescence efficiency when applied to an organic light-emitting device.

A synthesis method for the organometallic compound represented by Formula 1 would be understood by those of ordinary skill in the art by referring to the following examples.

Therefore, considering that the organometallic compound represented by Formula 1 may be appropriately used as a material for forming an organic layer, for example, an emission layer of an organic light-emitting device another aspect of the present disclosure provides an organic light-emitting device including: a first electrode; a second electrode; and an organic layer between the first electrode and the second electrode and including an emission layer, wherein the organic layer includes an organometallic compound represented by Formula 1.

When the organic light-emitting device includes an organic layer including the organometallic compound represented by Formula 1, the organic light-emitting device may have low driving voltage, high efficiency, high current, high quantum efficiency, long lifespan, low roll-off, and excellent color purity.

For example, in the organic light-emitting device, the first electrode may be an anode, the second electrode may be a cathode, and the organic layer may further include a hole transport region between the first electrode and the emission layer and an electron transport region between the emission layer and the second electrode, wherein the hole transport region may include a hole injection layer, a hole transport layer, an electron blocking layer, or any combination thereof, and the electron transport region may include a hole blocking layer, an electron transport layer, an electron injection layer, or any combination thereof.

In one embodiment, the emission layer may include the organometallic compound represented by Formula 1.

The organometallic compound represented by Formula 1 included in the emission layer may serve as an emitter. For example, the emission layer including the organometallic compound represented by Formula 1 may emit phosphorescence by transferring excitons in a triplet state of the organometallic compound to a ground state.

In one embodiment, the emission layer including the organometallic compound represented by Formula 1 may further include a host, and the host may be any host known in the art. The host is the same as described above. An amount of the host included in the emission layer may be greater than that of the organometallic compound represented by Formula 1 included in the emission layer.

In one or more embodiments, the emission layer may include a host and a dopant, wherein the host may be any host known in the art, and the dopant may be the organometallic compound represented by Formula 1. The emission layer may emit phosphorescence by transferring excitons in a triplet state in the organometallic compound which serves as a dopant to a ground state.

In one embodiment, the emission layer may emit red light having a maximum emission wavelength between 580 nm and 680 nm.

The expression "(an organic layer) includes organometallic compound" as used herein may include a case in which "(an organic layer) includes a single organometallic compound represented by Formula 1" and a case in which "(an organic layer) includes two or more different organometallic compounds represented by Formula 1".

For example, the organic layer may include, as the organometallic compound, only Compound 1. In this regard, Compound 1 may exist in an emission layer of the organic light-emitting device. In one or more embodiments, the organic layer may include, as the organometallic compound, Compound 1 and Compound 2. In this regard, Compound 1 and Compound 2 may exist in an identical layer (for example, Compound 1 and Compound 2 may both exist in an emission layer).

The term "organic layer" as used herein refers to a single layer and/or a plurality of layers disposed between the first electrode and the second electrode of the organic light-emitting device. A material included in the "organic layer"

includes not only an organic compound, but also a metal-containing organometallic complex.

FIG. 1 is a schematic cross-sectional view of an organic light-emitting device 10 according to an embodiment. Hereinafter, a structure of the organic light-emitting device 10 according to an embodiment and a method of manufacturing the organic light-emitting device 10 will be described in connection with FIG. 1. The organic light-emitting device 10 has a first electrode 11, an organic layer 15, and a second electrode 19 that are sequentially stacked in the stated order.

A substrate may be additionally disposed under the first electrode 11 or above the second electrode 19. As the substrate, a substrate used in a conventional organic light-emitting device may be used, and for example, the substrate may be a glass substrate or a transparent plastic substrate, each having excellent mechanical strength, thermal stability, transparency, surface smoothness, ease of handling, and water resistance.

The first electrode 11 may be formed by, for example, depositing or sputtering a material for forming the first electrode 11 on the substrate. When the first electrode 11 is an anode, the material for forming the first electrode 11 may be a material with a high work function to facilitate hole injection. When the first electrode 11 is a reflective electrode, a semi-transmissive electrode, or a transmissive electrode, the material for forming the first electrode 11 may be indium tin oxide (ITO), indium zinc oxide (IZO), tin oxide (SnO$_2$), zinc oxide (ZnO), and the like. In one embodiment, the material for forming the first electrode 11 may be a metal or alloy such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure, or a multi-layered structure including two or more layers. For example, the first electrode 11 may have a three-layered structure of ITO/Ag/ITO, but embodiments of the present disclosure are not limited thereto.

The organic layer 15 may be disposed on the first electrode 11.

The organic layer 15 may include a hole transport region, an emission layer, an electron transport region, or a combination thereof.

The hole transport region may be disposed between the first electrode 11 and the emission layer.

The hole transport region may include a hole injection layer, a hole transport layer, an electron blocking layer, a buffer layer, or any combination thereof.

The hole transport region may include a hole injection layer only, or a hole transport layer only. In one embodiment, the hole transport region may have a hole injection layer/hole transport layer structure or a hole injection layer/hole transport layer/electron blocking layer structure, wherein for each structure, constituting a layer is sequentially stacked from the first electrode 11.

When the hole transport region includes a hole injection layer, the hole injection layer may be formed on the first electrode 11 by using one or more suitable methods such as vacuum deposition, spin coating, casting, Langmuir-Blodgett (LB) deposition, and the like.

When the hole injection layer is formed by vacuum deposition, the deposition may be performed at, for example, at a deposition temperature of about 100° C. to about 500° C., a vacuum pressure of about 10$^{-8}$ torr to about 10-3 torr, and a deposition speed of about 0.01 Å/sec to about 100 Å/sec by taking into account a compound to be included in a layer to be formed, and a structure and a thermal characteristic of a layer to be formed, but embodiments of the present disclosure are not limited thereto.

When the hole injection layer is formed by spin coating, the spin coating may be performed at a coating speed of about 2,000 rpm to about 5,000 rpm and at a heat treatment temperature of about 80° C. to 200° C. for the removal of a solvent after coating by taking into account a compound to be included in a layer to be formed, and a structure and a thermal characteristic of a layer to be formed, but embodiments of the present disclosure are not limited thereto.

Conditions for forming the hole transport layer and the electron blocking layer refer to the conditions for forming the hole injection layer.

The hole transport region may include, for example, m-MTDATA, TDATA, 2-TNATA, NPB, β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, a compound represented by Formula 202, or a combination thereof:

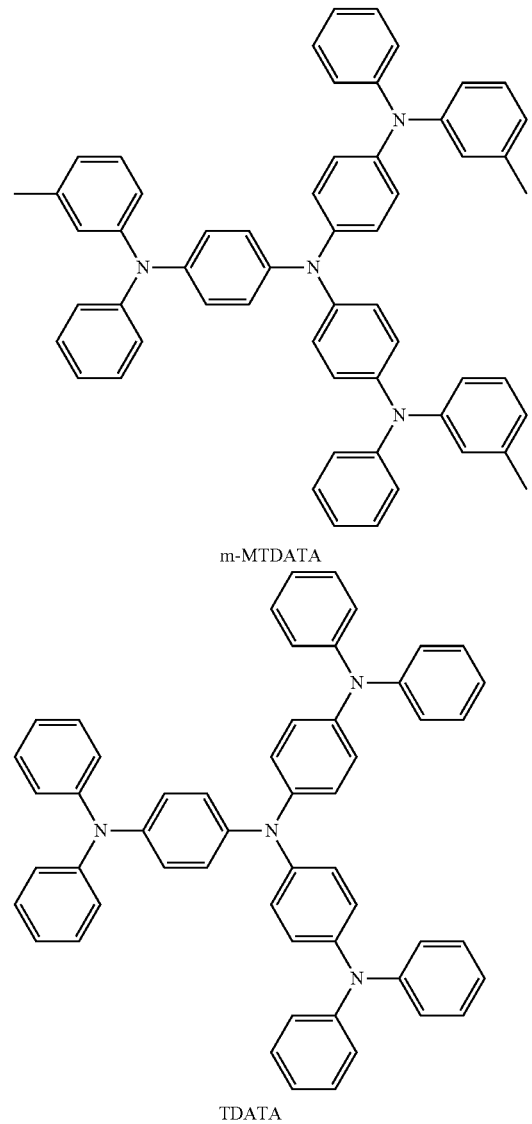

m-MTDATA

TDATA

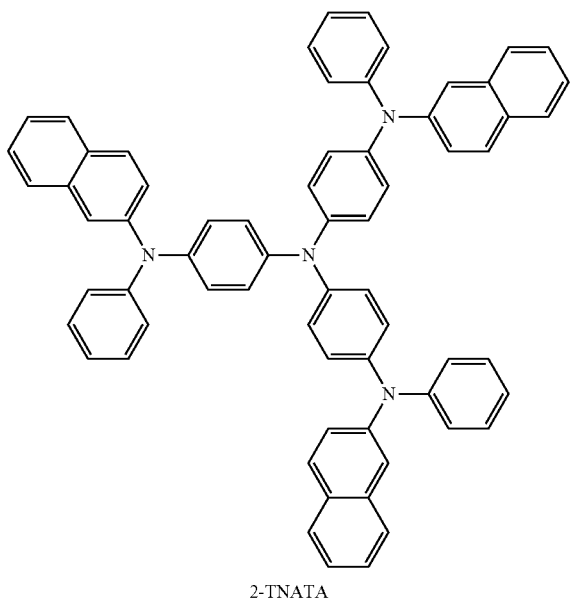
2-TNATA
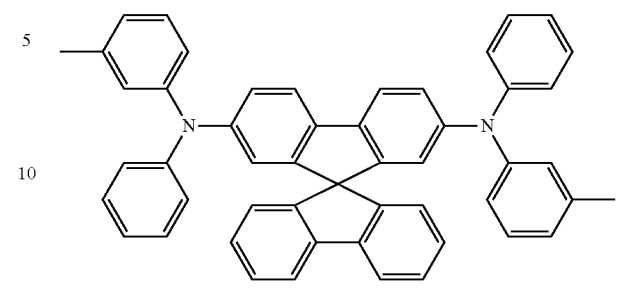
Spiro-TPD
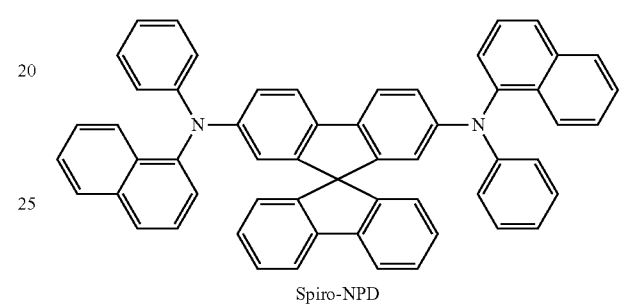
Spiro-NPD
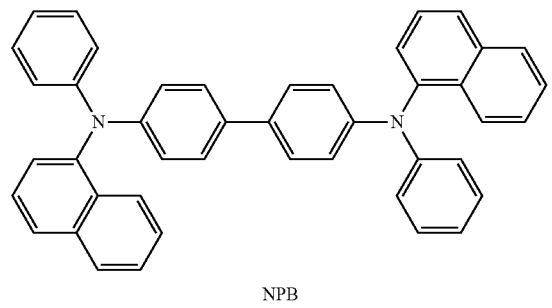
NPB
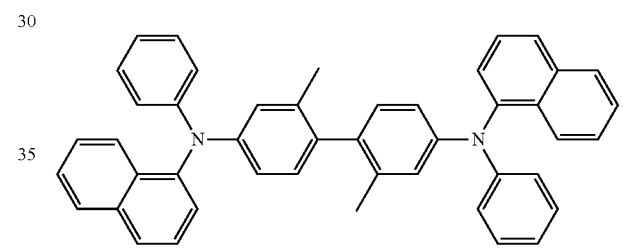
methylated NPB
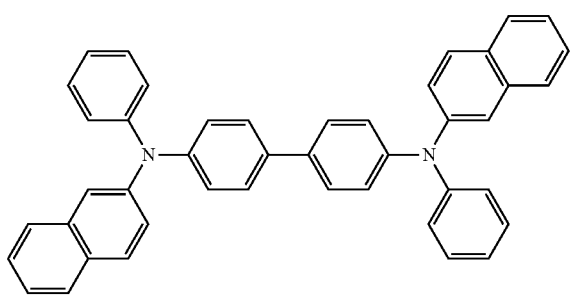
β-NPB
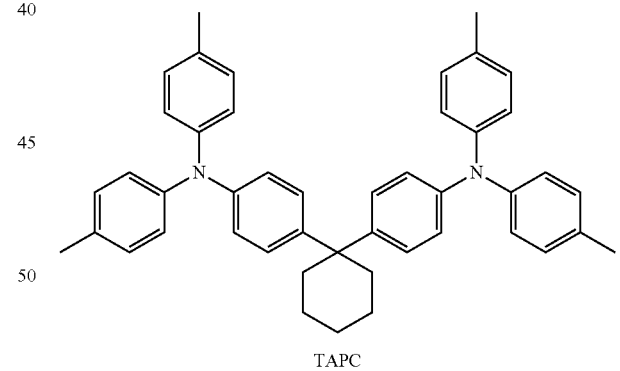
TAPC
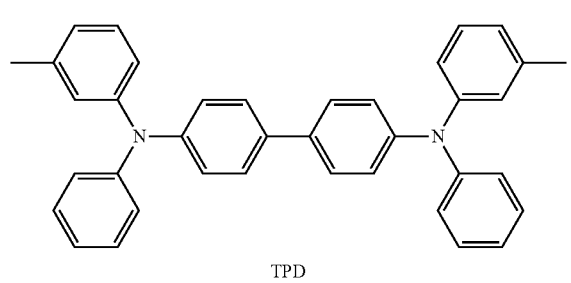
TPD
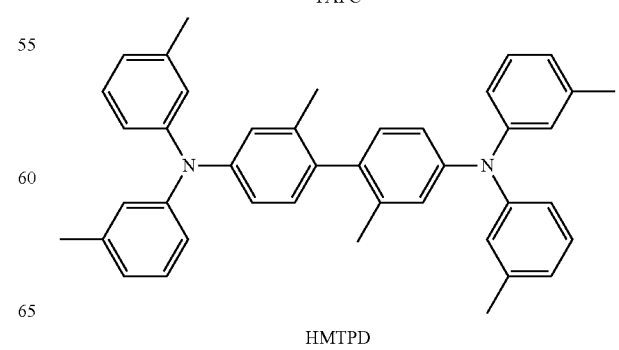
HMTPD Formula 201

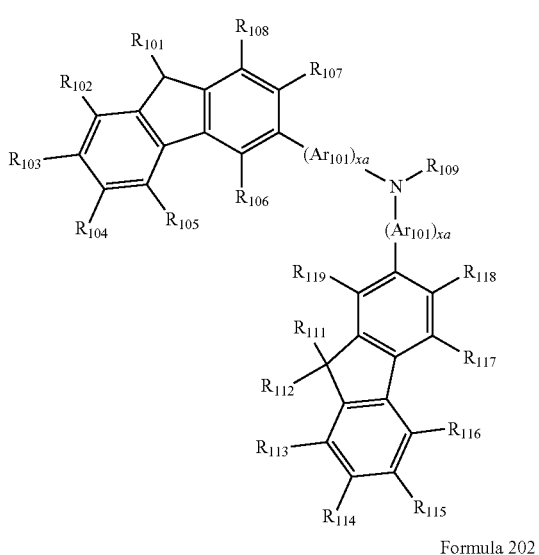

Formula 202

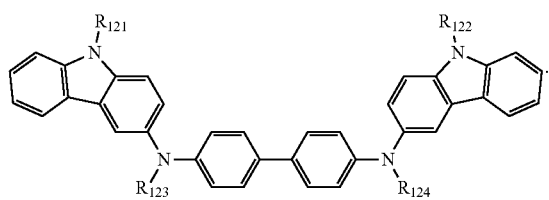

In Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group; or a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_2$-$C_{10}$ heterocycloalkyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or a combination thereof.

In Formula 201, xa and xb may each independently be an integer from 0 to 5, or may be 0, 1, or 2. For example, xa may be 1, and xb may be 0, but embodiments of the present disclosure are not limited thereto.

In Formulae 201 and 202, $R_{101}$ to $R_{108}$, $R_{111}$ to $R_{119}$, and $R_{121}$ to $R_{124}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, or the like), or a $C_1$-$C_{10}$ alkoxy group (for example, a methoxy group, an ethoxy group, a propoxy group, a butoxy group, a pentoxy group, or the like);

a $C_1$-$C_{10}$ alkyl group or a $C_1$-$C_{10}$ alkoxy group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof and a phosphoric acid group or a salt thereof, or a combination thereof;

a phenyl group, a naphthyl group, an anthracenyl group, a fluorenyl group, or a pyrenyl group; or a phenyl group, a naphthyl group, an anthracenyl group, a fluorenyl group, or a pyrenyl group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or a combination thereof, but embodiments of the present disclosure are not limited thereto.

In Formula 201, $R_{109}$ may be a phenyl group, a naphthyl group, an anthracenyl group, or a pyridinyl group; or a phenyl group, a naphthyl group, an anthracenyl group, or a pyridinyl group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or a combination thereof.

In one embodiment, the compound represented by Formula 201 may be represented by Formula 201A, but embodiments of the present disclosure are not limited thereto:

Formula 201A

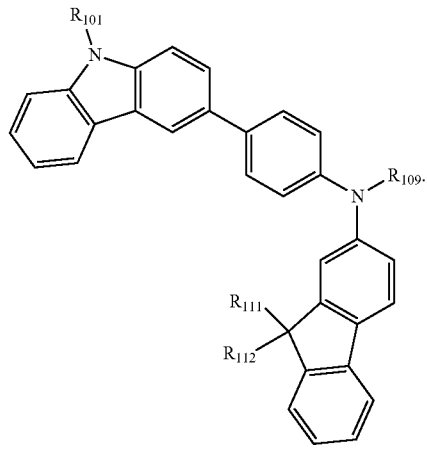

In Formula 201A, $R_{110}$, $R_{111}$, $R_{112}$, and $R_{109}$ may each independently be the same as described above.
For example, the compound represented by Formula 201 and the compound represented by Formula 202 may be Compounds HT1 to HT20, but embodiments of the present disclosure are not limited thereto:
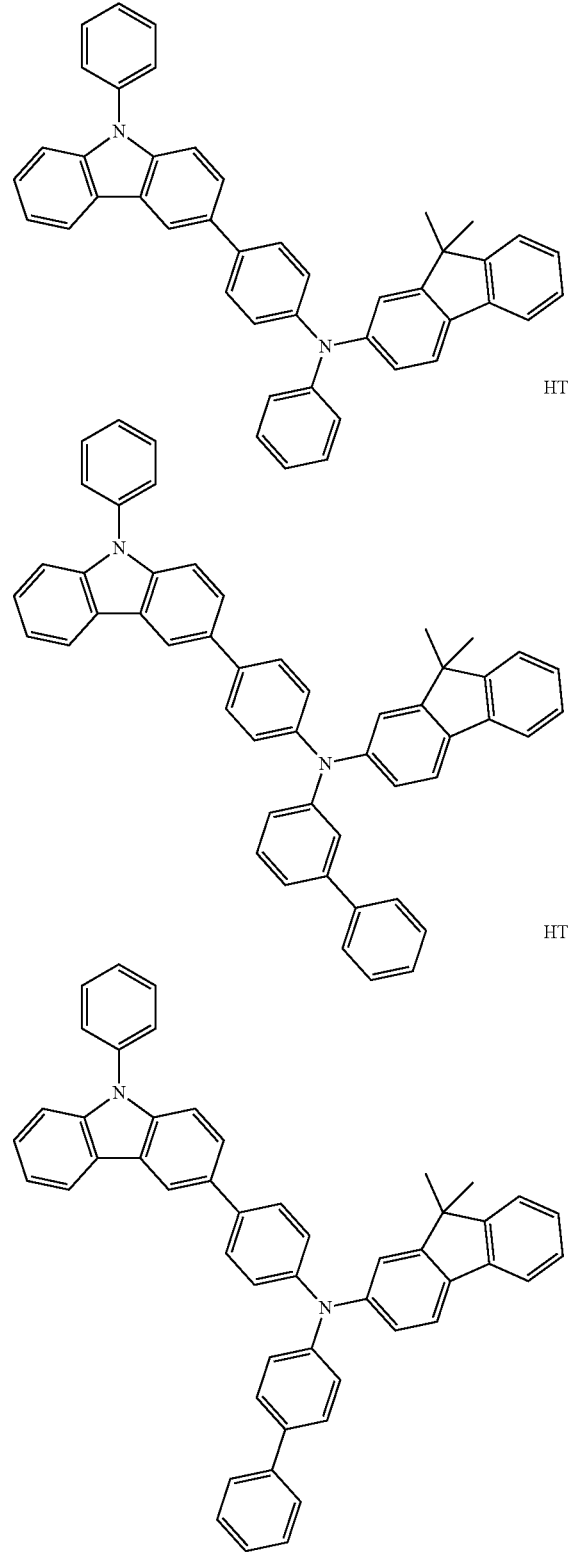
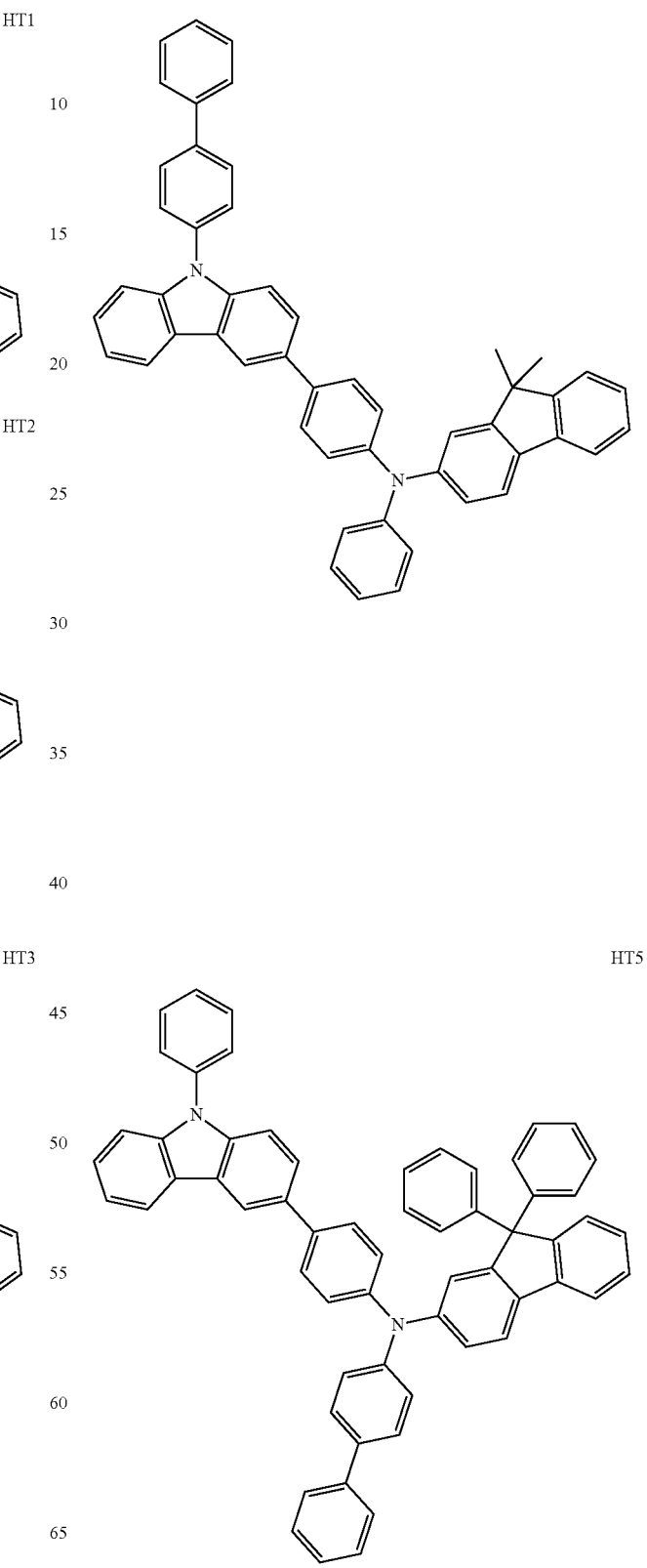

HT6
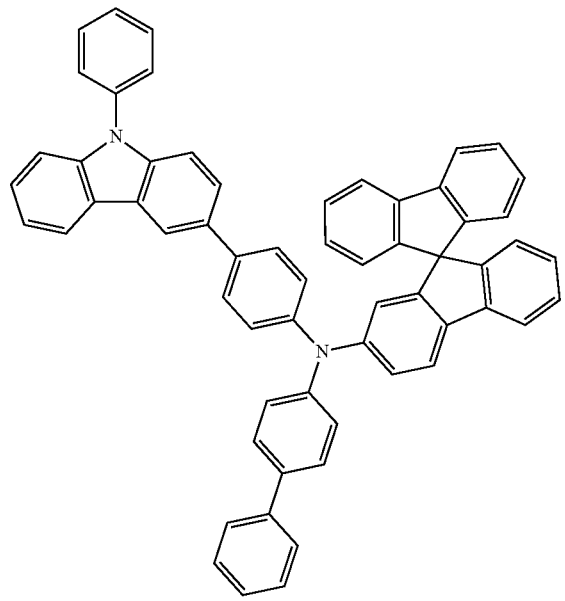
HT7
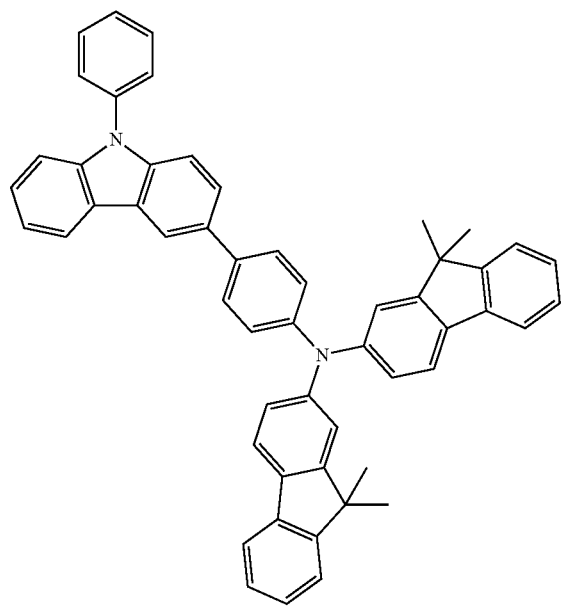
HT8
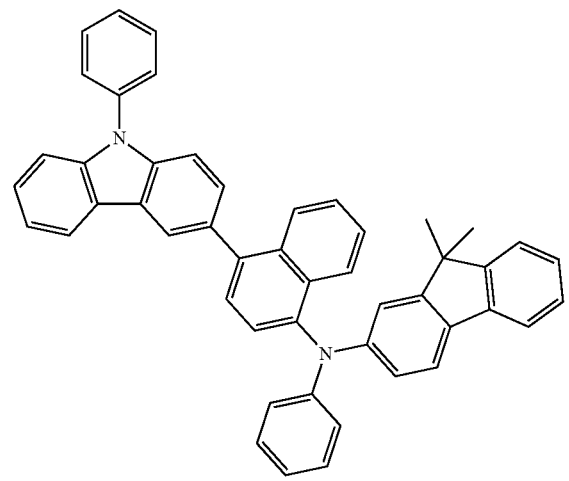
HT9
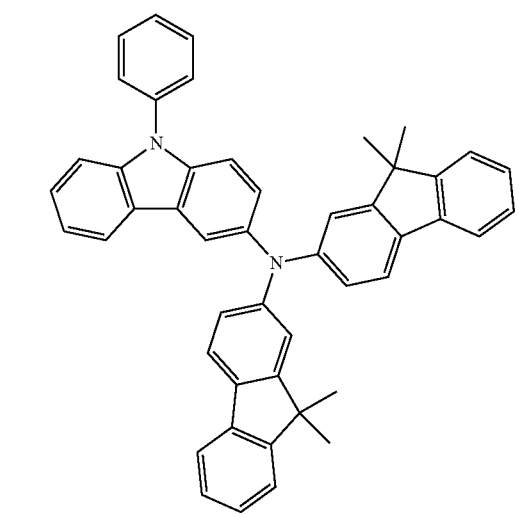
HT10
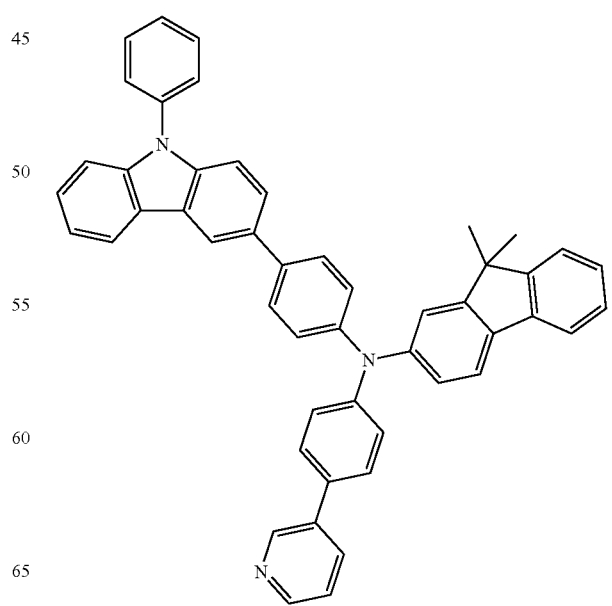

HT11
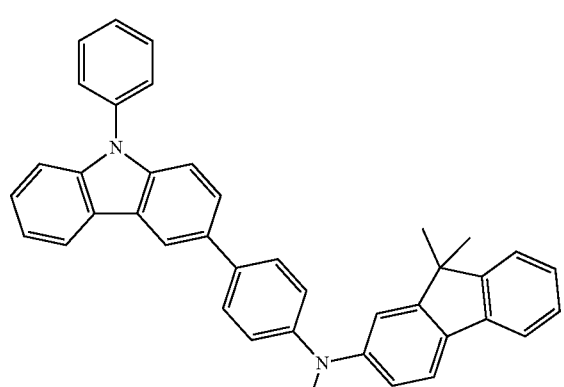
HT12
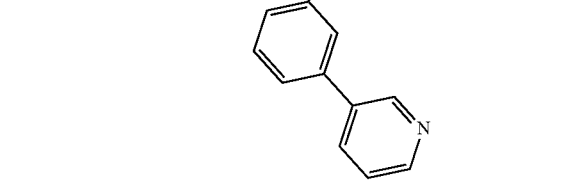
HT13
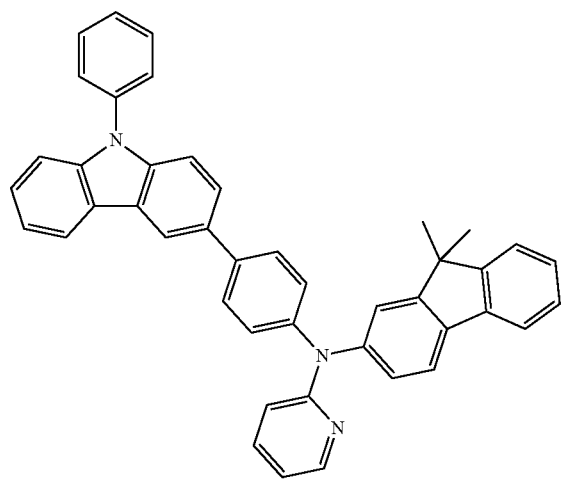
HT14
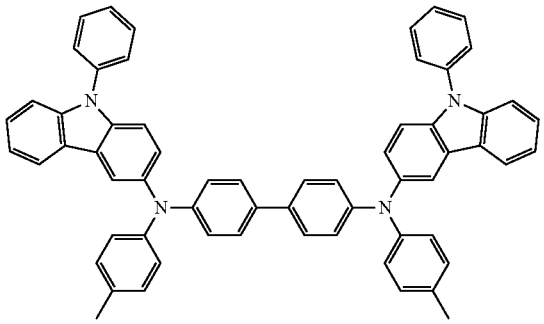
HT15
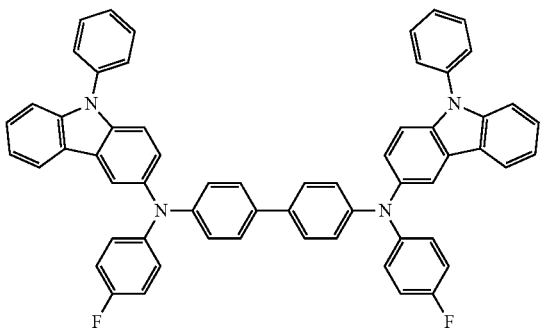
HT16
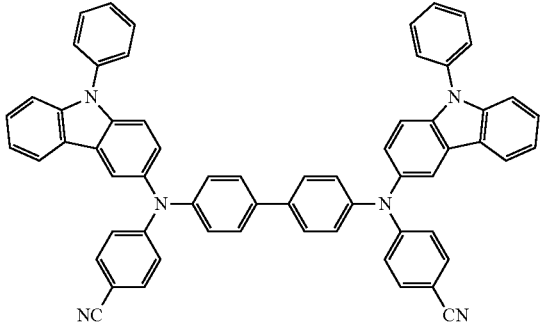
HT17
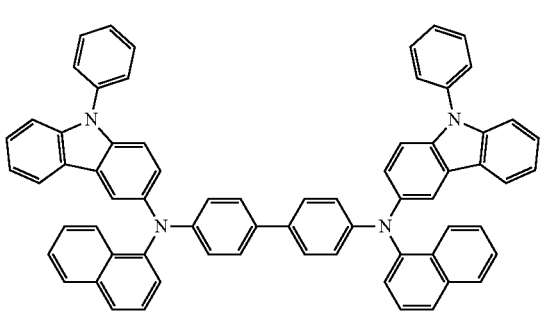

-continued

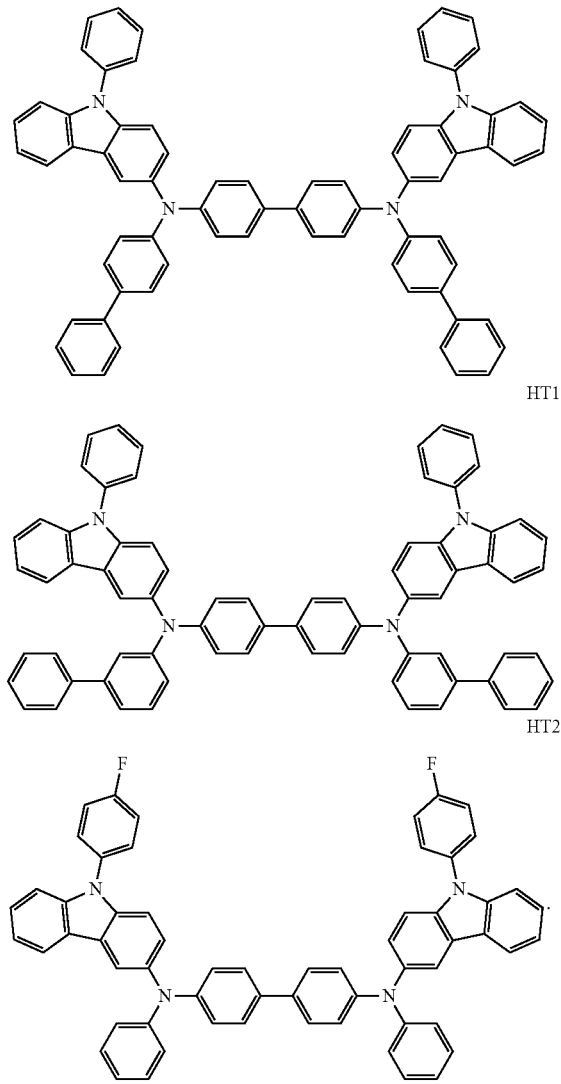

HT18

HT19

HT20

A thickness of the hole transport region may be in a range from about 100 Å to about 10,000 Å, for example, from about 100 Å to about 3,000 Å. When the hole transport region includes a hole injection layer and a hole transport layer, a thickness of the hole injection layer may be in a range from about 100 Å to about 10,000 Å, for example, from about 100 Å to about 1,000 Å, and a thickness of the hole transport layer may be in a range from about 50 Å to about 2,000 Å, for example, from about 100 Å to about 1,500 Å. When the thicknesses of the hole transport region, the hole injection layer, and the hole transport layer are within the ranges described above, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may include a quinone derivative, a metal oxide, a cyano group-containing compound, or a combination thereof, but embodiments of the present disclosure are not limited thereto. For example, non-limiting examples of the p-dopant include a quinone derivative, such as tetracyanoquinodimethane (TCNQ) and 2,3,5,6-tetrafluoro-7,7,8,8-tetracyanoquinodimethane (F4-TCNQ), a metal oxide, such as tungsten oxide or molybdenum oxide, and a cyano group-containing compound, such as Compound HT-D1, but embodiments of the present disclosure are not limited thereto:

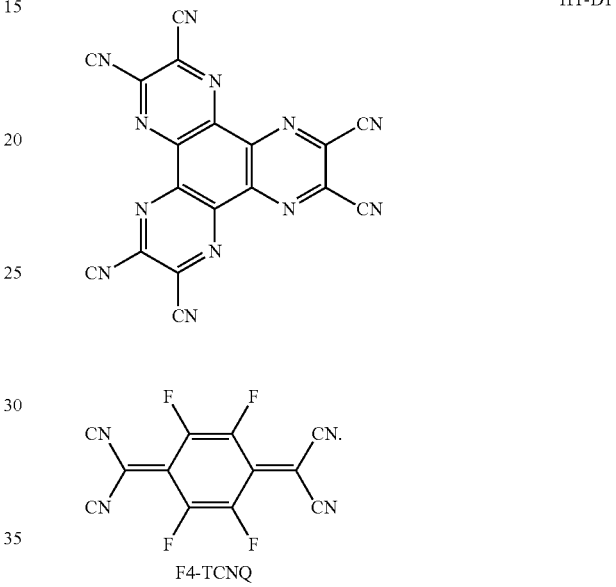

HT-D1

F4-TCNQ

The hole transport region may further include a buffer layer.

The buffer layer may increase light-emission efficiency by compensating for an optical resonance distance according to the wavelength of light emitted by the emission layer.

The emission layer may be formed on the hole transport region using one or more suitable methods such as vacuum deposition, spin coating, casting, LB deposition, and the like. When the emission layer is formed by vacuum deposition and spin coating, the deposition and coating conditions vary depending on a compound used, but may be generally selected within substantially the same range of conditions for the formation of the hole injection layer.

In one embodiment, when the hole transport region includes an electron blocking layer, a material for forming the electron blocking layer may be a material for forming the hole transport region or a host material described below, but embodiments of the present disclosure are not limited thereto. For example, when the hole transport region includes the electron blocking layer, the material for forming the electron blocking layer may be mCP described below.

The emission layer may include a host and a dopant. The dopant may include the organometallic compound represented by Formula 1.

The host may include TPBi, TBADN, AND (also referred to as "DNA"), CBP, CDBP, TCP, mCP, Compound H50, Compound H51, or a combination thereof:

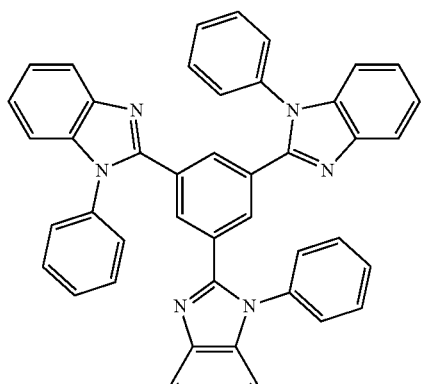
TPBI
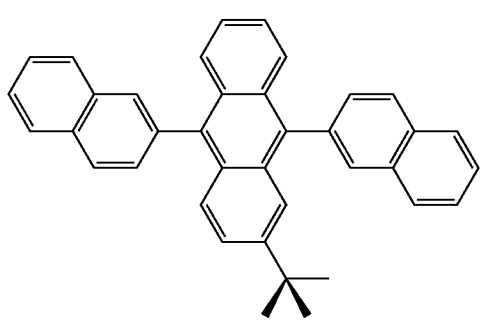
TBADN
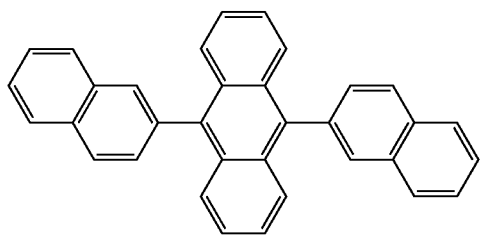
ADN
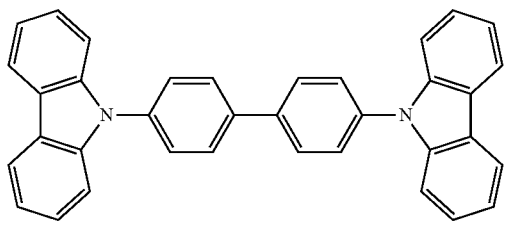
CBP
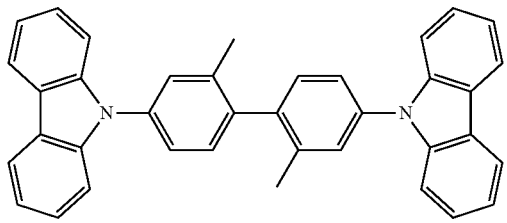
CDBP
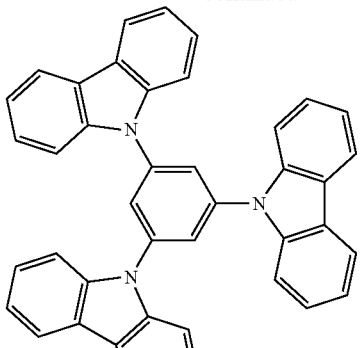
TCP
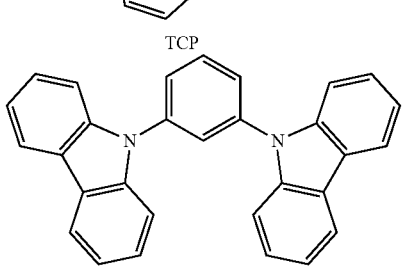
mCP
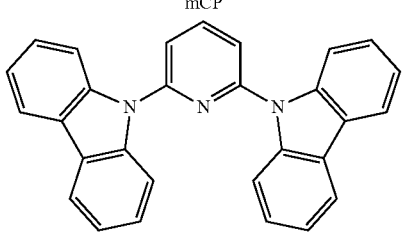
H50
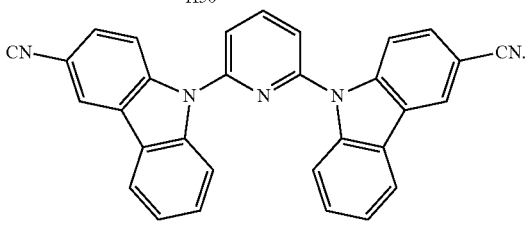
H51
In one or more embodiments, the host may further include a compound represented by Formula 301:
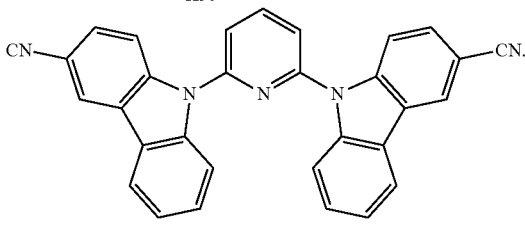
Formula 301
In Formula 301, $Ar_{111}$ and $Ar_{112}$ may each independently be
a phenylene group, a naphthylene group, a phenanthrenylene group, or a pyrenylene group; or a phenylene group, a naphthylene group, a phenanthrenylene group, or a pyrenylene group, each substituted with a phenyl group, a naphthyl group, an anthracenyl group, or a combination thereof.

In Formula 301, $Ar_{113}$ to $Ar_{116}$ may each independently be
a $C_1$-$C_{10}$ alkyl group, a phenyl group, a naphthyl group, a phenanthrenyl group, or a pyrenyl group; and
a phenyl group, a naphthyl group, a phenanthrenyl group, or a pyrenyl group, each substituted with a phenyl group, a naphthyl group, an anthracenyl group, or a combination thereof.

In Formula 301, g, h, i, and j may each independently be an integer from 0 to 4, and for example, may be 0, 1, or 2.

In Formula 301, $Ar_{113}$ to $Ar_{116}$ may each independently be
a $C_1$-$C_{10}$ alkyl group substituted with a phenyl group, a naphthyl group, an anthracenyl group, or a combination thereof;
a phenyl group, a naphthyl group, an anthracenyl group, a pyrenyl group, a phenanthrenyl group, or a fluorenyl group;
a phenyl group, a naphthyl group, an anthracenyl group, a pyrenyl group, a phenanthrenyl group, or a fluorenyl group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, a fluorenyl group, or a combination thereof; and

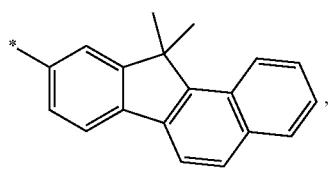 [SMILES: *c1ccc2c(c1)C(C)(C)c1c-2ccc2ccccc12]

but embodiments of the present disclosure are not limited thereto.

In one or more embodiments, the host may include a compound represented by Formula 302:

Formula 302

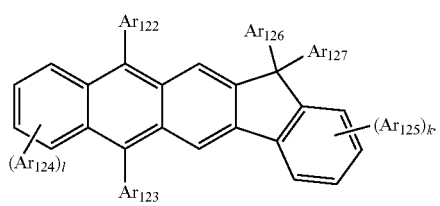

In Formula 302, $Ar_{122}$ to $Ar_{125}$ may each independently be the same as defined in connection with $Ar_{113}$ in Formula 301.

In Formula 302, $Ar_{26}$ and $Ar_{127}$ may each independently be a $C_1$-$C_{10}$ alkyl group (for example, a methyl group, an ethyl group, or a propyl group).

In Formula 302, k and l may each independently be an integer from 0 to 4. For example, k and l may be 0, 1, or 2.

When the organic light-emitting device 10 is a full-color organic light-emitting device, the emission layer may be patterned into a red emission layer, a green emission layer, and/or a blue emission layer. In one embodiment, the emission layer may have a stacked structure of a red emission layer, a green emission layer, and/or a blue emission layer, so as to emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range from about 100 Å to about 1,000 Å, for example, from about 200 Å to about 600 Å. When the thickness of the emission layer is within this range, excellent light-emission characteristics may be obtained without a substantial increase in driving voltage.

Next, the electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but embodiments of the present disclosure are not limited thereto. The electron transport layer may have a single-layered structure or a multi-layered structure having two or more different materials.

Conditions for forming a hole blocking layer, an electron transport layer, and an electron injection layer in the electron transport region are similar to the conditions for forming the hole injection layer.

When the electron transport region includes a hole blocking layer, the hole blocking layer may include, for example, BCP, Bphen, BAlq, or a combination thereof, but embodiments of the present disclosure are not limited thereto:

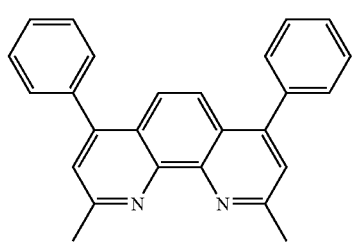

BCP

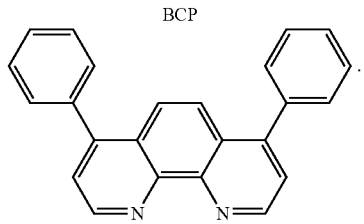

Bphen

A thickness of the hole blocking layer may be in a range from about 20 Å to about 1,000 Å, for example, from about 30 Å to about 300 Å. When the thicknesses of the hole blocking layer is within these ranges, excellent hole blocking characteristics may be obtained without a substantial increase in driving voltage.

The electron transport layer may further include BCP, Bphen, Alq₃, BAlq, TAZ, NTAZ, or a combination thereof:
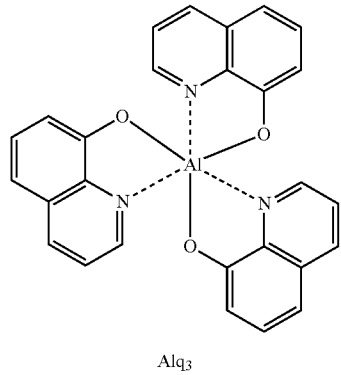
Alq₃
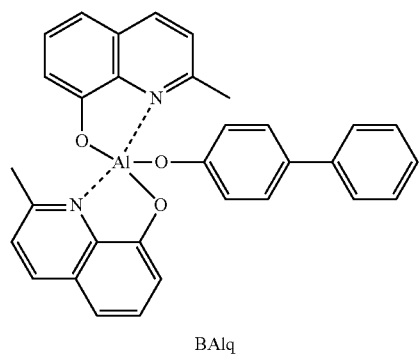
BAlq
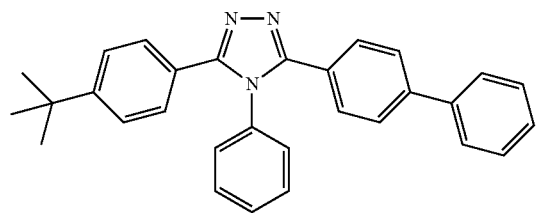
TAZ
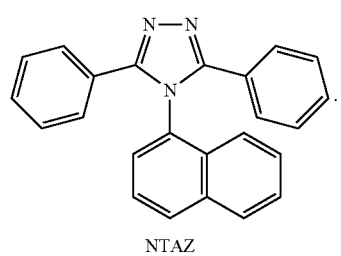
NTAZ
In one or more embodiments, the electron transport layer may include Compounds ET1 to ET25, but embodiments of the present disclosure are not limited thereto:
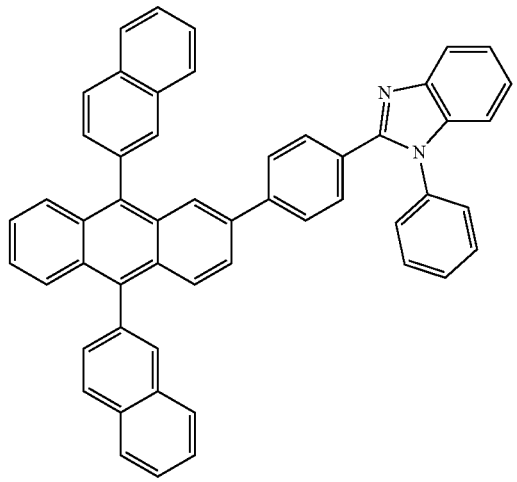
ET1
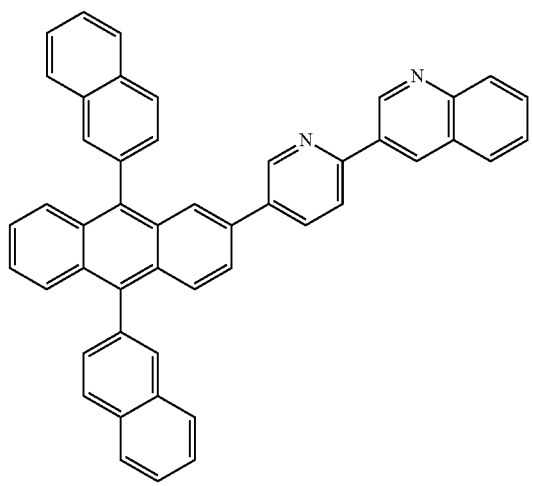
ET2
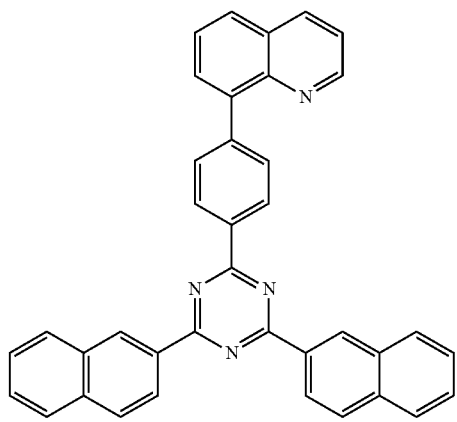
ET3

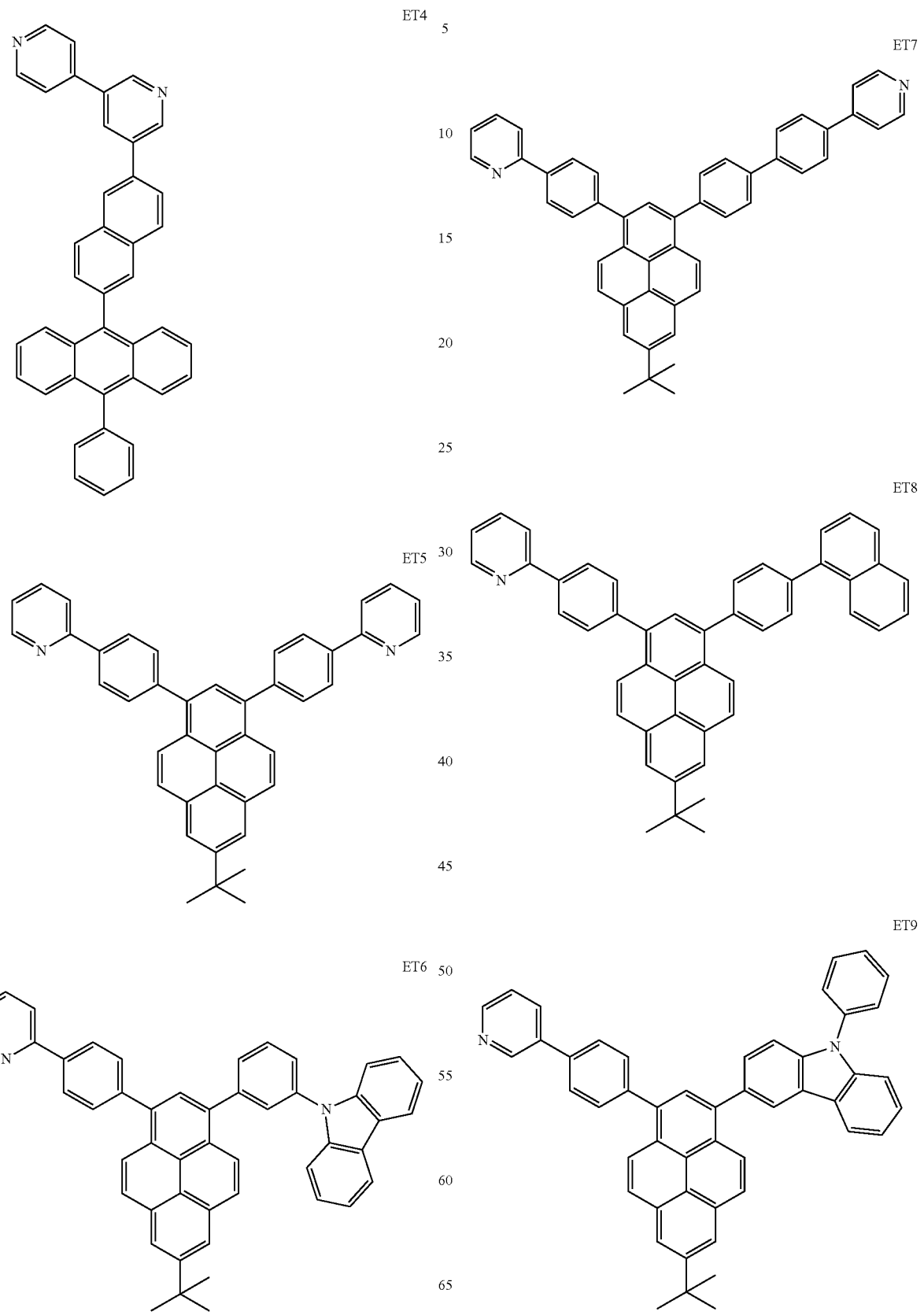

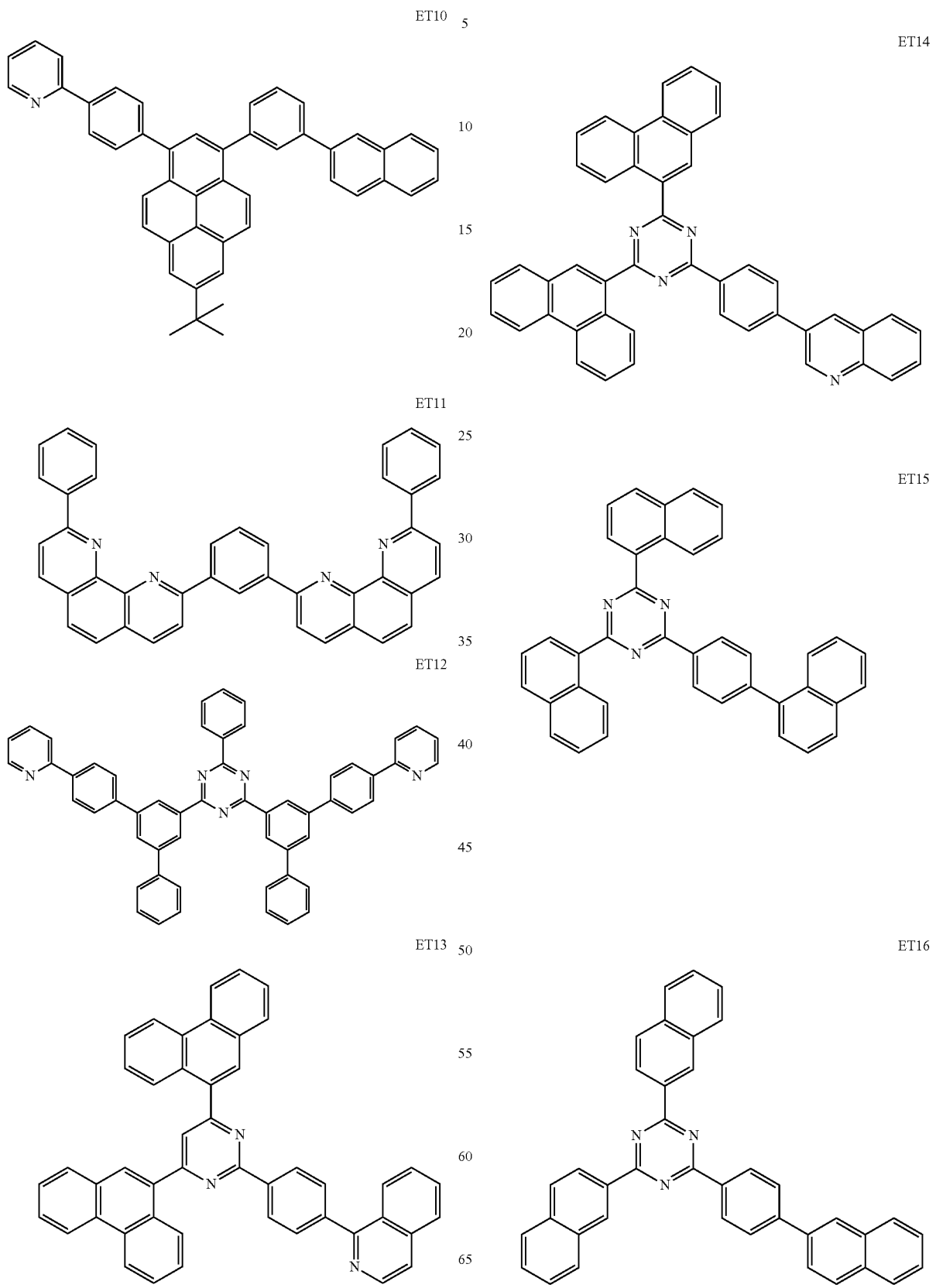

-continued
ET17
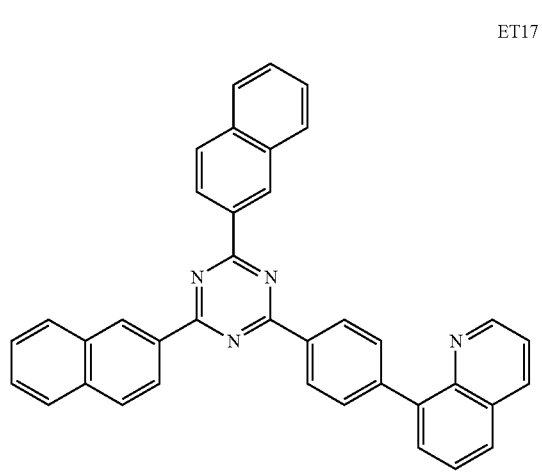
ET18
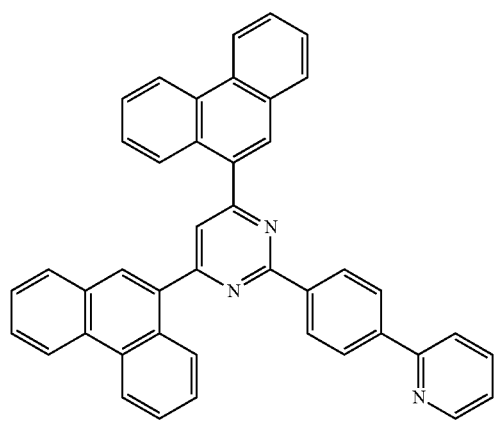
ET19
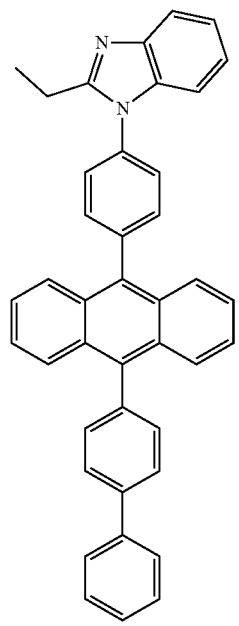
-continued
ET20
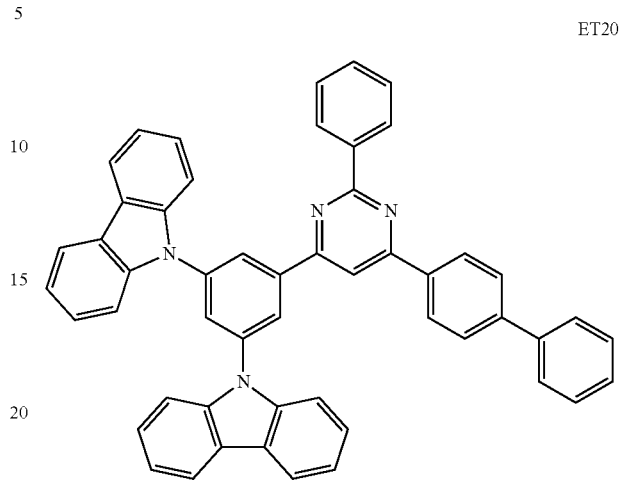
ET21
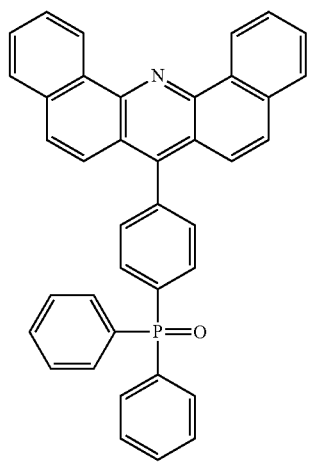
ET22
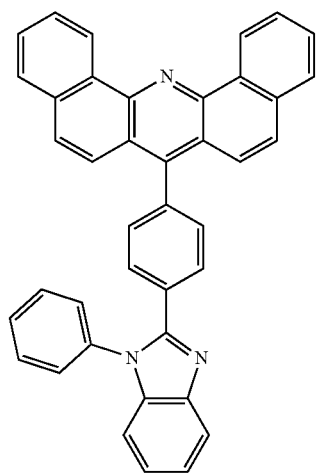

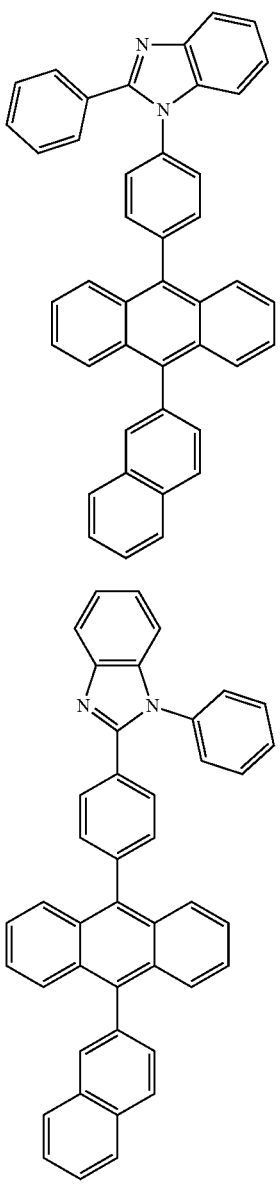

ET23

ET24

ET25

A thickness of the electron transport layer may be in a range from about 100 Å to about 1,000 Å, for example, from about 150 Å to about 500 Å. When the thickness of the electron transport layer is within the range described above, satisfactory electron transport characteristics may be obtained without a substantial increase in driving voltage.

The electron transport region may further include, in addition to these materials, a metal-containing material.

The metal-containing material may include a Li complex. The Li complex may include, for example, Compound ET-D1 (lithium quinolate (LiQ)) or Compound ET-D2:

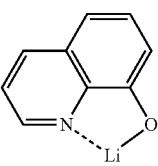

ET-D1

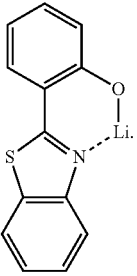

ET-D2

In addition, the electron transport region may include an electron injection layer that facilitates electron injection from the second electrode 19.

The electron injection layer may include LiF, NaCl, CsF, $Li_2O$, BaO, or a combination thereof.

A thickness of the electron injection layer may be in a range from about 1 Å to about 100 Å, for example, from about 3 Å to about 90 Å. When the thickness of the electron injection layer is within the ranges described above, satisfactory electron injecting characteristics may be obtained without a substantial increase in driving voltage.

The second electrode 19 may be disposed on the organic layer 15. The second electrode 19 may be a cathode, and a material for forming the second electrode 19 may be metal, an alloy, an electrically conductive compound, or a combination thereof, which have a relatively low work function. The material for forming the second electrode 19 may be lithium (Li), magnesium (Mg), aluminum (Al), aluminum-lithium (Al—Li), calcium (Ca), magnesium-indium (Mg—In), or magnesium-silver (Mg—Ag). In one or more embodiments, to manufacture a top light-emitting device, ITO or IZO may be used to form a transmissive second electrode.

Hereinbefore, the organic light-emitting device 10 according to an embodiment has been described in connection with FIG. 1, but embodiments of the present disclosure are not limited thereto.

Another aspect of the present disclosure provides a diagnostic composition including an organometallic compound represented by Formula 1.

Since the organometallic compound represented by Formula 1 may provide a high luminescence efficiency, a diagnostic composition including the organometallic compound may also have high diagnostic efficiency.

The diagnostic composition may be used in various diagnostic kits, diagnostic reagents, biosensors, biomarkers, and the like.

The term "$C_1$-$C_{60}$ alkyl group" as used herein refers to a linear or branched aliphatic saturated hydrocarbon monovalent group having 1 to 60 carbon atoms, and examples thereof include a methyl group, an ethyl group, a propyl group, an isobutyl group, a sec-butyl group, a tert-butyl group, pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_2$-$C_{60}$ alkenyl group" as used herein refers to a hydrocarbon group having a carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having a carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_2$-$C_{10}$ heterocycloalkyl group" as used herein refers to a monovalent monocyclic group having N, O, Si, P, Se, S, or a combination thereof as a ring-forming atom and 1 to 10 carbon atoms, and examples thereof include a tetrahydrofuranyl group and a tetrahydrothiophenyl group. The term "$C_2$-$C_{10}$ heterocycloalkylene group" as used herein refers to a divalent group having the same structure as the $C_2$-$C_{10}$ heterocycloalkyl group.

The term "$C_3$-$C_{10}$ cycloalkenyl group" as used herein refers to a monovalent monocyclic group that has 3 to 10 carbon atoms and a carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent monocyclic group that has N, O, P, Si, Se, S, or a combination thereof as a ring-forming atom, 1 to 10 carbon atoms, and an endocyclic carbon-carbon double bond. Non-limiting examples of the $C_2$-$C_{10}$ heterocycloalkenyl group include a 2,3-dihydrofuranyl group and a 2,3-dihydrothiophenyl group. The term "$C_2$-$C_{10}$ heterocycloalkenylene group" as used herein refers to a divalent group having the same structure as the $C_2$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms.

Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other. The term "$C_7$-$C_{60}$ arylalkyl group" as used herein refers to a $C_6$-$C_{60}$ aryl group attached to a compound by an alkyl linker. An example of a $C_7$ arylalkyl group is a benzyl (i.e., —$CH_2$-phenyl).

The term "$C_1$-$C_{60}$ heteroaryl group" as used herein refers to a monovalent group having a carbocyclic aromatic system that has N, O, P, Si, Se, S, or a combination thereof, as a ring-forming atom, in addition to 1 to 60 carbon atoms. The term "$C_1$-$C_{60}$ heteroarylene group" as used herein refers to a divalent group having a carbocyclic aromatic system that has N, O, P, Se, S, or a combination thereof as a ring-forming atom, in addition to 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be condensed with each other. The term "$C_2$-$C_{60}$ heteroarylalkyl group" as used herein refers to a $C_1$-$C_{60}$ heteroaryl group connected to the compound via a $C_1$-$C_{60}$ alkyl group.

The term "$C_6$-$C_{60}$ aryloxy group" as used herein refers to —$OA_{102}$ (wherein $A_{102}$ is the $C_6$-$C_{60}$ aryl group), and the term "$C_6$-$C_{60}$ arylthio group" as used herein refers to —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed with each other, only carbon atoms as ring-forming atoms, and no aromaticity in its entire molecular structure. A detailed example of the monovalent non-aromatic condensed polycyclic group is a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, N, O, P, Si, Se, S, or a combination thereof, as a ring-forming atom, and no aromaticity in its entire molecular structure. An example of the monovalent non-aromatic condensed heteropolycyclic group is a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having 5 to 30 carbon atoms in which the ring-forming atoms are carbon atoms only. The $C_5$-$C_{30}$ carbocyclic group may be a monocyclic group or a polycyclic group.

The term "$C_2$-$C_{30}$ heterocyclic group" as used herein refers to a saturated or unsaturated cyclic group having N, O, P, Si, Se, S, or a combination thereof other than 1 to 30 carbon atoms, as ring-forming atoms. The $C_2$-$C_{30}$ heterocyclic group may be a monocyclic group or a polycyclic group.

A substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_{60}$ arylalkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ heteroarylalkyl group, the substituted monovalent non-aromatic condensed polycyclic group, and the substituted monovalent non-aromatic condensed heteropolycyclic group may be deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ arylalkyl, a $C_6$-$C_{60}$ aryloxy group, a $C_6$-$C_{60}$ arylthio group, a $C_1$-$C_{60}$ heteroaryl group, a $C_2$-$C_{60}$ heteroarylalkyl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), —P(=O)($Q_{18}$)($Q_{19}$), or a combination thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ arylalkyl, a $C_6$-$C_{60}$ aryloxy group, a $C_6$-$C_{60}$ arylthio group, a $C_1$-$C_{60}$ heteroaryl group, a $C_2$-$C_{60}$ heteroarylalkyl group, a monovalent non-aromatic condensed polycyclic group, or a monovalent non-aromatic condensed heteropolycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ arylalkyl, a $C_6$-$C_{60}$ aryloxy group, a $C_6$-$C_{60}$ arylthio group, a $C_1$-$C_{60}$ heteroaryl group, a $C_2$-$C_{60}$ heteroarylalkyl group, a monovalent non-aromatic condensed polycyclic group, or a monovalent non-aromatic condensed heteropolycyclic group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ arylalkyl group, a $C_6$-$C_{60}$ aryloxy group, a $C_6$-$C_{60}$ arylthio group, a $C_1$-$C_{60}$ heteroaryl group, a $C_2$-$C_{60}$ heteroarylalkyl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), —P(=O)($Q_{28}$)($Q_{29}$), or a combination thereof; and —N($Q_{31}$)($Q_{32}$), —Si($Q_{33}$)($Q_{34}$)($Q_{35}$), —B($Q_{36}$)($Q_{37}$), or —P(=O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ may each independently be a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_2$-$C_{60}$ heteroarylalkyl group, a monovalent non-aromatic condensed polycyclic group, or a monovalent non-aromatic condensed heteropolycyclic group, each substituted with $C_1$-$C_{60}$ alkyl group, a $C_2$-$C_{60}$ alkenyl group, a $C_2$-$C_{60}$ alkynyl group, a $C_1$-$C_{60}$alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, deuterium, a $C_1$-$C_{60}$ alkyl group, or a $C_6$-$C_{60}$ aryl group that are each substituted with hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, deuterium, a $C_1$-$C_{60}$ alkyl group, a $C_6$-$C_{60}$ aryl group, or a combination thereof, a $C_6$-$C_{60}$ aryl group, or a combination thereof.

Hereinafter, a compound according to embodiments and an organic light-emitting device according to embodiments will be described in detail with reference to Synthesis Examples and Examples, but are not limited thereto. The wording "B was used instead of A" used in describing Synthesis Examples refers to that an identical molar equivalent of 'B' was used in place of 'A'.

EXAMPLES

Synthesis Example 1: Synthesis of Compound 1

(1) Synthesis of Intermediate P-4

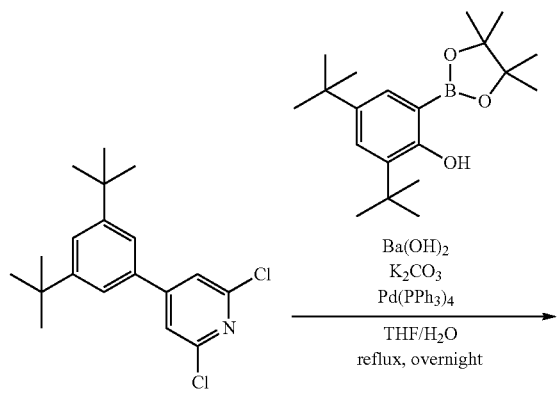

-continued

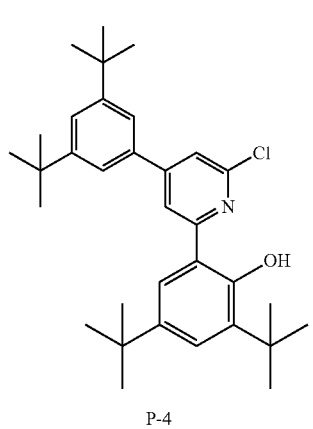

P-4

2,6-dichloro-4-(3,5-di-tert-butylphenyl)pyridine (6.23 g, 18.53 mmol), 2,4-di-tert-butyl-6-(4,4,5,5-tetramethyl-1,3,2-dioxaborolan-2-yl)phenol (6.16 g, 18.53 mmol), Pd(PPh)$_3$ (0.89 g, 0.93 mmol), and K$_2$CO$_3$ (15.36 g, 55.59 mmol) were mixed with 70 ml of tetrahydrofuran (THF) and 20 ml of distilled water, and the mixed solution was stirred under reflux for 6 hours. After the reaction temperature was cooled down to room temperature, an extraction process was performed thereon by using ethyl acetate (EA) to extract an organic layer. Anhydrous magnesium sulfate (MgSO$_4$) was added thereto to remove the moisture therefrom, and the resulting product was filtered. The filtrate was concentrated and then purified by column chromatography under the conditions of EA:Hexane=1:10, thereby obtaining 6.57 g (yield: 70%) of Intermediate P-4. LC-MS m/z=507.17 (M+H)

(2) Synthesis of Intermediate P-2

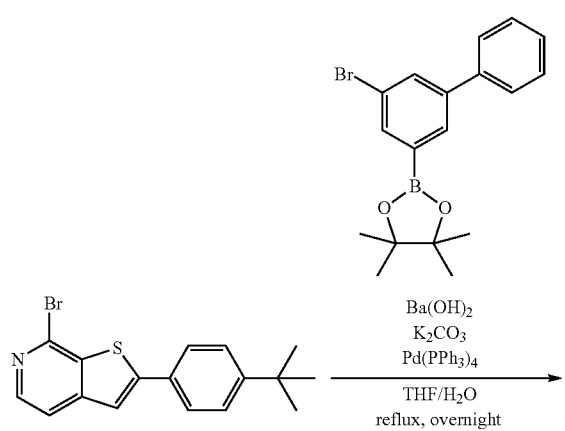

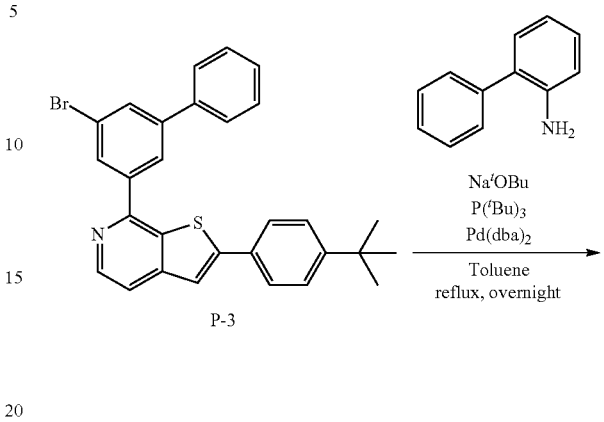

P-3

P-2

7-bromo-2-(4-(tert-butyl)phenyl)thieno[2,3-c]pyridine (6.42 g, 18.53 mmol), 2-(5-bromo-[1,1'-biphenyl]-3-yl)-4,4,5,5-tetramethyl-1,3,2-dioxaborolane (6.65 g, 18.53 mmol), Pd(PPh)$_3$ (0.89 g, 0.93 mmol), and K$_2$CO$_3$ (15.36 g, 55.59 mmol) were mixed with 70 ml of THF and 20 ml of distilled water, and the mixed solution was stirred under reflux for 6 hours. After the reaction temperature was cooled down to room temperature, an extraction process was performed thereon by using EA to extract an organic layer. MgSO$_4$ was added thereto to remove the moisture therefrom, and the resulting product was filtered. The filtrate was concentrated and then purified by column chromatography under the conditions of EA:Hexane=1:5, thereby obtaining 6.00 g (yield: 65%) of Intermediate P-3. LC-MS m/z=499.48 (M+H)

Intermediate P-3 (6.00 g, 12.04 mmol), [1,1'-biphenyl]-2-amine (2.45 g, 14.45 mmol), Pd(dba)$_2$ (0.69 g, 1.20 mmol), P(tert-Bu)$_3$ (0.49 g, 2.41 mmol), and Na(O-tert-Bu) (2.89 g, 30.10 mmol) were dissolved in 60 ml of toluene, and the mixed solution was stirred under reflux for 6 hours. After the reaction temperature was cooled down to room temperature, an extraction process was performed thereon by using EA to extract an organic layer. MgSO$_4$ was added thereto to remove the moisture therefrom, and the resulting product was filtered. The filtrate was concentrated and then purified by column chromatography under the conditions of EA:Hexane=1:5, thereby obtaining 4.95 g (yield: 70%) of Intermediate P-2. LC-MS m/z=587.80 (M+H)

(3) Synthesis of Compound 1

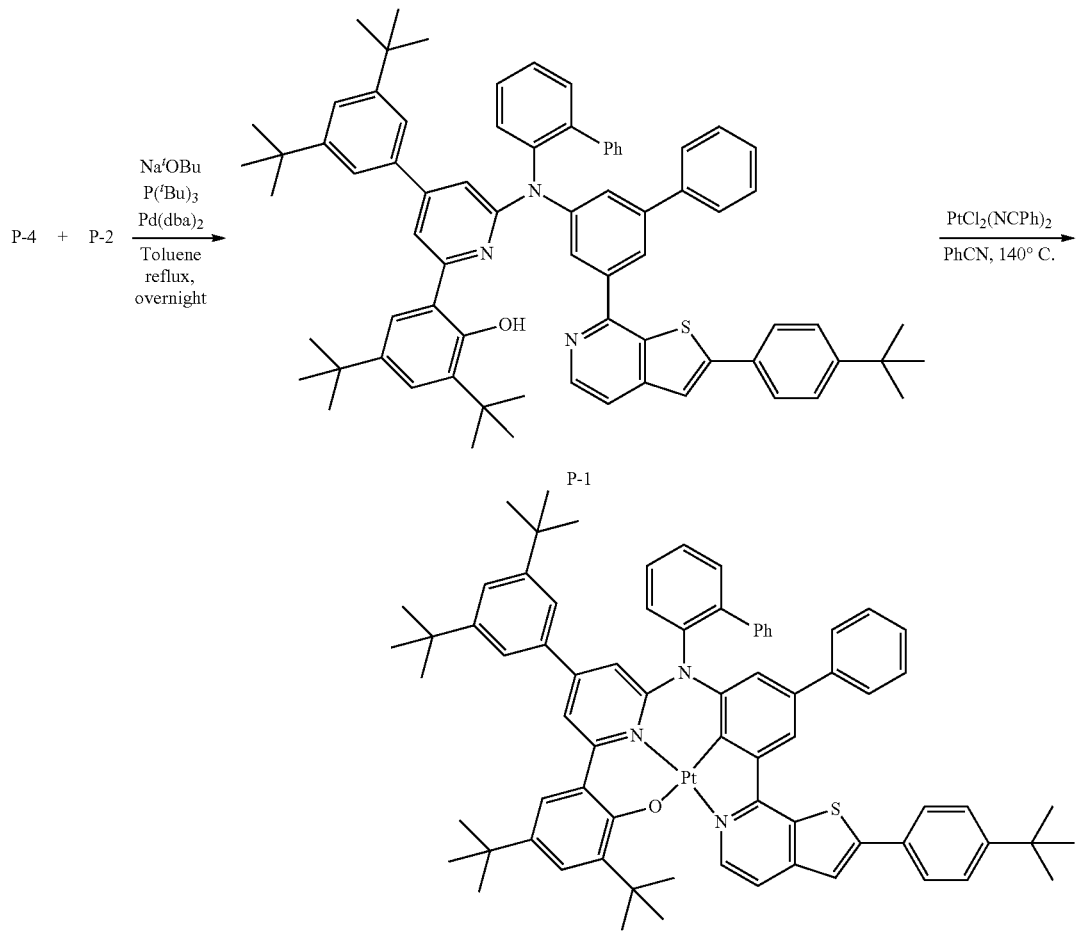

Intermediate P-4 (4.27 g, 8.43 mmol), Intermediate P-2 (4.95 g, 8.43 mmol), Pd(dba)$_2$ (0.48 g, 0.84 mmol), P(tert-Bu)$_3$ (0.34 g, 1.69 mmol), and Na(O-tert-Bu) (2.02 g, 21.77 mmol) were dissolved in 40 ml of toluene, and the mixed solution was stirred under reflux for 6 hours. After the reaction temperature was cooled down to room temperature, an extraction process was performed thereon by using EA to extract an organic layer. MgSO$_4$ was added thereto to remove the moisture therefrom, and the resulting product was filtered. The filtrate was concentrated and then purified by column chromatography under the conditions of EA:Hexane=1:5, thereby obtaining 7.12 g (yield: 80%) of Intermediate P-1. LC-MS m/z=1056.52 (M+H)

Intermediate P-1 (3 g, 2.84 mmol) and PtCl$_2$(NCPh)$_2$ (1.34 g, 2.84 mmol) were mixed with 30 ml of benzonitrile, and the mixed solution was stirred under reflux at a temperature of 140° C. for 6 hours. After the reaction temperature was cooled down, benzonitrile was moved by distillation, and an extraction process was performed thereon by using methylene chloride (MC) to extract an organic layer. MgSO$_4$ was added thereto to remove the moisture therefrom, and the resulting product was filtered. The filtrate was concentrated and then purified by column chromatography under the conditions of MC:Hexane=2:8, thereby obtaining 1.77 g (yield: 50%) of Compound 1. LC-MS m/z=1248.58 (M+H)

Evaluation Example 1: Measurement of HOMO Energy Level

On an ITO substrate, each of the Compounds shown in Table 2 below were vacuum-(co)deposited at a weight ratio of 2 wt % at a vacuum pressure of $10^{-7}$ torr with respect to a wide band gap host to prepare a film having a thickness of 40 nm. An atmospheric photoelectric spectrometer AC3 manufactured by Riken Keiki Company was used to measure photoelectron emission of the films. During the measurement, the intensity of UV light source of AC3 was fixed at 10 nW, and the measurement was made at an interval of 0.05 eV between −4.5 eV and −7.0 eV. Here, the time taken for measuring each point was 10 seconds. A HOMO energy level was obtained as follows. The photoelectron efficiency spectrum was obtained first by applying the cube root to the intensity value of the measured photoelectron emission, and then, the tangent to the first slope was obtained to a contact value between the baseline and the tangent, and the results are shown in Table 5 below. Here, the baseline was calibrated by utilizing the light source function compensation function embedded in the AC3 device.

Evaluation Example 2: Measurement of Luminescence Energy and Luminescence Quantum Efficiency at Maximum Emission Wavelength On a quartz substrate, each of the Compounds shown in Table 2 below were vacuum-(co)deposited at a weight ratio of 2 wt % at a vacuum pressure of $10^{-7}$ torr with respect to a host used in Examples below to prepare a film having a thickness of 40 nm. To obtain emission spectrum of the films, a Quantaurus-QY Absolute PL quantum yield spectrometer (Xenon light source) manufactured of Hamamatsu Company equipped with a monochromator, a photonic multichannel analyzer, an integrating sphere, and PLQY measurement software (manufactured by Hamamatsu Photonics, Ltd., Shizuoka, Japan) were used. During the measurement, excitation wavelengths were measured by scanning at an interval of 10 nm between 320 nm and 380 nm, and the spectrum measured at an excitation wavelength of 340 nm was recorded. Afterwards, the luminescence energy at the maximum emission wavelength of a dopant included in each of the films was determined, and the results are shown in Table 2 below.

Next, the luminescence quantum efficiency of each of the films was measured by scanning excitation wavelengths at an interval of 10 nm between 320 nm and 380 nm by using a Quantaurus-QY Absolute PL quantum yield spectrometer manufactured by Hamamatsu Company. The luminescence quantum efficiency of a dopant included in each of the films measured at the maximum value is shown in Table 2 below.

Evaluation Example 3: Measurement of Decay Time

For each of the films of Evaluation Example 2, the PL spectrum was evaluated at room temperature by using a time-resolved photoluminescence (TRPL) measurement system, FluoTime 300, manufactured by PicoQuant and a pumping source, PLS340 (excitation wavelength=340 nm, spectral width=20 nm) manufactured by PicoQuant. Then, a wavelength of the main peak of the spectrum was determined, and the number of photons emitted at the wavelength of the main peak of each of the films upon a photon pulse (pulse width=500 picoseconds) applied by PLS340 was measured repeatedly over time based on Time-Correlated Single Photon Counting (TCSPC), thereby obtaining a TRPL value with sufficient fitting. Based on the results obtained, one or more exponential decay functions were fitted to obtain decay time, i.e., $T_{decay}$(Ex), for each of the films, and the results are shown in Table 2 below. Here, the function used for the fitting was shown in Equation 2, and the average value of $T_{decay}$ obtained from each exponential decay function used for the fitting was indicated as $T_{decay}$(Ex). At this time, during the same measurement time as the measurement time for obtaining the TRPL curve, the same measurement was repeated one more time in a dark state (i.e., a state where the pumping signal incident on the predetermined film was blocked) to obtain a baseline or a background signal to be used as a baseline for the fitting.

$$f(t) = \sum_{i=1}^{n} A_i \exp(-t/T_{decay,i})$$

Equation 2

Evaluation Example 4: Calculation of Energy Gap

A difference between the HOMO energy levels of Compound 1 and Compounds A to C at a singlet ground state and the $d(x^2-y^2)$ antibonding orbital energy levels (i.e., "energy gap") of the same compounds was calculated by using the Jaguar 9.1 suite software, and the results are shown in Table 2 below.

The method parameters are as follows.

XC Functional=M06

Basis set (geometry optimization)=LACVP**

Basis set (Single point calculation)=cc-PVTZ(-f) (main group element), LACV3P** (for Pt)

TABLE 2

|  | Compound 1 | Compound A | Compound B | Compound C |
| --- | --- | --- | --- | --- |
| HOMO (eV) | −5.27 | −5.46 | −5.43 | −5.27 |
| PL max (nm) | 606 | 618 | 623 | 612 |
| PLQY | 0.984 | 0.109 | 0.293 | 0.406 |
| Decay time (μs) | 2.265 | 0.401 | 0.949 | 0.872 |
| Rad. decay rate ($s^{-1}$) | 4.34E+05 | 2.72E+05 | 3.09E+05 | 4.66E+05 |
| Non-rad. decay rate ($s^{-1}$) | 7.06E+03 | 2.22E+06 | 7.45E+05 | 6.81E+05 |
| Energy gap (eV) | 5.396 | 5.869 | 6.642 | 6.963 |

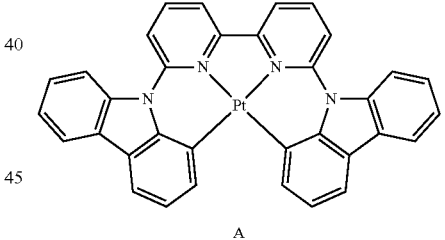

A

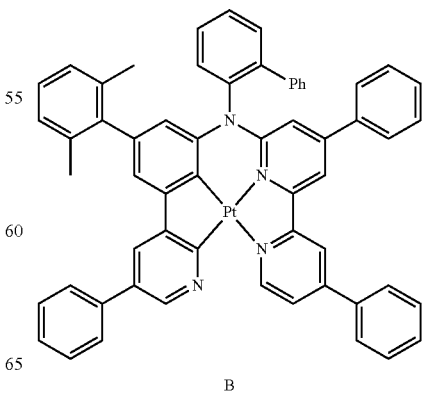

B

TABLE 2-continued

Compound 1  Compound A  Compound B  Compound C

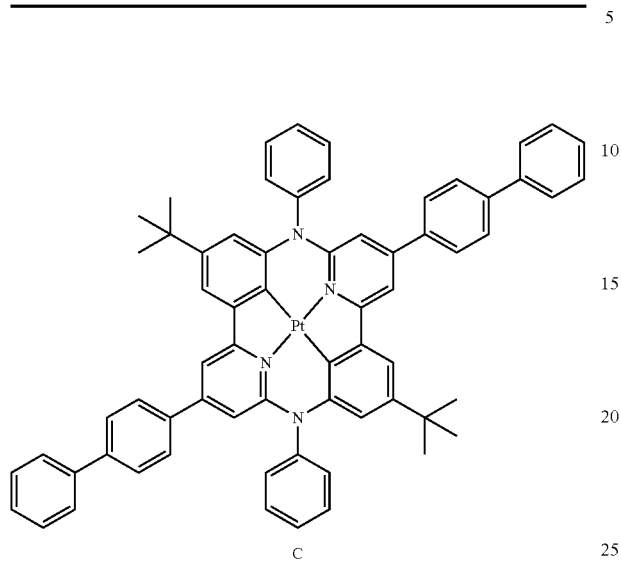

C

Referring to Table 2, it was confirmed that, due to a large energy gap and a small non-radiative decay rate, Compound 1 exhibited remarkably excellent luminescence quantum yields as compared with Compounds A to C of the Comparative Examples.

Example 1

An ITO glass substrate was cut to a size of 50 mm×50 mm×0.5 mm, sonicated with acetone isopropyl alcohol and pure water each for 15 minutes, and then, cleaned by exposure to ultraviolet rays and ozone for 30 minutes.

Next, m-MTDATA was deposited on the ITO glass substrate (i.e., an anode) at a deposition rate of 1 Å/sec to form a hole injection layer having a thickness of 600 Å, and α-NPD (NPB) was deposited on the hole injection layer at a deposition rate of 1 Å/sec to form a hole transport layer having a thickness of 1,350 Å.

Compound 1 (as a dopant) and CBP (as a host) were co-deposited on the hole transport layer at a deposition rate of 0.02 Å/sec and 1 Å/sec, respectively, to form an emission layer having a thickness of 400 Å.

BAlq was deposited on the emission layer a deposition rate of 1 Å/sec to form a hole blocking layer having a thickness of 50 Å, and Alq$_3$ was deposited on the hole blocking layer to form an electron transport layer having a thickness of 300 Å. Then, LiF was deposited on the electron transport layer to form an electron injection layer having a thickness of 10 Å, and Al was vacuum-deposited on the electron injection layer to form a second electrode (i.e., a cathode) having a thickness of 1,200 Å, thereby completing the manufacture of an organic light-emitting device having a structure of ITO/m-MTDATA (600 Å)/α-NPD (1,350 Å)/CBP+Compound 1 (2 wt %)(400 Å)/BAlq (50 Å)/Alq$_3$ (300 Å)/LiF (10 Å)/Al (1,200 Å).

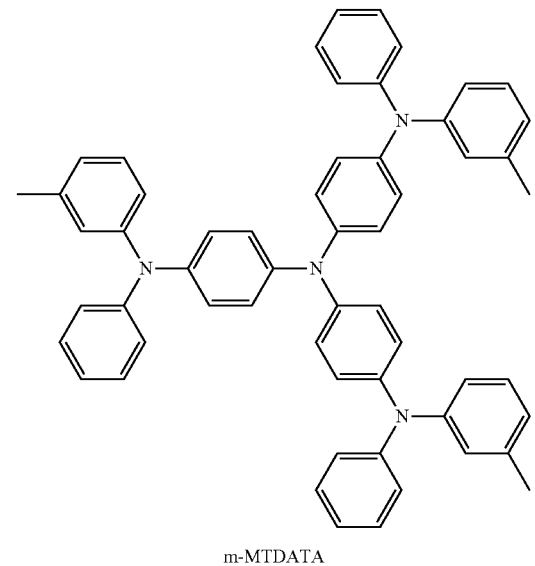

m-MTDATA

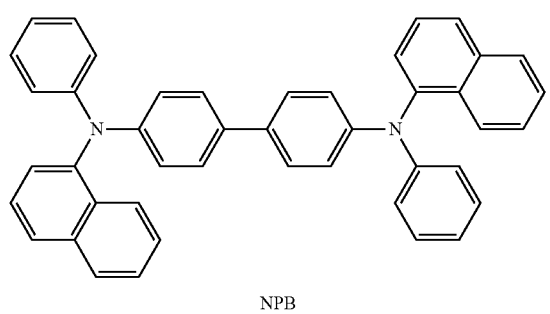

NPB

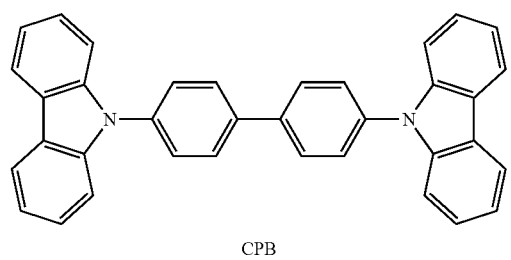

CPB

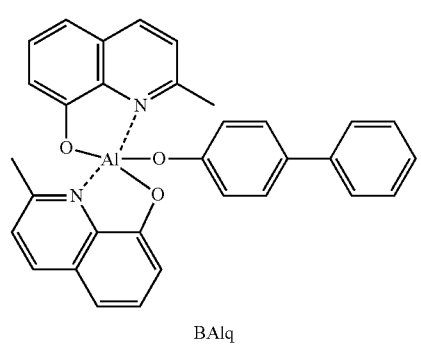

BAlq

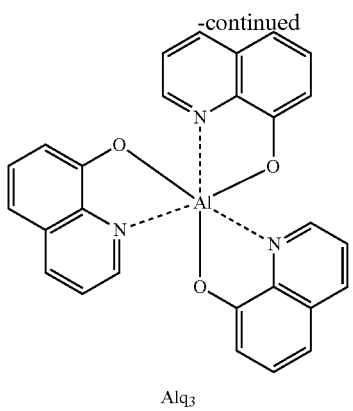

Alq₃

Comparative Examples A to C

Organic light-emitting devices were manufactured in the same manner as in Example 1, except that Compounds of Comparative Examples shown in Table 3 were respectively used instead of Compound 1 in forming an emission layer.

Comparative Example D

An organic light-emitting device was manufactured in the same manner as in Example 1, except that Compound D which is an Ir-based dopant shown in Table 3 was used instead of Compound 1 as a dopant used in forming an emission layer.

Evaluation Example 5: Evaluation of Characteristics of Organic Light-Emitting Device For each of the organic light-emitting devices prepared according to Example 1 and Comparative Examples A to D, a non-radiative decay rate, a photoluminescence quantum yield (PLQY), and a maximum external quantum efficiency were evaluated, and the results are shown in Table 3 below. Here, a current-voltage meter (Keithley SMU 236) and a luminance meter (Minolta Cs-1000A) were used for the evaluation.

Figure 2:
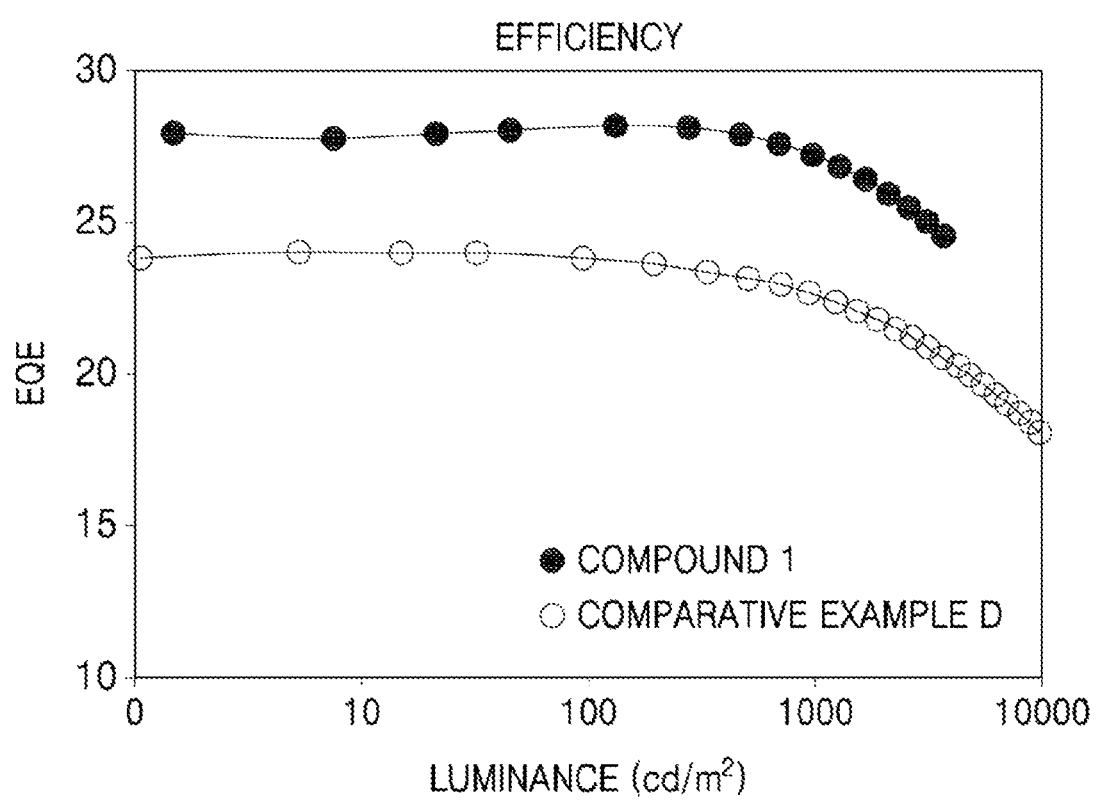
FIG. 2 is a graph showing external quantum efficiency of an organic light-emitting device according to an embodiment.

In addition, FIG. 2 shows the comparison of the external quantum efficiency of Compound 1 of Example 1 which is a Pt-based dopant and Compound D of Comparative Example which is an Ir-based dopant.

TABLE 3

| No. | Dopant compound | Non-radiative decay rate | PLQY (%) | Maximum external quantum efficiency (relative value) |
|---|---|---|---|---|
| Example 1 | 1 | 7.06E+03 | 0.984 | 1.18 |
| Comparative Example A | A | 2.22E+06 | 0.109 | 0.07 |
| Comparative Example B | B | 7.45E+05 | 0.293 | 0.23 |
| Comparative Example C | C | 6.81E+05 | 0.406 | 0.47 |
| Comparative Example D | D | 4.05E+05 | 0.588 | 1.00 |

TABLE 3-continued

| No. | Dopant compound | Non-radiative decay rate | PLQY (%) | Maximum external quantum efficiency (relative value) |
|---|---|---|---|---|

1

A

B

C

TABLE 3-continued

| No. | Dopant compound | Non-radiative decay rate | PLQY (%) | Maximum external quantum efficiency (relative value) |
|---|---|---|---|---|

D

Referring to Table 3, it was confirmed that the organic light-emitting device of Example 1 had remarkably low non-radiative decay rate as compared with the organic light-emitting devices of Comparative Examples A to D, and was able to be design molecules having excellent PLQY and maximum external quantum efficiency.

In addition, referring to FIG. 2, it was confirmed that the organic light-emitting device of Example 1 had excellent maximum external quantum efficiency as compared with the organic light-emitting device of Comparative Example D.

According to the one or more embodiments, the organometallic compound increases an energy potential of an anti-bonding orbital, so as to have a structure with a reduced non-radiative decay rate through a design that suppresses the non-radiative path in the excited state. Accordingly, the organic light-emitting device including the organometallic compound may have excellent luminescence efficiency and high color purity. In addition, due to excellent luminescence characteristics of the organometallic compound, use of the organometallic compound may provide a diagnostic composition having a high diagnostic efficiency.

t should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. An organometallic compound represented by Formula 1:

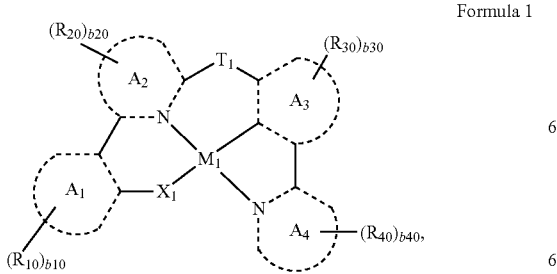

Formula 1 wherein, in Formula 1, $M_1$ is beryllium, magnesium, aluminum, calcium, titanium, manganese, cobalt, copper, zinc, gallium, germanium, zirconium, rhutenium, rhodium, palladium, silver, rhenium, platinum, or gold, $X_1$ is N, O, or S, ring $A_1$ and ring $A_3$ are each independently a $C_5$-$C_{30}$ carbocyclic group or a $C_2$-$C_{30}$ heterocyclic group, ring $A_2$ and ring $A_4$ are each independently a N-containing $C_2$-$C_{30}$ heterocyclic group, $T_1$ is *—N[$(L_1)_{a1}$-$(R_1)_{b1}$]—*', *—B($R_1$)—*', *—P($R_1$)—*', *—C($R_1$)($R_2$)—*', *—Si($R_1$)($R_2$)—*', *—Ge($R_1$)($R_2$)—*', *—S—*', *—Se—*', *—O—*', *—C(=O)—*', *—S(=O)—*', *—S(=O)$_2$—*', *—C($R_1$)=C($R_2$)—*', *—C(=S)—*', or *—C≡C—*', $L_1$ is a single bond, a substituted or unsubstituted $C_5$-$C_{30}$ carbocyclic group, or a substituted or unsubstituted $C_2$-$C_{30}$ heterocyclic group, a1 is an integer from 1 to 3, wherein, when a1 is 2 or more, two or more $L_1$ are identical to or different from each other, $R_1$ and $R_2$ are each independently hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), or —P(=O)($Q_8$)($Q_9$), $R_{10}$, $R_{20}$, $R_{30}$, and $R_{40}$ are each independently hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group,- or —P(=O)($Q_8$)($Q_9$), provided that when $R_{10}$, $R_{20}$, $R_{30}$, or $R_{40}$ is a substituted or unsubstituted $C_1$-$C_{60}$ heteroaryl group, then the substituted or unsubstituted $C_1$-$C_{60}$ heteroaryl group is selected from Formulae 10-76 to 10-78, 10-86 to 10-128, 10-131 to 10-139, 10-148 to 10-154, 10-157 to 10-161, and 10-183 to 10-194,

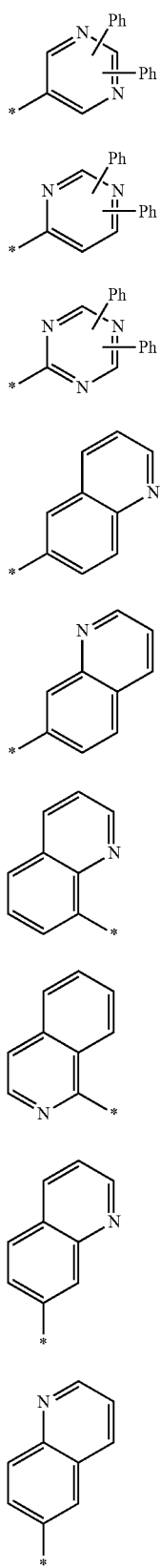
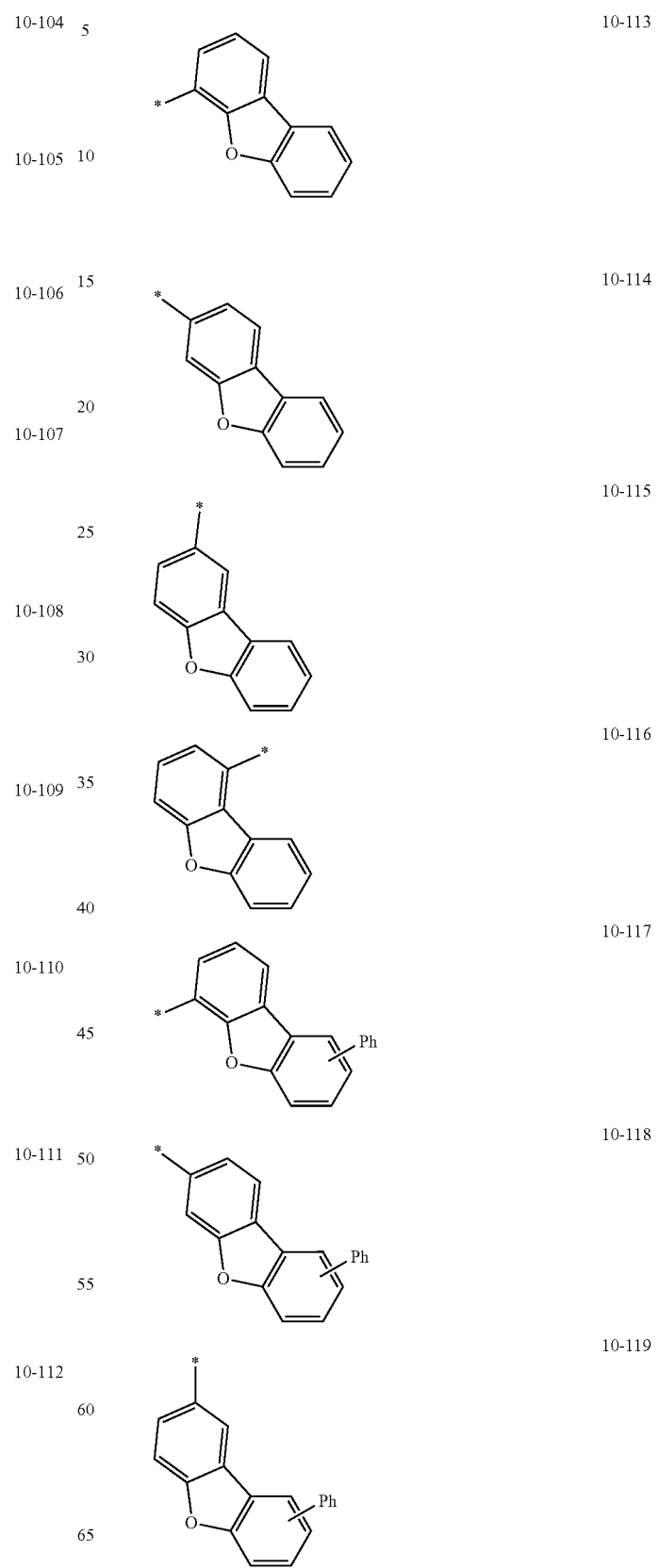

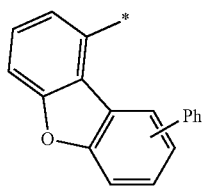 10-120
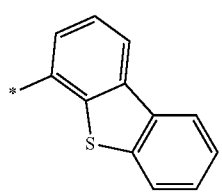 10-121
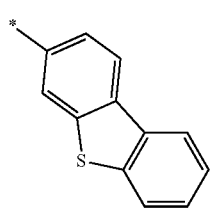 10-122
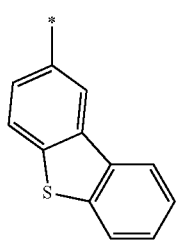 10-123
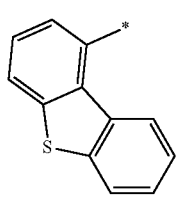 10-124
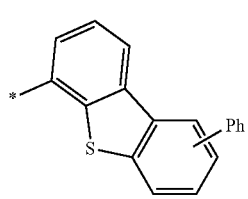 10-125
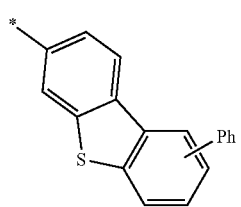 10-126
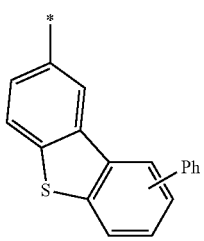 10-127
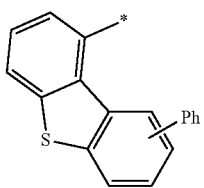 10-128
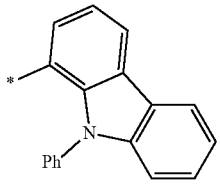 10-131
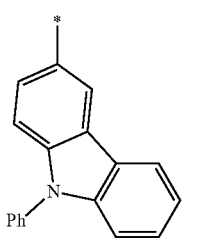 10-132
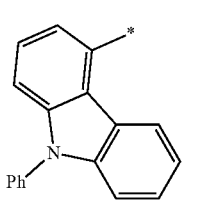 10-133
10-134
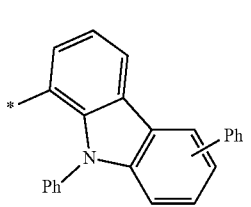 10-135

| | |
|---|---|
| 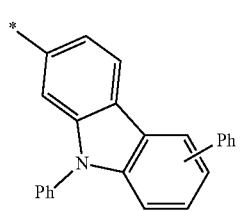 | 10-136 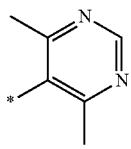 10-153 |
| 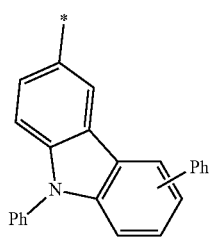 | 10-137 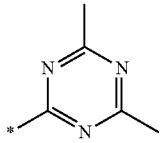 10-154 |
| 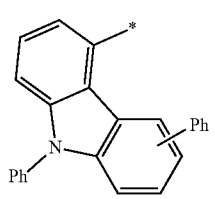 | 10-138 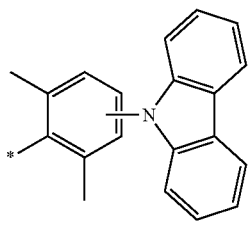 10-157 |
| 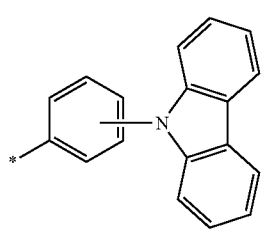 | 10-139 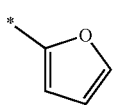 10-158 |
| 10-148 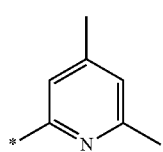 | 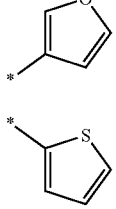 10-159 |
| 10-149 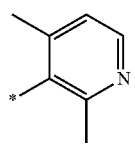 | 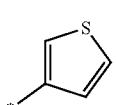 10-160 |
| 10-150 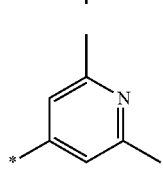 | 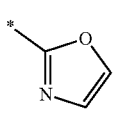 10-161 |
| 10-151 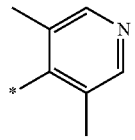 | 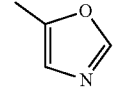 10-183 |
| 10-152 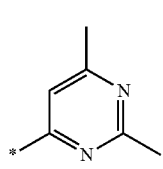 | 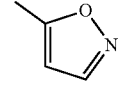 10-184 |
| | 10-185 |
| | 10-186 |
| | 10-187 |

-continued

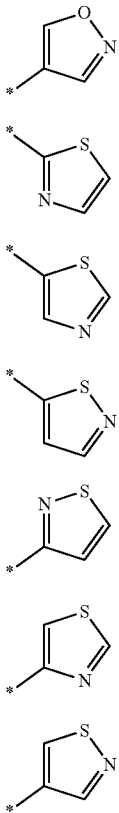

10-188
10-189
10-190
10-191
10-192
10-193
10-194 two neighboring groups among $R_1$, $R_2$, $R_{10}$, $R_{20}$, $R_{30}$, and $R_{40}$ are optionally linked to form a substituted or unsubstituted $C_5$-$C_{30}$ carbocyclic group or a substituted or unsubstituted $C_2$-$C_{30}$ heterocyclic group, b1 is an integer from 1 to 5, wherein, when b1 is 2 or more, two or more $R_1$ are identical to or different from each other, b10 and b40 are each independently an integer from 1 to 4, b20 and b30 are each independently an integer from 1 to 3, when b10 is 2 or more, two or more $R_{10}$ are identical to or different from each other, when b20 is 2 or more, two or more $R_{20}$ are identical to or different from each other, when b30 is 2 or more, two or more $R_{30}$ are identical to or different from each other, and when b40 is 2 or more, two or more $R_{40}$ are identical to or different from each other, a substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a combination thereof;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a combination thereof, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), —P(=O)($Q_{18}$)($Q_{19}$), or a combination thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or a combination thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or a combination thereof, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), —P(=O)($Q_{28}$)($Q_{29}$), or a combination thereof; and —N($Q_{31}$)($Q_{32}$), —Si($Q_{33}$)($Q_{34}$)($Q_{35}$), —B($Q_{36}$)($Q_{37}$), —P(=O)($Q_{38}$)($Q_{39}$), or a combination thereof, and $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group substituted with a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or a combination thereof, a $C_6$-$C_{60}$ aryl group, or a combination thereof.

2. The organometallic compound of claim 1, wherein $M_1$ is Pt, Pd, or Au.

3. The organometallic compound of claim 1, wherein ring $A_1$ and ring $A_3$ are each independently
i) a 6-membered ring,
ii) a condensed ring in which two or more 6-membered rings are condensed with each other, and
iii) a condensed ring in which a 6-membered ring and a 5-membered ring are condensed with each other,
wherein each 6-membered ring in i), ii), and iii) is a benzene group, a pyridine group, a pyrimidine group, a pyrazine group, a pyridazine group, or a triazine group, and
each 5-membered ring in iii) is a cyclopentadiene group, a furan group, a thiophene group, a pyrrole group, a silole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group.

4. The organometallic compound of claim 1, wherein ring $A_2$ and ring $A_4$ are each independently a pyridine group, a pyrimidine group, a pyrazine group, a pyridazine group, a triazine group, a quinoline group, an isoquinoline group, a quinoxaline group, a quinazoline group, a phenanthroline group, a furopyridine group, a thienopyridine group, an azafluorene group, an azacarbazole group, an azadibenzofuran group, an azadibenzothiophene group, an azadibenzosilole group, a pyrrole group, a pyrazole group, an imidazole group, a triazole group, a tetrazole group, an oxazole group, an isoxazole group, a thiazole group, an isothiazole group, an oxadiazole group, a thiadiazole group, a benzopyrazole group, a benzimidazole group, an indazole group, a benzoxazole group, a benzothiazole group, a benzoxadiazole group, a benzothiadiazole group, a benzotriazole group, a diazaindene group, or a triazaindene group.

5. The organometallic compound of claim 1, wherein $X_1$ is O or S.

6. The organometallic compound of claim 1, wherein $T_1$ is *—N[($L_1$)$_{a1}$-($R_1$)$_{b1}$]—*', *—C($R_1$)($R_2$)—*', *—O—*', or *—S—*'.

7. The organometallic compound of claim 1, wherein $L_1$ is
a single bond, a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group; or a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_2$-$C_{10}$ heterocycloalkyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or a combination thereof, $R_1$ and $R_2$ are each independently
a $C_1$-$C_{30}$ alkyl group;
a $C_1$-$C_{30}$ alkyl group substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a pyridinyl group, a pyrimidinyl group, or a combination thereof;
a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group; or a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{10}$ alkyl group, a C$_1$-C$_{10}$ alkoxy group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a pyridinyl group, a pyrimidinyl group, or a combination thereof.

8. The organometallic compound of claim 1, wherein L$_1$ is a single bond or a group represented by Formulae 3-1 to 3-3:

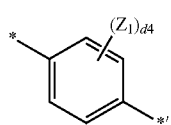
3-1

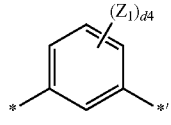
3-2

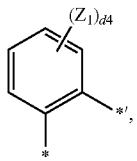
3-3 wherein, in Formulae 3-1 to 3-3,

Z$_1$ is hydrogen, deuterium, a C$_1$-C$_{10}$ alkyl group, a phenyl group, a biphenyl group, or a terphenyl group, d4 is an integer from 0 to 4, and and *' each indicate a binding site to a neighboring atom.

9. The organometallic compound of claim 1, wherein R$_1$ and R$_2$, are each independently hydrogen, deuterium, —F, a cyano group, a nitro group, —SF$_5$, —CH$_3$, —CD$_3$, —CD$_2$H, —CDH$_2$, —CF$_3$, —CF$_2$H, —CFH$_2$, a group represented by Formulae 9-1 to 9-19, or a group represented by Formulae 10-1 to 10-194, and R$_{10}$, R$_{20}$, R$_{30}$, and R$_{40}$ are each independently hydrogen, deuterium, —F, a cyano group, a nitro group, —SF$_5$, —CH$_3$, —CD$_3$, —CD$_2$H, —CDH$_2$, —CF$_3$, —CF$_2$H, —CFH$_2$, a group represented by Formulae 9-1 to 9-19, or a group represented by Formulae 10-76 to 10-78, 10-86 to 10-128, 10-131 to 10-139, 10-148 to 10-154, 10-157 to 10-161, and 10-183 to 10-194:

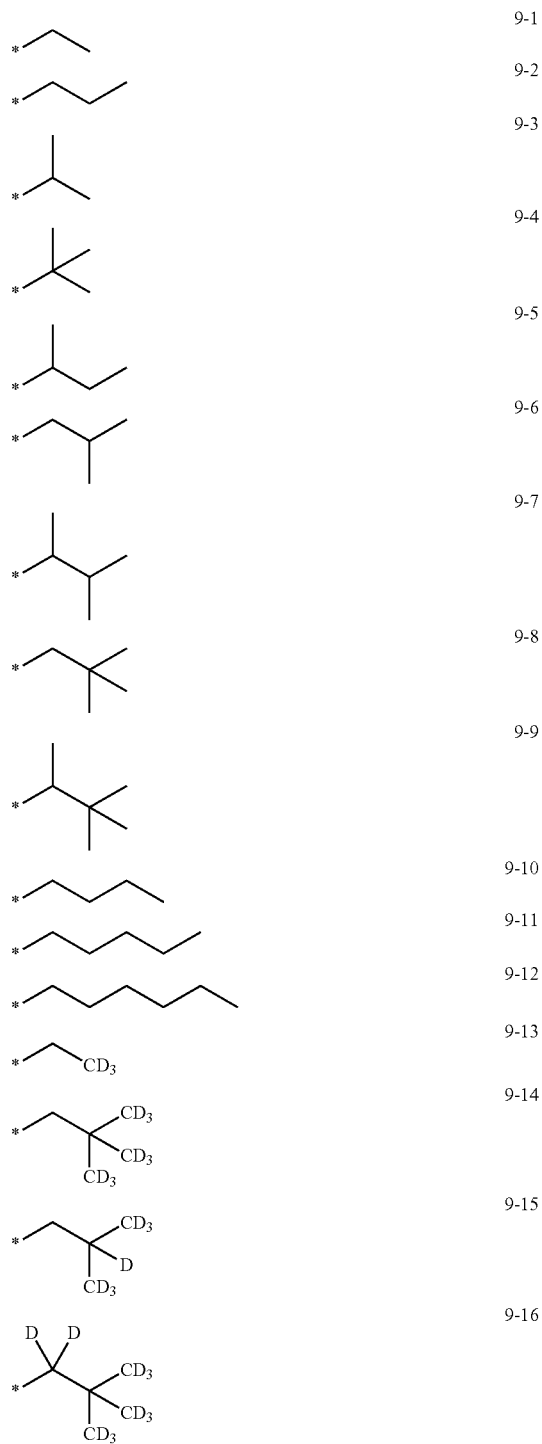

-continued
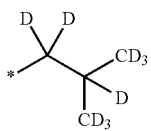
9-17
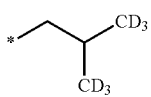
9-18
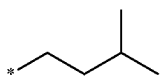
9-19
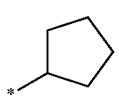
10-1
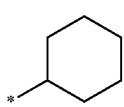
10-2
10-3
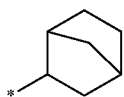
10-4
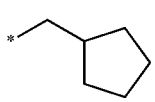
10-5
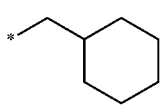
10-6
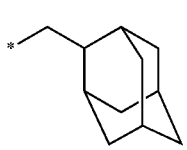
10-7
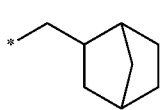
10-8
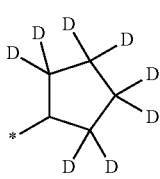
10-9
-continued
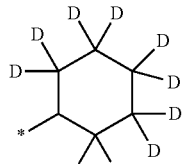
10-10
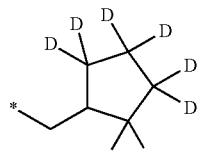
10-11
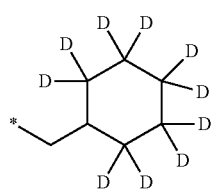
10-12
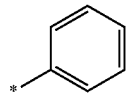
10-13
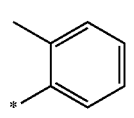
10-14
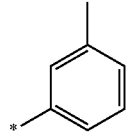
10-15
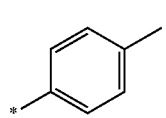
10-16
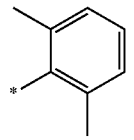
10-17
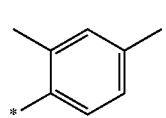
10-18
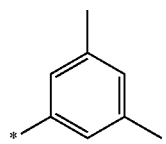
10-19
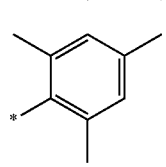
10-20

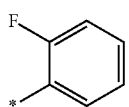
10-21
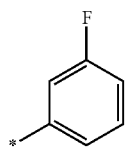
10-22
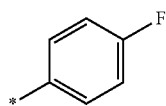
10-23
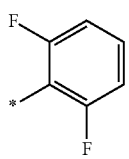
10-24
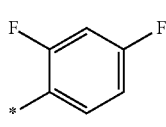
10-25
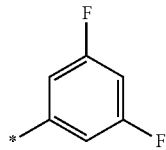
10-26
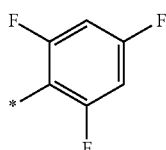
10-27
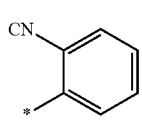
10-28
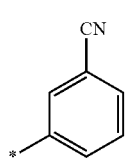
10-29
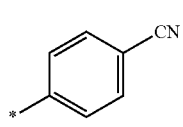
10-30
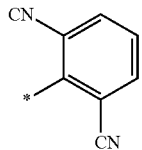
10-31
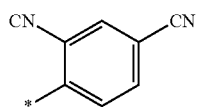
10-32
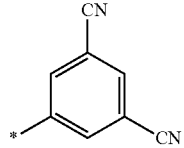
10-33
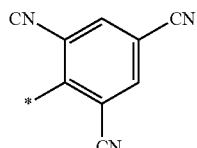
10-34
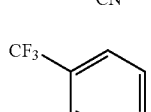
10-35
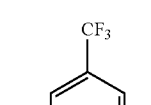
10-36
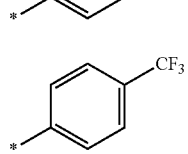
10-37
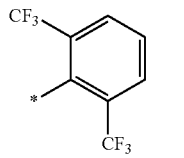
10-38
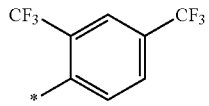
10-39
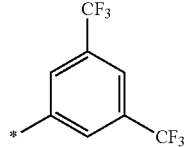
10-40
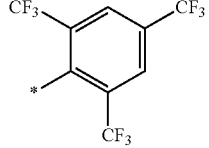
10-41
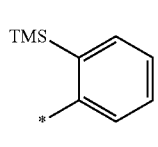
10-42

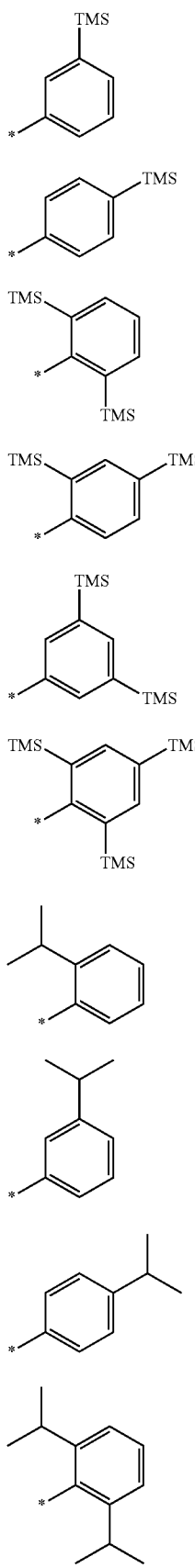

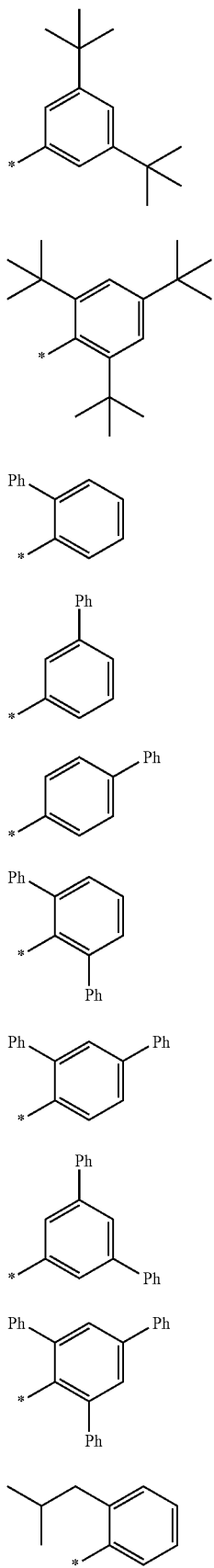
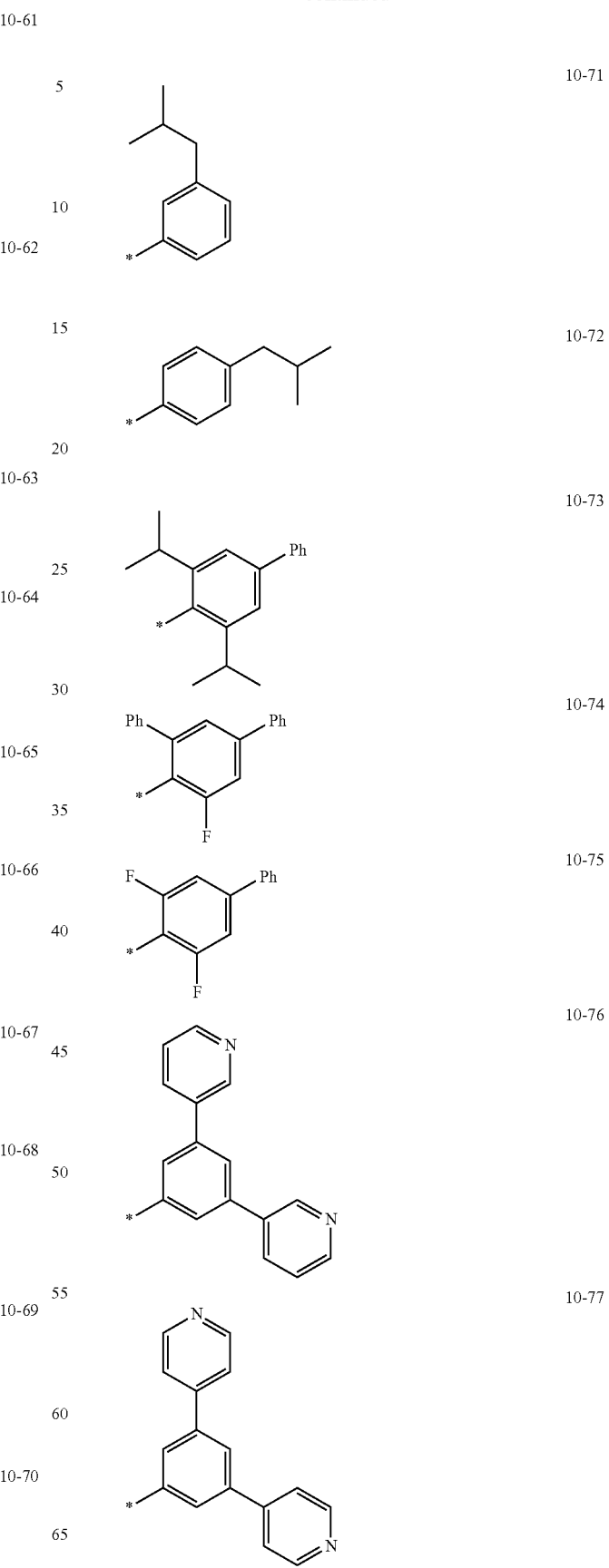

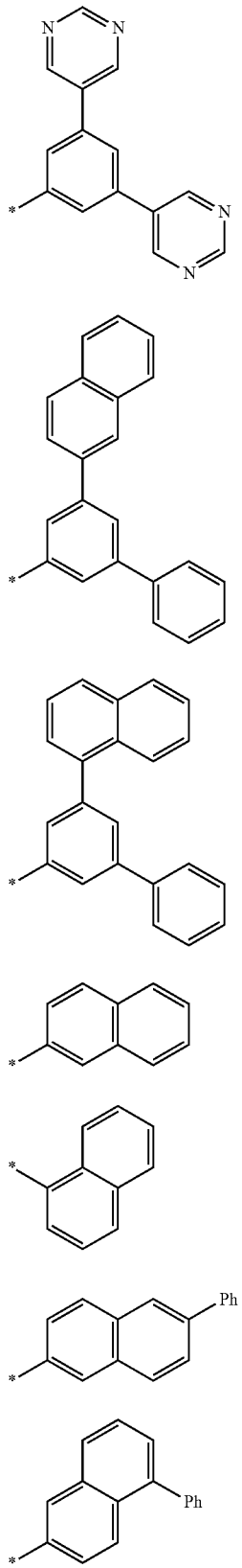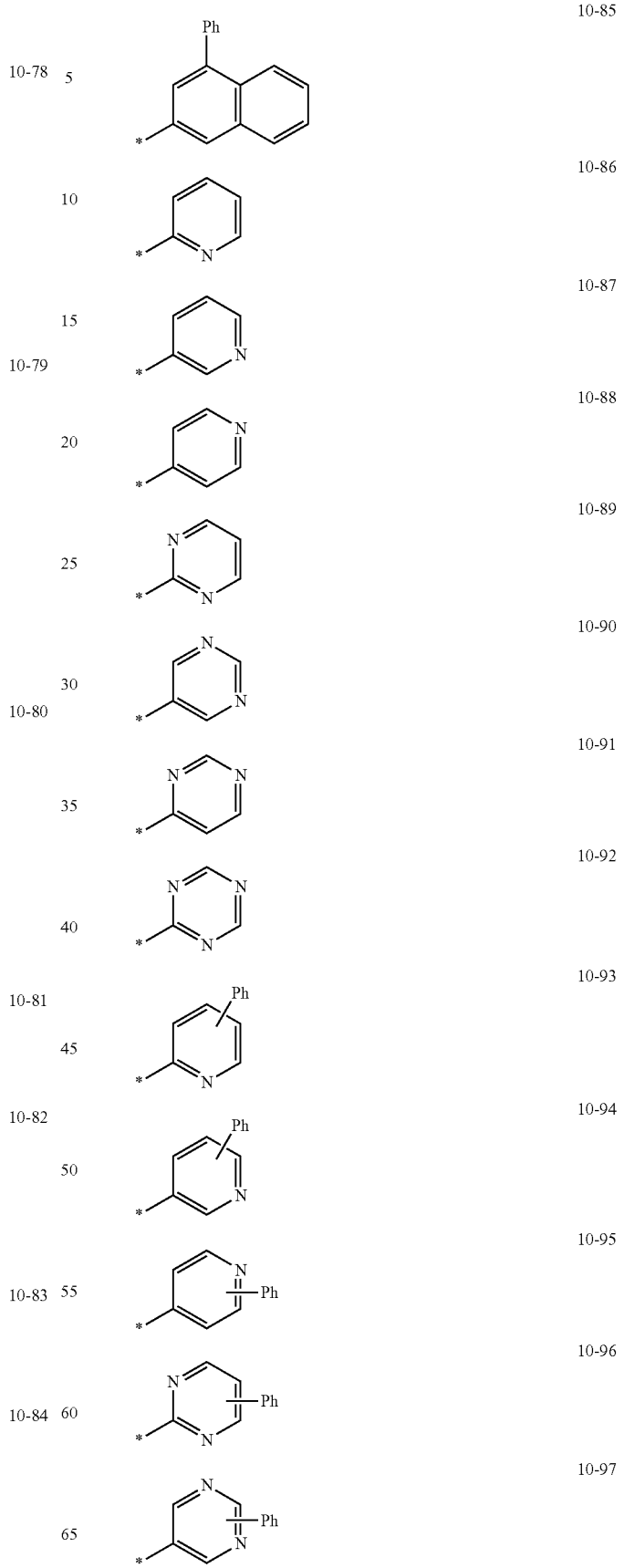

| | |
|---|---|
| 10-98 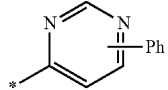 | 10-109 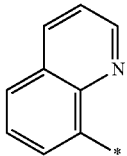 |
| 10-99 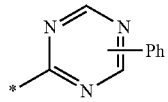 | 10-110 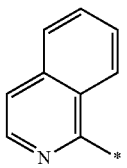 |
| 10-100 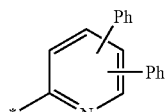 | 10-111 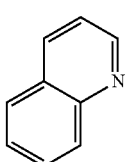 |
| 10-101 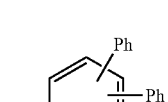 | 10-112 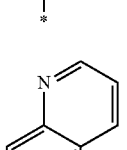 |
| 10-102 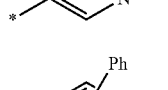 | 10-113 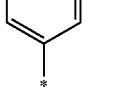 |
| 10-103 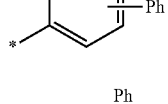 | 10-114 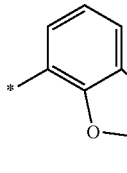 |
| 10-104 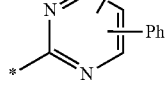 | 10-115 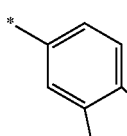 |
| 10-105 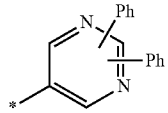 | |
| 10-106 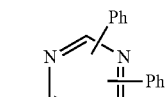 | 10-116 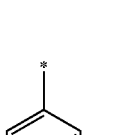 |
| 10-107 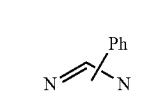 | |
| | 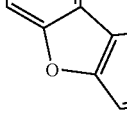 |
| 10-108 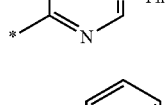 | 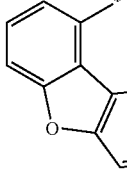 |
| 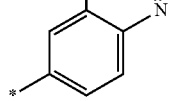 | |
| 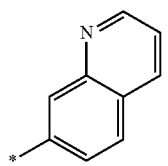 | |

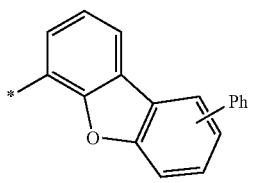 10-117
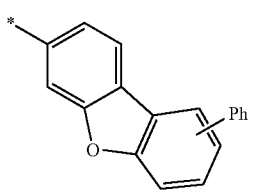 10-118
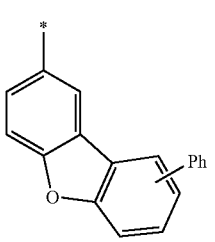 10-119
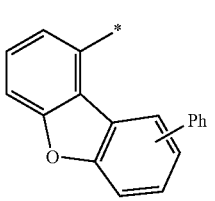 10-120
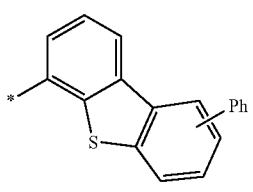 10-121
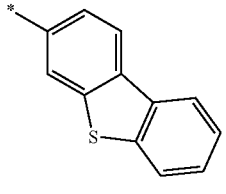 10-122
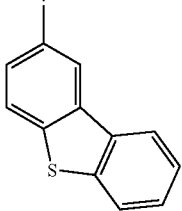 10-123
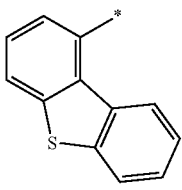 10-124
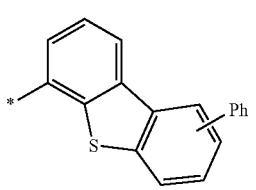 10-125
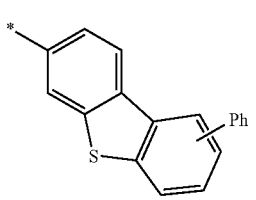 10-126
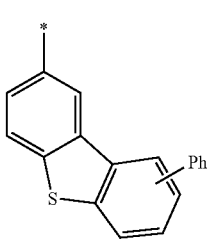 10-127
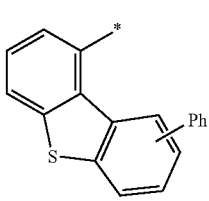 10-128
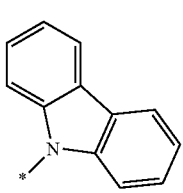 10-129
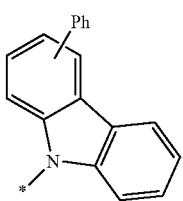 10-130
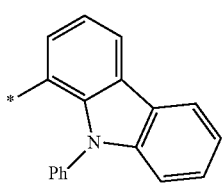 10-131
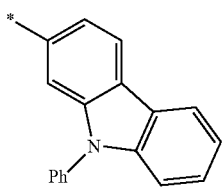 10-132

10-133 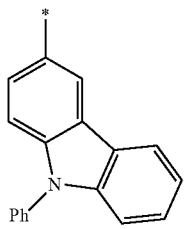
10-134 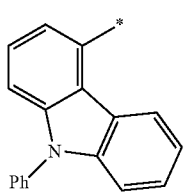
10-135 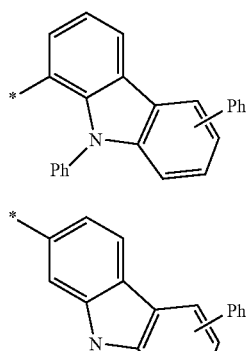
10-136 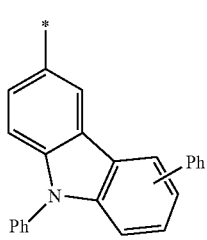
10-137 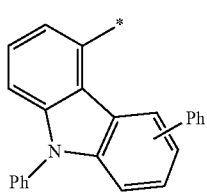
10-138 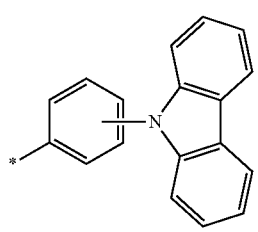
10-139
10-140 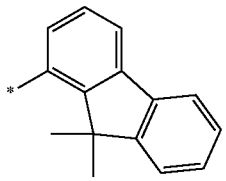
10-141 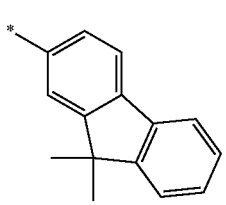
10-142 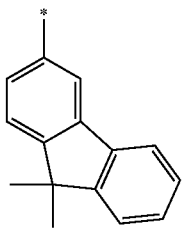
10-143 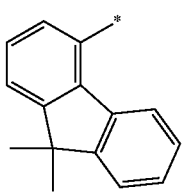
10-144 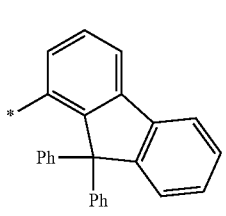
10-145 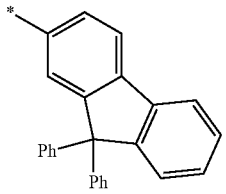
10-146 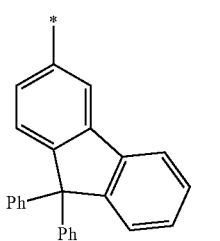

-continued
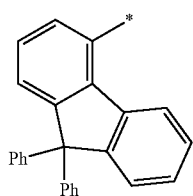
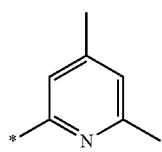
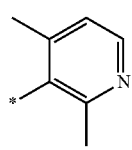
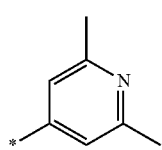
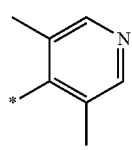
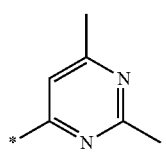
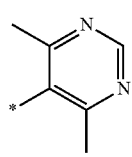
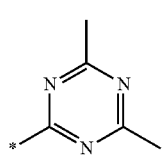
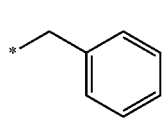
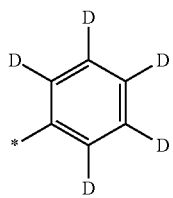
-continued
10-147
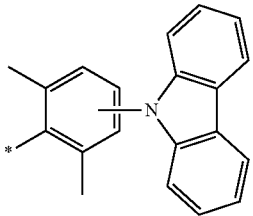
10-148
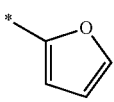
10-149
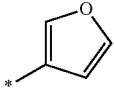
10-150
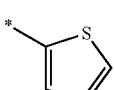
10-151
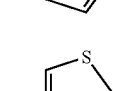
10-152
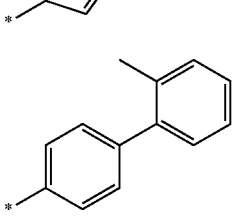
10-153
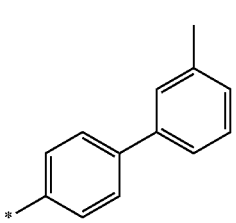
10-154
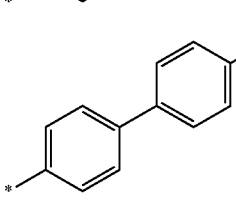
10-155
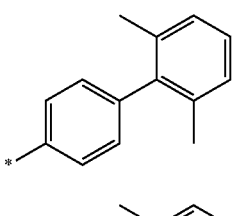
10-156
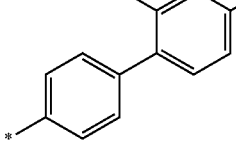
10-157
10-158
10-159
10-160
10-161
10-162
10-163
10-164
10-165
10-166

-continued
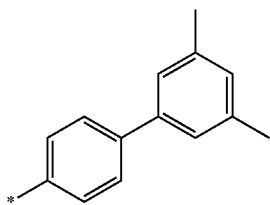
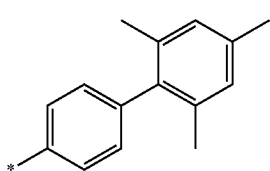
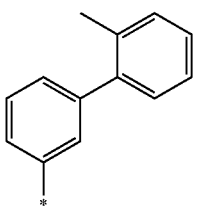
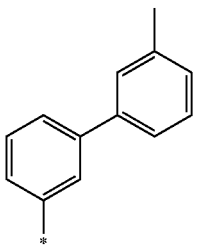
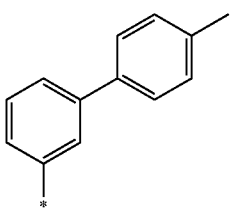
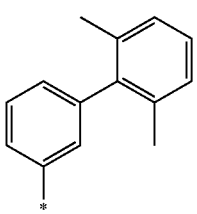
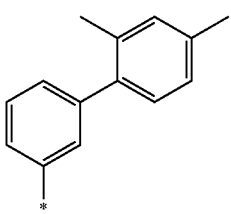
-continued
10-167 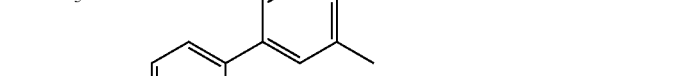
10-168 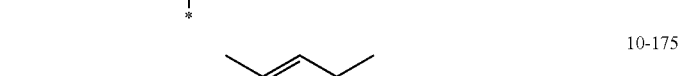
10-169 
10-170 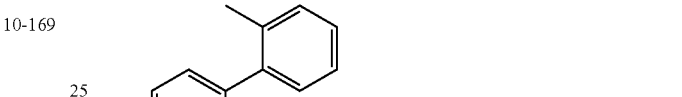
10-171 
10-172 
10-173 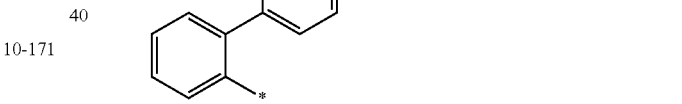
10-174 
10-175 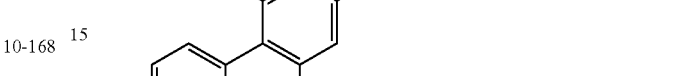
10-176 
10-177 
10-178 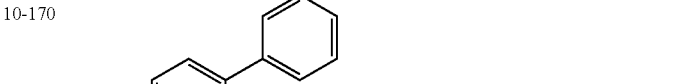
10-179 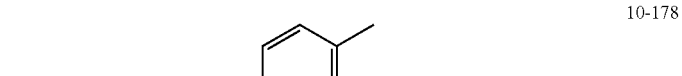
10-180 
10-181 

-continued 10-182 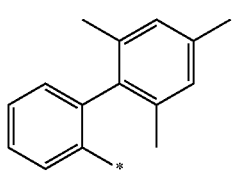

10-183 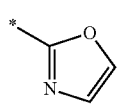

10-184 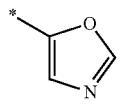

10-185 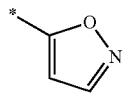

10-186 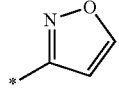

10-187 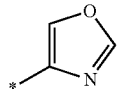

10-188 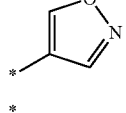

10-189 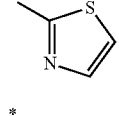

10-190 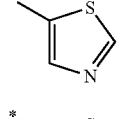

10-191 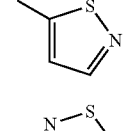

10-192 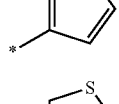

10-193 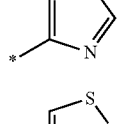

10-194 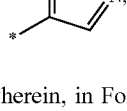

wherein, in Formulae 9-1 to 9-19 and 10-1 to 10-194, * indicates a binding site to a neighboring atom, Ph indicates a phenyl group, and TMS indicates a trimethylsilyl group.

10. The organometallic compound of claim 9, wherein $R_{10}$ is a group represented by Formulae 9-1 to 9-19.

11. The organometallic compound of claim 9, wherein $R_{20}$, $R_{30}$, and $R_{40}$ is a group represented by Formulae 10-76 to 10-78, 10-86 to 10-128, 10-131 to 10-139, 10-148 to 10-154, 10-157 to 10-161, and 10-183 to 10-194.

12. The organometallic compound of claim 1, wherein a moiety represented by

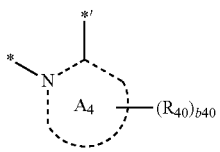

in Formula 1 is represented by

A4-1
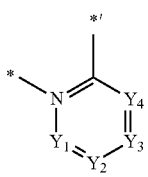

A4-2
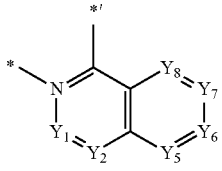

A4-3
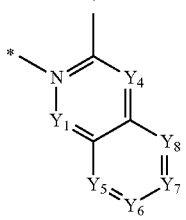

A4-4
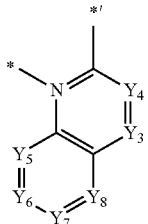

A4-5
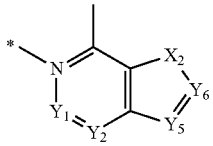

A4-6 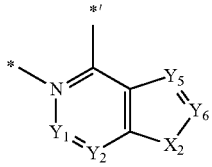

A4-7 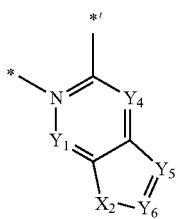

A4-8 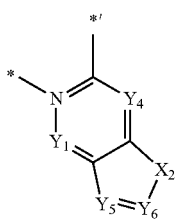

A4-9 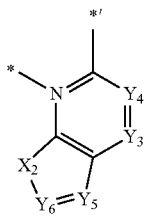

A4-10 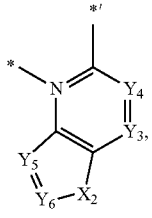

wherein, in Formulae $A_4$-1 to $A_4$-10,
$X_2$ is O, S, or $N(R_5)$,
$Y_1$ is N or $C(R_{41})$, $Y_2$ is N or $C(R_{42})$, $Y_3$ is N or $C(R_{43})$, $Y_4$ is N or $C(R_{44})$,
$Y_5$ is N or $C(R_{55})$, $Y_6$ is N or $C(R_{56})$, $Y_7$ is N or $C(R_{57})$, $Y_8$ is N or $C(R_{58})$,
$R_5$, $R_{41}$ to $R_{44}$, and $R_{55}$ to $R_{58}$ are each independently the same as defined in connection with $R_{40}$ in claim 1, and
and *' each indicate a binding site to a neighboring atom.

13. The organometallic compound of claim 1, wherein the organometallic compound represented by Formula 1 is represented by Formulae 1-1 or 1-2:

Formula 1-1
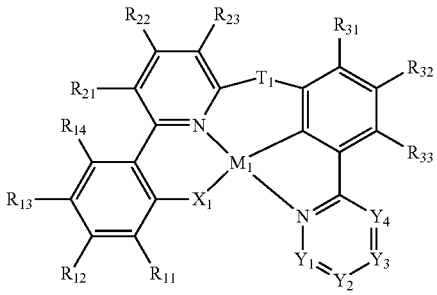

Formula 1-2
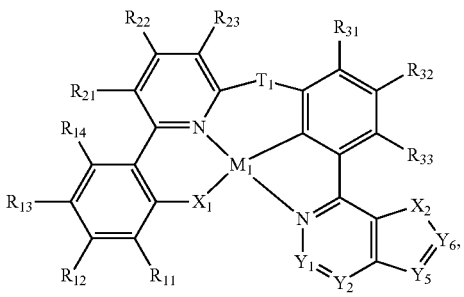

wherein, in Formulae 1-1 and 1-2,
$M_1$, $X_1$, and $T_1$ are each independently the same as described in claim 1,
$X_2$ is O, S, or $N(R_5)$,
$Y_1$ is N or $C(R_{41})$, $Y_2$ is N or $C(R_{42})$, $Y_3$ is N or $C(R_{43})$, $Y_4$ is N or $C(R_{44})$,
$Y_5$ is N or $C(R_{55})$, $Y_6$ is N or $C(R_{56})$,
$R_{11}$ to $R_{14}$ are each independently the same as defined in connection with $R_{10}$ in claim 1,
$R_{21}$ to $R_{23}$ are each independently the same as defined in connection with $R_{20}$ in claim 1,
$R_{31}$ to $R_{33}$ are each independently the same as defined in connection with $R_{30}$ in claim 1,
$R_5$, $R_{41}$ to $R_{44}$, $R_{55}$, and $R_{56}$ are each independently the same as defined in connection with $R_{40}$ in claim 1, and
two or more groups of $R_{11}$ to $R_{14}$, $R_{21}$ to $R_{23}$, $R_{31}$ to $R_{33}$, $R_{41}$ to $R_{44}$, $R_{55}$, and $R_{56}$ are optionally linked to form a benzene ring or a naphthalene ring.

14. The organometallic compound of claim 1, wherein the organometallic compound is of Compounds 1 to 9:

1

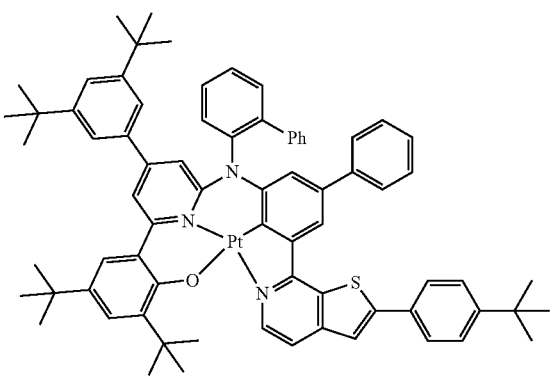

2
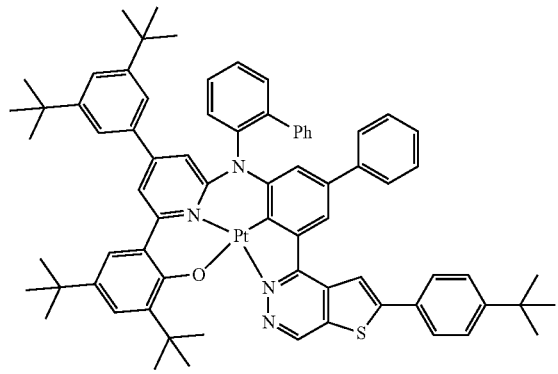
3
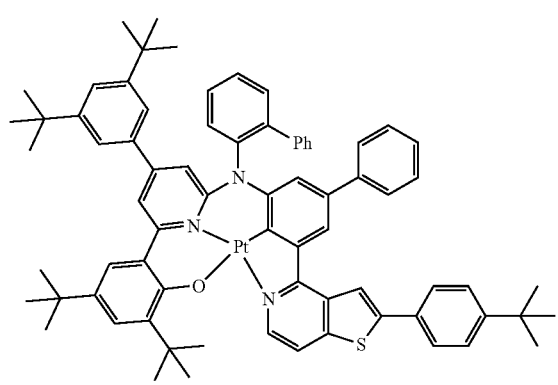
4
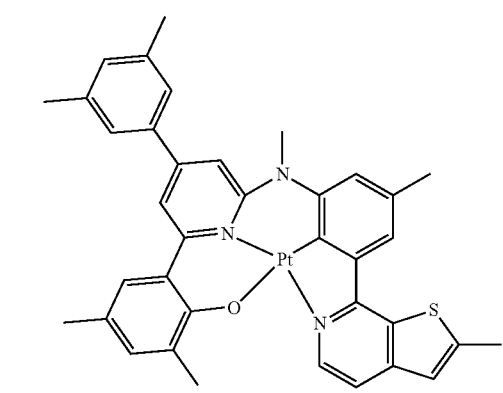
5
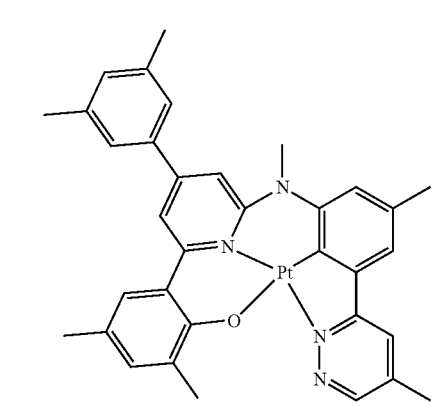
6
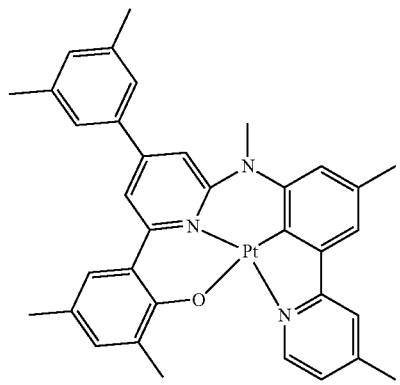
7
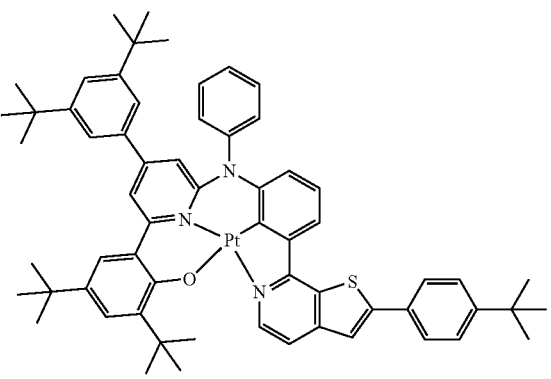
8
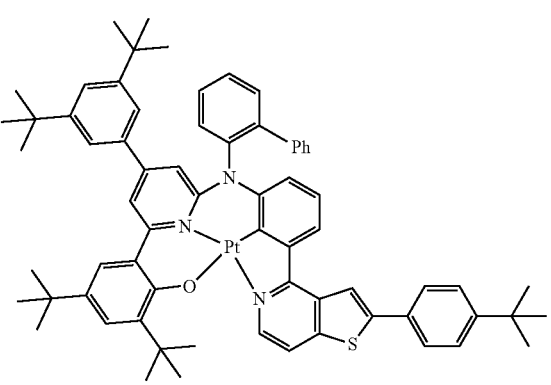
9
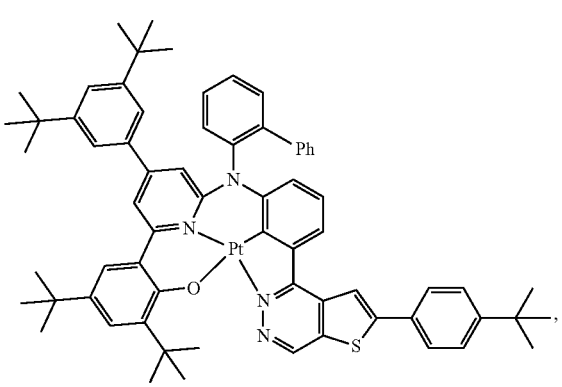
wherein, in Compounds 1 to 9, Ph indicates a phenyl group.

15. An organic light-emitting device comprising:
a first electrode;
a second electrode; and
an organic layer between the first electrode and the second electrode and comprising an emission layer,
wherein the organic layer comprises an organometallic compound represented by Formula 1 of claim 1.

16. The organic light-emitting device of claim 15, wherein
the first electrode is an anode,
the second electrode is a cathode,
the organic layer further comprises a hole transport region between the first electrode and the emission layer and an electron transport region between the emission layer and the second electrode,
the hole transport region comprises a hole injection layer, a hole transport layer, an electron blocking layer, or any combination thereof, and
the electron transport region comprises a hole blocking layer, an electron transport layer, an electron injection layer, or any combination thereof.

17. The organic light-emitting device of claim 15, wherein the emission layer comprises the organometallic compound.

18. The organic light-emitting device of claim 17, wherein the emission layer further comprises a host, and an amount of the host is greater than that of organometallic compound.

19. The organic light-emitting device of claim 18, wherein the emission layer emits red light having a maximum emission wavelength in a range of about 580 nanometers to about 680 nanometers.

20. A diagnostic composition comprising the organometallic compound of claim 1.

* * * * *